(12) United States Patent
Yato et al.

(10) Patent No.: US 9,607,940 B2
(45) Date of Patent: Mar. 28, 2017

(54) SEMICONDUCTOR DEVICE

(71) Applicant: Renesas Electronics Corporation, Tokyo (JP)

(72) Inventors: Yuichi Yato, Tokyo (JP); Hiroi Oka, Tokyo (JP); Noriko Okunishi, Tokyo (JP); Keita Takada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/901,424

(22) PCT Filed: Jul. 5, 2013

(86) PCT No.: PCT/JP2013/068552
§ 371 (c)(1),
(2) Date: Dec. 28, 2015

(87) PCT Pub. No.: WO2015/001676
PCT Pub. Date: Jan. 8, 2015

(65) Prior Publication Data
US 2016/0204057 A1      Jul. 14, 2016

(51) Int. Cl.
*H01L 23/00*     (2006.01)
*H01L 23/498*    (2006.01)
*H01L 23/13*     (2006.01)
*H01L 23/31*     (2006.01)

(52) U.S. Cl.
CPC ........ *H01L 23/49844* (2013.01); *H01L 23/13* (2013.01); *H01L 23/3142* (2013.01); *H01L 23/49805* (2013.01)

(58) Field of Classification Search
None
See application file for complete search history.

(56) References Cited

U.S. PATENT DOCUMENTS 7,679,173 B2 *   3/2010   Uno ................. H01L 23/49524
                                                  257/177
8,222,651 B2 *   7/2012   Kanazawa ......... H01L 21/4842
                                                  257/288

(Continued)

FOREIGN PATENT DOCUMENTS

EP      2 444 999 A1      4/2012
JP      2000-068303 A     3/2000

(Continued)

OTHER PUBLICATIONS

International Search Report of PCT/JP2013/068552.

(Continued)

*Primary Examiner* — Evren Seven
(74) *Attorney, Agent, or Firm* — Mattingly & Malur, PC

(57) ABSTRACT

A semiconductor device according to an embodiment is a semiconductor device in which a semiconductor chip mounted on a chip mounting part is sealed by resin and a first member is fixed to a chip mounting surface side between a peripheral portion of the semiconductor chip and a peripheral portion of the chip mounting part. Also, the first member is sealed by the resin. Also, a length of the first part of the chip mounting part in the first direction is larger than a length of the semiconductor chip in the first direction, in a plan view.

20 Claims, 36 Drawing Sheets

(56) References Cited

U.S. PATENT DOCUMENTS

| | | | |
|---|---|---|---|
| 8,912,640 B2* | 12/2014 | Takada | H01L 24/36 |
| | | | 257/687 |
| 9,111,922 B2* | 8/2015 | Andou | H01L 23/49551 |
| 9,177,833 B2* | 11/2015 | Nakajo | H01L 24/49 |
| 2004/0232534 A1 | 11/2004 | Seki et al. | |
| 2007/0035019 A1 | 2/2007 | Carney et al. | |
| 2009/0039486 A1* | 2/2009 | Shimazaki | H01L 21/561 |
| | | | 257/676 |
| 2010/0059875 A1* | 3/2010 | Sato | H01L 23/4952 |
| | | | 257/690 |
| 2010/0102459 A1* | 4/2010 | Satou | H01L 23/4334 |
| | | | 257/783 |
| 2010/0258922 A1* | 10/2010 | Nakamura | H01L 21/4828 |
| | | | 257/676 |
| 2010/0258945 A1 | 10/2010 | Numata et al. | |
| 2011/0233738 A1 | 9/2011 | Yurino | |
| 2013/0009299 A1 | 1/2013 | Takada et al. | |

FOREIGN PATENT DOCUMENTS

| | | |
|---|---|---|
| JP | 2000-286379 A | 10/2000 |
| JP | 2004-349497 A | 12/2004 |
| JP | 2006-140265 A | 6/2006 |
| JP | 2006-310397 A | 11/2006 |
| JP | 2010-135723 A | 6/2010 |
| JP | 2010-245417 A | 10/2010 |
| JP | 2011-210893 A | 10/2011 |
| JP | 2013-016624 A | 1/2013 |
| JP | 2013-102250 A | 5/2013 |

OTHER PUBLICATIONS

Communication Pursuant to Rule 164(1) EPC received in corresponding European Application No. 13888740.1 dated Dec. 15, 2016.

* cited by examiner

SEMICONDUCTOR DEVICE

TECHNICAL FIELD

The present invention relates to semiconductor device techniques and in particular to techniques which are effective when applied to a semiconductor device in which a semiconductor chip is mounted on a die pad having a larger plane area than, for example, a packaging surface of the semiconductor chip.

BACKGROUND ART

In Japanese Patent Application Laid-Open Publication No. 2010-245417 (Patent Document 1), Japanese Patent Application Laid-Open Publication No. 2006-310397 (Patent Document 2), Japanese Patent Application Laid-Open Publication No. 2006-140265 (Patent Document 3), Japanese Patent Application Laid-Open Publication No. 2004-349497 (Patent Document 4), or Japanese Patent Application Laid-Open Publication No. 2000-68303 (Patent Document 5), roughening of an adhesion surface between a die pad and a sealing body in a resin sealing type semiconductor package is described.

RELATED ART DOCUMENTS

Patent Documents

Patent Document 1: Japanese Patent Application Laid-Open Publication No. 2010-2245417

Patent Document 2: Japanese Patent Application Laid-Open Publication No. 2006-310397

Patent Document 3: Japanese Patent Application Laid-Open Publication No. 2006-140265

Patent Document 4: Japanese Patent Application Laid-Open Publication No. 2004-349497

Patent Document 5: Japanese Patent Application Laid-Open Publication No. 2000-68303

SUMMARY OF THE INVENTION

Problems to be Solved by the Invention

The present inventors have studied techniques to improve performance of a semiconductor device in which a semiconductor chip is mounted on a die pad and is sealed by resin. As a result, the present inventors have found that, when an area of a region of a die pad on which a semiconductor chip is not mounted increases by reducing a planar size of the semiconductor chip, damage to an adhesion surface between the semiconductor chip and the die pad is likely to easily occur.

The other objects and novel characteristics of the present invention will be apparent from the description of the present specification and the accompanying drawings.

Means for Solving the Problems

In a semiconductor device according to an embodiment, a first member is fixed to a chip mounting surface between a peripheral portion of the semiconductor chip and a peripheral portion of a die pad, in a plan view.

Effects of the Invention

According to the above embodiment, it is possible to suppress damage to the adhesion surface between the semiconductor chip and the die pad.

BRIEF DESCRIPTIONS OF THE DRAWINGS

DETAILED DESCRIPTION OF PREFERRED EMBODIMENTS

Figure 1:
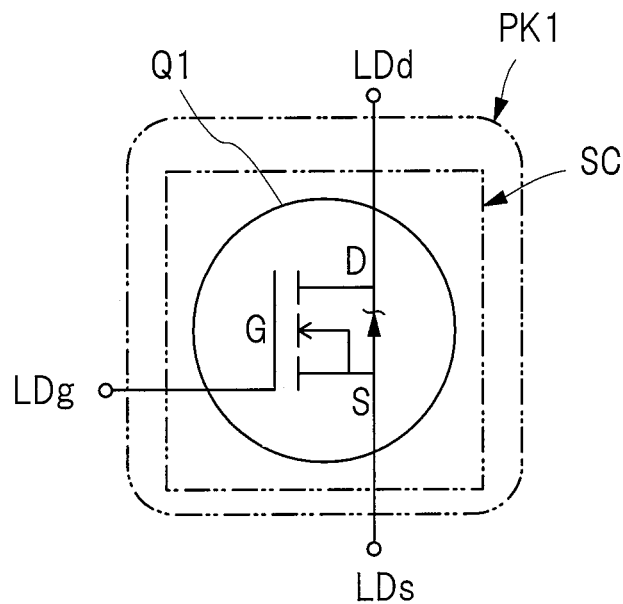
FIG. 1 is an explanatory diagram schematically illustrating an example of a circuit included in a semiconductor device according to the present embodiment.

Explanations of Description Manner, Basic Terms, Usage in the Present Application In the present application, the embodiments are described in a plurality of sections or others when required as a matter of convenience. However, these sections or others are not independent from each other unless otherwise stated, and the one in each portion of single example relates to the entire, a part, or a partial detail of the other as a modification example or others regardless of the described context. Also, in principle, repetitive descriptions of the similar portions will be omitted. Further, any number of each element in the embodiments is not always limited to a specific number unless otherwise stated or except the case where the number is logically limited to the specific number or except the case where the number is apparently not the specific number from the context.

Similarly, in the description of the embodiments or others, when "X formed of A" is described for a material, composition, or others, the one containing other components than A is not eliminated unless otherwise stated or except the case where it is apparently not so. For example, when a component is described, it means such as "X containing A as a principal component". For example, even when a "silicon member" or others is described, it goes without saying that it includes not only pure silicon but also SiGe (silicon germanium) alloy, multi metal alloy containing other silicon as the principal component, and a member containing other additives or others. In addition, even when gold plating, Cu layer, nickel plating, and others are described, they include not only pure materials but also a member containing gold, Cu, nickel, and others as the principal component, respectively, unless otherwise stated or except the case where they are apparently not so.

Still further, even when referring to any specified number or amount, the number may be larger or smaller than the specified number unless otherwise stated, except the case where the number is logically limited to the specified number, or except the case where it is apparently not so from the context.

Moreover, the same or similar components are denoted by the same or similar reference symbols or reference numbers throughout each drawing of the embodiments, and the repetitive description thereof will be omitted in principle.

In addition, in the accompanying drawings, hatching or others may be omitted even in a cross section in the case that the drawing is adversely complicated or the case that a portion is distinct from an empty space. Regarding this, an outline of background is omitted even in a closed hole in a plan view in some cases such that it is clear from explanations or others. Further, even not in the cross-sectional surface, hatching or dot pattern may be added in order to clarify that it is not the empty space, or in order to clearly illustrate a boundary of regions.

<Circuit Configuration>

In the present embodiment, a description will be made by taking, as an example of a semiconductor device, a power control semiconductor device, so called a power device, which is used as, for example, a switching element incorporated in a power control circuit, such as a power supply circuit. FIG. 1 is an explanatory diagram schematically illustrating an example of a circuit included in a semiconductor device according to the present embodiment. Also, FIG. 2 is a cross-sectional view illustrating a main part of a configuration example of a field effect transistor illustrated in FIG. 1.

The power control semiconductor device, called a power device, includes a semiconductor element, such as a diode, a thyristor, or a transistor. As illustrated in FIG. 1, a semiconductor device PK1 according to the present embodiment has a semiconductor chip SC in which a transistor Q1 is formed. In the example illustrated in FIGS. 1 and 2, the transistor Q1 formed in the semiconductor chip SC is a field effect transistor, specifically, a Metal Oxide Semiconductor Field Effect Transistor (MOSFET). Ina power device, a transistor is used as, for example, a switching element. The MOSFET used in the power device is referred to as a "power MOSFET".

The aforementioned MOSFET is described as a term that widely represents a field effect transistor having a structure in which a gate electrode made of a conductive material is arranged on a gate insulating film. Therefore, even when MOSFET is described, it does not exclude a gate insulating film other than an oxide film. Also, even if MOSFET is described, a gate electrode material other than metal such as polysilicon is not excluded.

Figure 2:
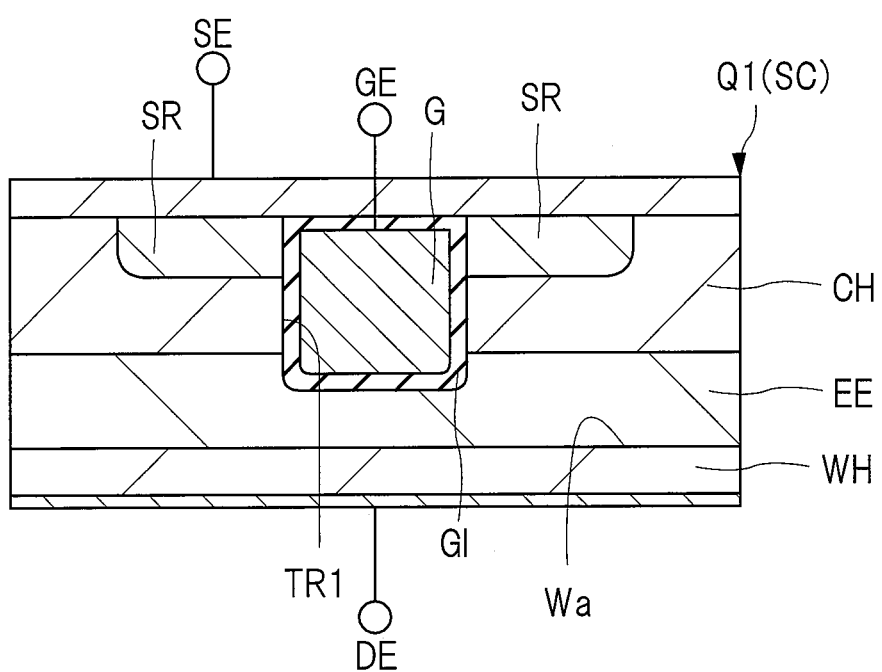
FIG. 2 is a main-part cross-sectional view illustrating an element structure example of afield-effect transistor illustrated in FIG. 1.

In addition, the transistor Q1 illustrated in is formed by an n-channel type field effect transistor as illustrated in FIG. 2. FIG. 2 is a main-part cross-sectional view illustrating an element structure example of a field-effect transistor illustrated in FIG. 1.

In the example illustrated in FIG. 2, for example, on a principal surface Wa of a semiconductor substrate WH consisting of n-type single-crystal silicon, an n−-type epitaxial layer EP is formed. The semiconductor substrate WH and the epitaxial layer EP constitute a drain region (region corresponding to the drain D illustrated in FIG. 1) of the MOSFET. The drain region is electrically connected to a drain electrode formed in the back surface side of the semiconductor chip SC.

A channel formation region CH, which is a p+-type semiconductor region, is formed on the epitaxial layer EP, and a source region SR, which is an n+-type semiconductor region (region corresponding to the source S illustrated in FIG. 1), is formed on the channel formation region CH. The source region SR is electrically connected to the source electrode pad SE formed in the main surface side of the semiconductor chip SC through outgoing wrings. Also, in the semiconductor region stacked on the semiconductor substrate WH, a trench (opening, groove) TR1, which penetrates through the channel formation region CH from the upper surface of the source region SR and reaches the inside of the epitaxial layer EP, is formed.

Moreover, a gate insulating film GI is formed on the inner wall of the trench TR1. Also, on the gate insulating film GI, the gate electrode G, which is stacked so as to bury the trench TR1, is formed. The gate electrode G is electrically connected to a gate electrode pad GE of the semiconductor chip SC shown in FIG. 1 through outgoing wirings (not illustrated).

Also, since, in the transistor Q1, the drain region and the source region SR are arranged with the channel formation region CH therebetween in the thickness direction, a channel is formed in the thickness direction (hereinafter, referred to as a vertical channel structure). In this case, the element occupied area in a plan view can be reduced compared with a field-effect transistor in which a channel is formed along a principal surface Wa. Therefore, the planar size of the semiconductor chip SC can be reduced.

Moreover, in the case of the above-described vertical channel structure, since the channel width per unit area can be increased when in the plan view, on-resistance can be reduced. FIG. 2 is a drawing illustrating the element structure of the field-effect transistor. On the semiconductor chip SC illustrated in FIG. 1, a plurality of (multiple) field-effect transistors Q1 having, for example, the element structures like that shown in FIG. 2 are connected in parallel. Thus, a power MOSFET through which large current that exceeds, for example, 1 ampere flows can be formed.

As described above, in the case of forming the MOSFET by connecting the plurality of transistors Q1 with a vertical channel structure in parallel, the electrical characteristics (mainly breakdown voltage characteristics, the on-resistance characteristics, capacitance characteristics) of the MOSFET is changed according to the planar size of the semiconductor chip SC. For example, since, when the planar area of the semiconductor chip SC increases, the number of cells of the transistors Q1 connected in parallel (that is, the number of elements) increases, the on-resistance is reduced, and the capacitance becomes larger.

<Semiconductor Device>

Figure 3:
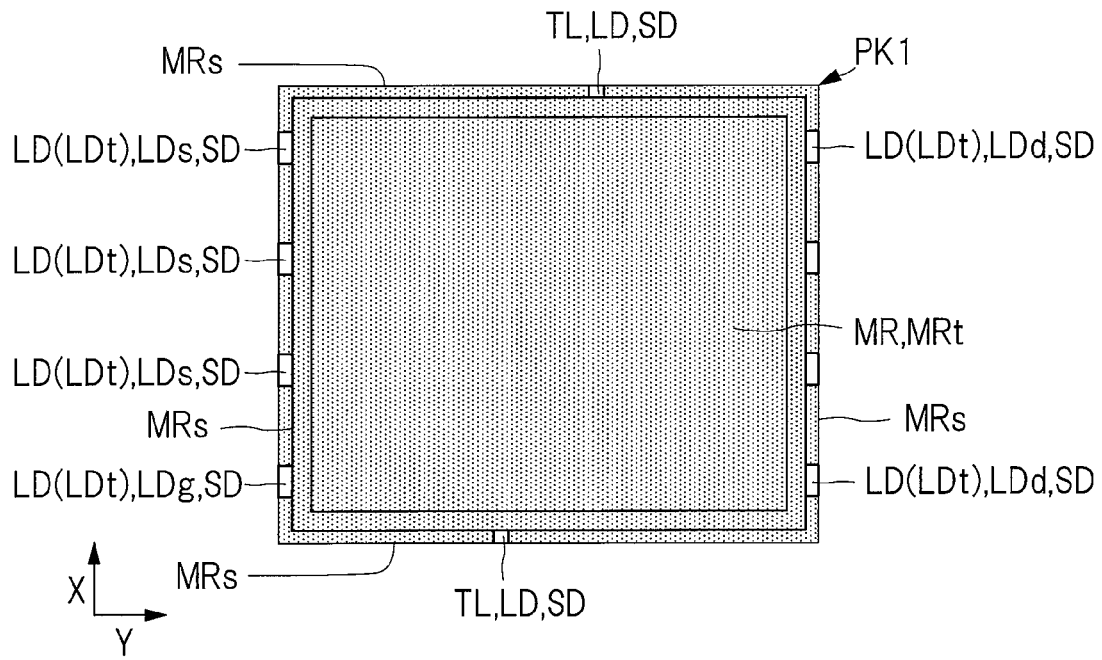
FIG. 3 is a top view of the semiconductor device illustrated in FIG. 1.
Figure 4:
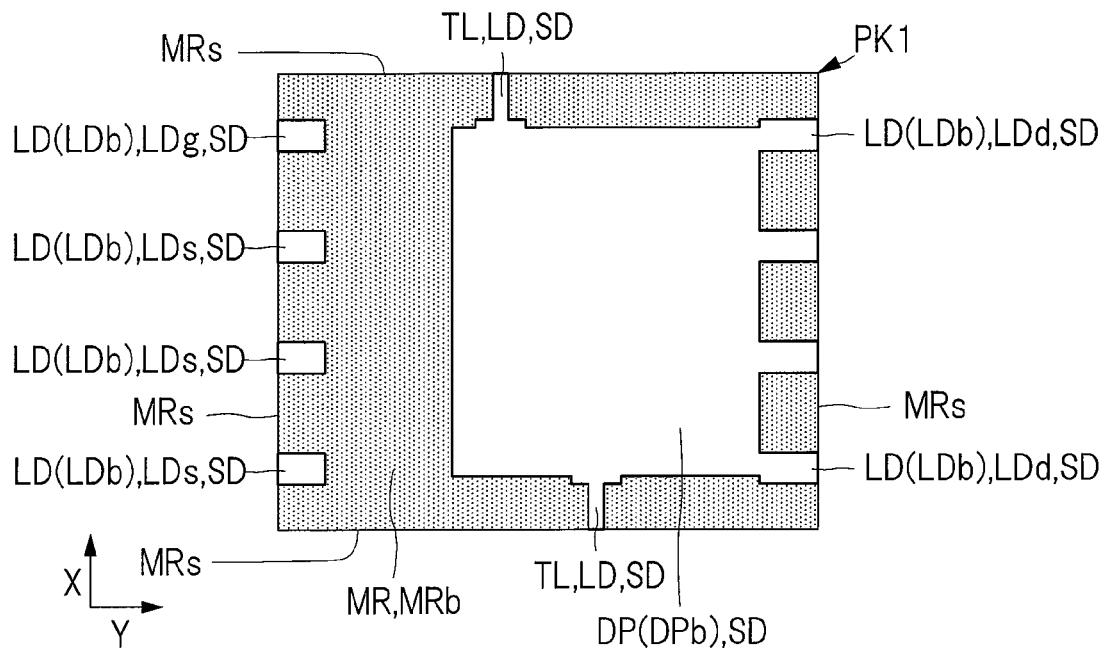
FIG. 4 is a bottom view of the semiconductor device illustrated in FIG. 3.
Figure 5:
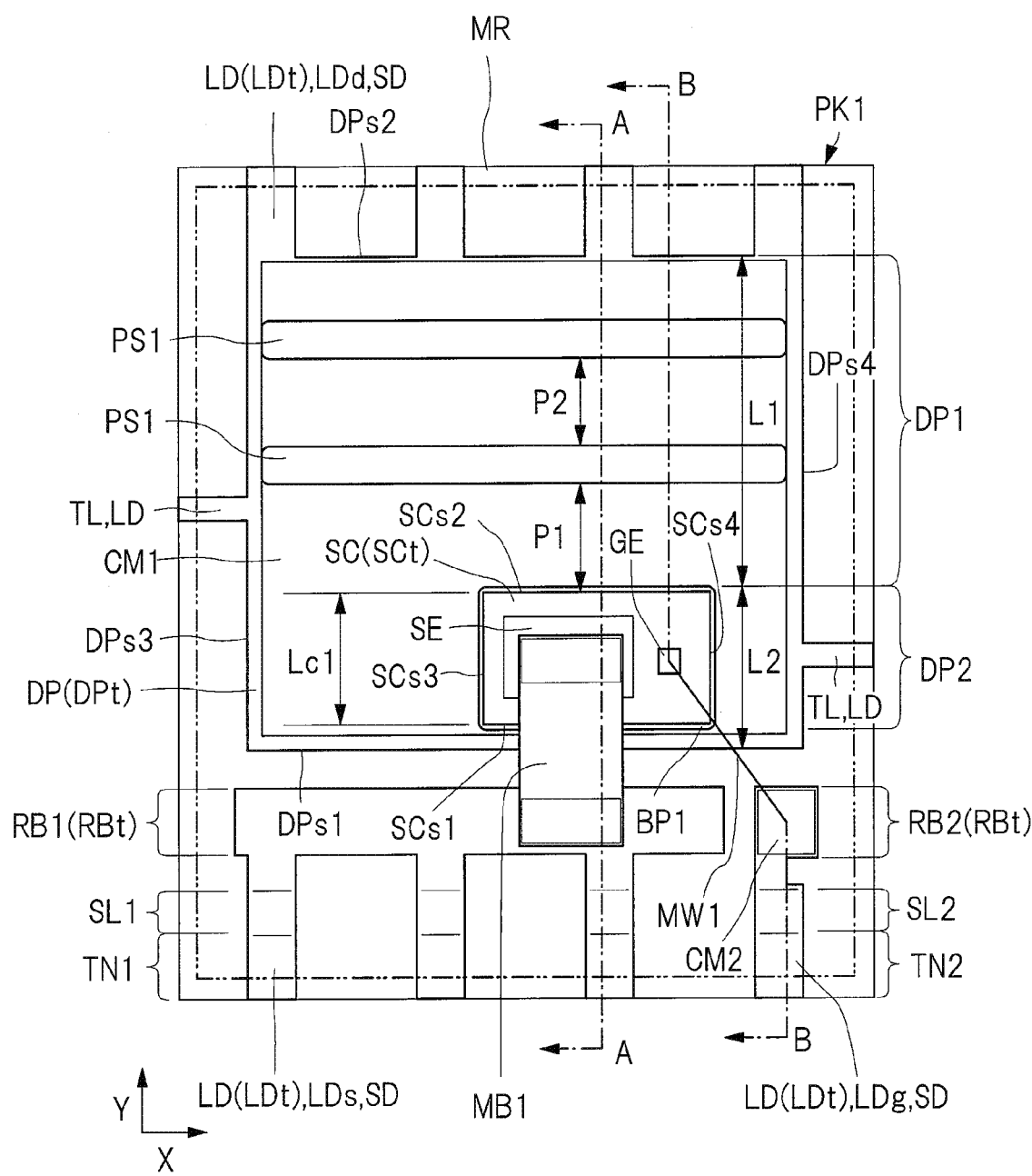
FIG. 5 is a perspective plan view illustrating an internal structure of the semiconductor device in a state in which a sealing body illustrated in FIG. 3 is removed.
Figure 6:
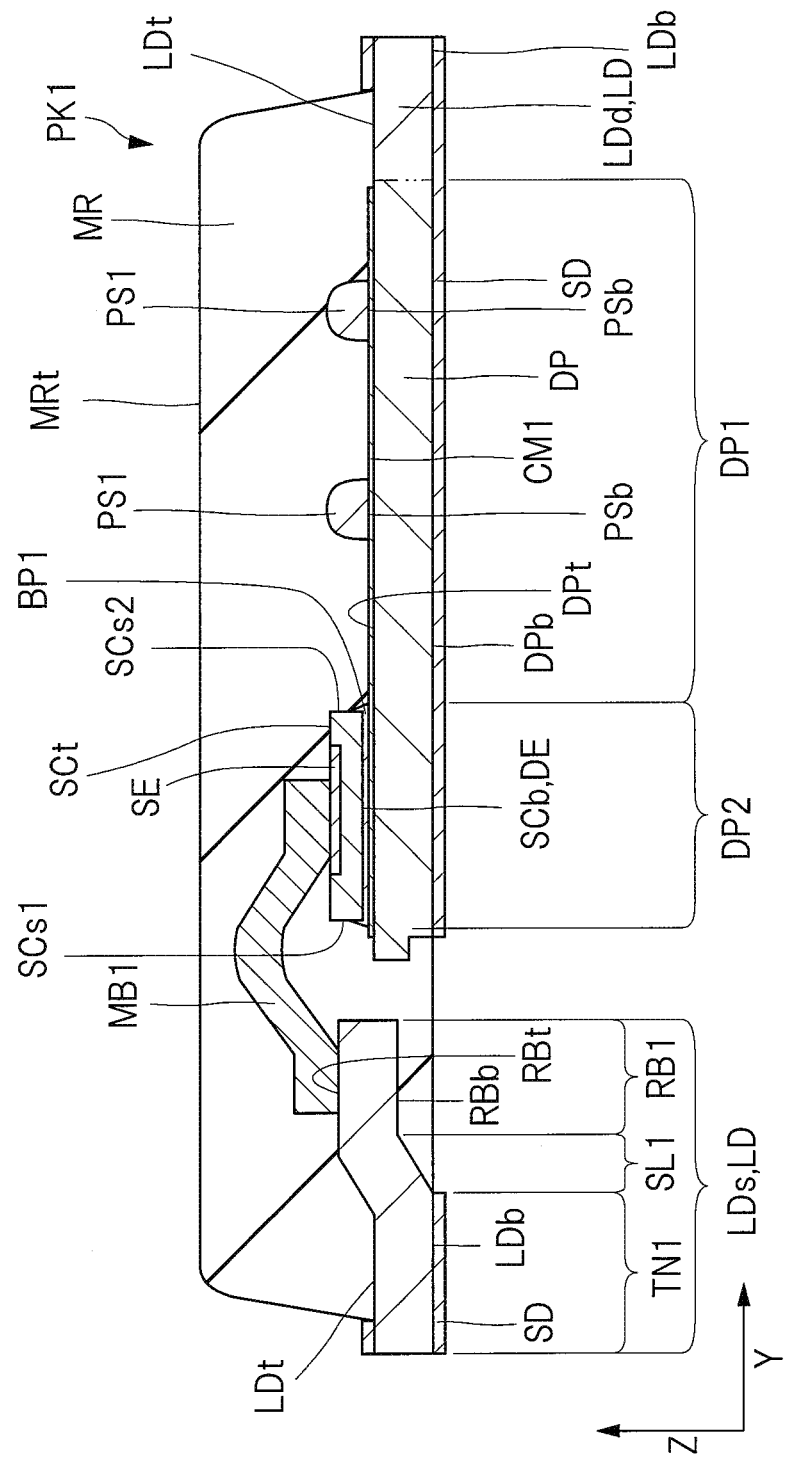
FIG. 6 is a cross-sectional view taken along the line A-A of FIG. 5.
Figure 7:
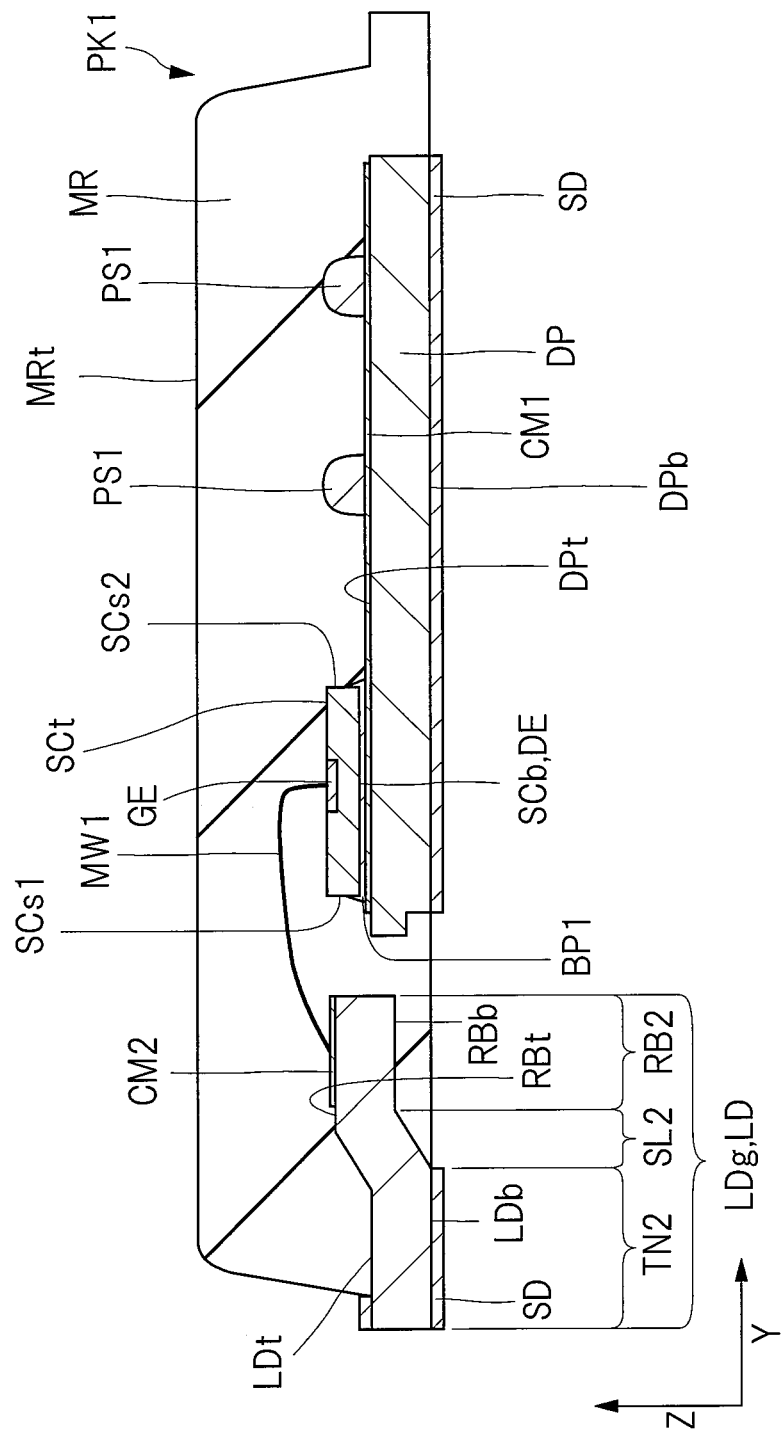
FIG. 7 is a cross-sectional view taken along the line B-B of FIG. 5.

Next, a package structure of the semiconductor device PK1 illustrated in FIG. 1 will be described. FIG. 3 is a top view of the semiconductor device illustrated in FIG. 1. Also, FIG. 4 is a bottom view of the semiconductor device illustrated in FIG. 3. Also, FIG. 5 is a perspective plan view illustrating an internal structure of the semiconductor device in a state in which a sealing body illustrated in FIG. 3 is removed. Also, FIG. 6 is a cross-sectional view taken along the line A-A of FIG. 5. Also, FIG. 7 is a cross-sectional view taken along the line B-B of FIG. 5.

Electrical characteristics of the aforementioned MOSFET have different requirements according to applications of the semiconductor device PK1 (see FIG. 1). Therefore, it is preferable that a package structure of the semiconductor device PK1 is capable of mounting a plurality of types of semiconductor chips SC having different planar sizes, in order to response the different requirements. On the other hand, it is preferable to make a terminal arrangement and a planar size of the semiconductor device PK1 common regardless of the planar size of the semiconductor chip SC. For example, by making other components than the semiconductor chip SC common, it is possible to improve manufacturing efficiency. Also, for example, by making the terminal arrangement common, it is possible to standardize a terminal arrangement of a mounting substrate which mounts the semiconductor device PK1. Also, it is preferable not to change a cross-sectional area of a heat dissipation path even when the planar size of the semiconductor chip SC is reduced, in consideration of, for example, heat dissipation characteristics of the semiconductor device PK1.

Therefore, the inventors of the present invention have studied a package capable of mounting a plurality of types of semiconductor chips SC having different planar sizes. Subsequently, a structure of the semiconductor device PK1 according to the present embodiment will be described with reference to FIGS. 3 to 7.

The semiconductor device PK1 includes a semiconductor chip SC (see FIGS. 5 and 6), a die pad DP (chip mounting portion) on which the semiconductor chip SC is mounted (see FIGS. 4 to 6), and a plurality of leads (terminals) LD that are external terminals (see FIGS. 4 to 6). Also, the semiconductor chip SC, a top surface DPt of the die pad PD, and top surfaces LDt of the plurality of leads are correctively sealed by the sealing body (resin body) MR. In the present embodiment, as illustrated in FIG. 5, the plurality of leads LD are arranged side-by-side with the die pad DP in a Y direction, and are arranged side-by-side with each other in an X direction perpendicular to the Y direction. Also, as illustrated in FIG. 5, in a plan view, the source lead for a source (source lead, source terminal) LDs, the die pad DP, the leads for drain (drain lead, drain terminal) LDd are arranged side-by-side with each other in the Y direction. Also, in the example illustrated in FIG. 5, the lead for a gate (gate lead, gate terminal) LDg is arranged opposite to the lead LDd of a drain, adjacent to the lead LDs for a source.

As illustrated in FIG. 6, the semiconductor chip SC has a front surface (surface, first surface) SCt and a rear surface (surface, second surface) SCb positioned opposite to the front surface SCt. Also, as illustrated in FIG. 5, the front surface SCt of the semiconductor chip SC (or the rear surface SCb illustrated in FIG. 6) forms a quadrangle in a plan view, and has four side surfaces including side surfaces SCs1, SCs2, SCs3, and SCs4 in a peripheral portion. In the example illustrated in FIG. 5, the semiconductor chip SC forms a rectangle in a plan view and has long sides arranged in the X direction.

Among the four side surfaces which the semiconductor chip SC has, the side surface SCs1 configuring a long side is arranged on the lead LDs for a source. Also, the side surface SCs2 constituting another long side is arranged opposite to the side SCs, that is, opposite to the lead LDs. Also, the side surface SCs 3 is arranged so as to respectively intersect with the sides SCs1 and SCs2. Also, the side SCs4 is arranged opposite to the side SCs 3. In addition, as illustrated in FIG. 5, a source electrode pad SE and a gate electrode pad GE are formed in the front surface SCt of the semiconductor chip SC, the source electrode pad SE being electrically connected to the source illustrated in FIG. 1 and the gate electrode pad GE being electrically connected to the gate electrode G illustrated in FIG. 1. On the other hand, as illustrated in FIG. 6, a drain electrode DE is formed in the rear surface SCb of the semiconductor chip SC illustrated in FIG. 6, the drain electrode DE being electrically connected to the drain D illustrated in FIG. 1. In the example illustrated in FIG. 6, the whole of the rear surface SCb of the semiconductor chip SC becomes the drain electrode DE.

As illustrated in FIG. 2, in the case of causing the semiconductor chip SC to have a vertical channel structure, it is possible to reduce on-resistance by making a thickness of the semiconductor chip SC thin (reducing a distance between the front surface SCt and the rear surface SCb illustrated in FIG. 6). Due to this, it is preferable that the thickness of the semiconductor chip SC is made thin, and it is preferable that the thickness of the semiconductor chip SC is equal to or less than 100 μm although it varies according to requirements in the specifications of an on-resistance value. For example, in the example illustrated in FIG. 6, the thickness of the semiconductor chip SC is about 50 μm and is thinner than a thickness of the die pad DP.

Also, as illustrated in FIGS. 5 and 6, the semiconductor device PK1 includes the die pad (chip mounting portion) DP on which the semiconductor chip SC is mounted. As illustrated in FIG. 6, the die pad DP has a top surface (chip mounting surface, first main surface) DPt on which the semiconductor chip SC is mounted through a die bond material BP1 and a bottom surface (packaging surface, second main surface) DPb opposite to the top surface DPt. Also, as illustrated in FIG. 5, the top surface DPt of the die pad DP (or the rear surface DPb illustrated in FIG. 6) forms a quadrangle in a plan view, and has four side surfaces including sides DPs1, DPs2, DPs3, and DPs4 in a peripheral portion. Among the four side surfaces, the side surface DPs1 is arranged on a side of the lead LDs of a source. Also, the side surface DPs2 is arranged opposite to the side surface DPs1, that is, opposite to the lead LDs. Also, the side surface DPs3 is arranged so as to respectively intersect with the side surfaces DPs1 and DPs2. The side surface SCs3 of the semiconductor chip SC is arranged along the side surface DPs3 of the die pad DP. Also, the side surface SCs4 is arranged opposite to the side surface SCs3.

Also, the die pad DP is integrally formed with the lead LDd that is a drain terminal. The lead LDd is an external terminal electrically connected to the drain D illustrated in FIG. 1. Also, the drain electrode DE formed in the rear surface SCb of the semiconductor chip SC as illustrated in FIG. 6 is electrically connected to the die pad DP through the die bond material BP1 made of a conductive material. Also, in the example illustrated in FIG. 5, a planar size of the semiconductor chip SC (area of the front surface SCt) is smaller than a planar size of the die pad DP (area of the top surface DPt).

Also, as illustrated in FIGS. 4 and 6, the bottom surface DPb of the die pad DP is exposed from the sealing body MR in the bottom surface MRb of the sealing body MR. Specifically, in the present embodiment, a stepped portion is formed in the periphery of the die pad DP and the stepped portion of the periphery of the die pad DP is sealed by the sealing body MR. Therefore, a part of the bottom surface DPb of the die pad DP is exposed from the sealing body MR. By increasing the planar size of the die pad DP and exposing the bottom surface DPb of the die pad DP from the sealing body, it is possible to improve dissipation efficiency of heat occurring in the semiconductor chip SC.

Also, by exposing the bottom surface DPb of the die pad DP, which serves as the lead LDd that is an external terminal, from the sealing body MR, it is possible to increase a cross-sectional area of a conduction path through which current flows. Therefore, it is possible to reduce an impedance component of the conduction path. In particular, the lead LDd is preferable in that, when there is an external terminal corresponding to an output node of a circuit included in the semiconductor device PK1, power consumption of output wirings can be directly reduced by reducing the impedance component of the conduction path connected to the lead LDd.

Also, a metal film (exterior plating film) SD for improving wettability of solder material that is a joint material is formed in the bottom surface DPb that is an exposed surface of the die pad DP, in the case of packaging the semiconductor device PK1 in a packaging substrate (not illustrated). In the case of packaging the semiconductor device PK1 in the packaging substrate (mother board) (not illustrated), for example, the solder material is used as a joint material or the like, which electrically connects a plurality of leads LD of the semiconductor device PK1 and terminals (not illustrated) of the packaging substrate. The metal film SD illustrated in FIGS. 5 and 6, which is an exterior plating film made of, for example, solder, is formed respectively in joint surfaces of terminals of the semiconductor device PK1 in terms of improvement of wettability of the solder material as the joint material.

Also, by forming a stepped portion in the peripheral portion of the die pad DP and sealing the stepped portion, the die pad DP is difficult to fall off the sealing body MR.

The die bond material (adhesive material) BP1 illustrated in FIGS. 5 and 6 fixes the semiconductor chip SC onto the die pad DP, and is a conductive material (die bond material) electrically connecting the semiconductor chip SC with the die pad DP. In the present embodiment, the die bond material BP1 is a conductive resin adhesive material, which is referred to as so-called silver (Ag) paste containing a plurality of silver (Ag) particles (Ag filler). The silver paste can improve adhesive strength with the semiconductor chip SC due to adhesive strength of, for example, epoxy-based thermosetting resin, and also secure the conduction path through the plurality of silver particles.

In a process of packaging the semiconductor device PK1 in a packaging substrate (not illustrate), heating processing called reflow processing is performed in order to melt a solder material (not illustrated) and respectively joining the leads LD to terminals of the packaging substrate (not illustrated). In the case of using a conductive adhesive material in which conductive particles are mixed in resin, as the die bond material BP1, the conductive adhesive material is not melted even in the case of arbitrarily setting a processing temperature of the reflow processing. Therefore, the die bond material BP1 of a joint portion between the semiconductor chip SC and the die pad DP is preferable in terms of preventing failure due to re-melting at the time of packaging the semiconductor device PK1.

Also, in the case of the present embodiment, a metal film (plating film, plating metal film) CM1 made of, for example, silver is formed and the die bond material BP1 is arranged on the metal film CM1, so as to cover the top surface DPt of the die pad DP. The metal film CM1 can be formed by, for example, an electrolytic plating method. By forming the metal film CM1 so as to cover the top surface DPt of the die pad DP, it is possible to suppress oxidation of copper (Cu) or copper alloy that is a base material of the die pad DP. Also, in the case of using silver paste as the die bond material BP1, it is possible to improve adhesive strength between the die bond material BP1 and the die pad DP by forming the metal film CM1 on the top surface DPt of the die pad DP, the metal film CM1 of which the adhesiveness with the silver paste is high compared to copper or copper alloy that is a base material of the die pad DP.

As described above, although it is preferable to manufacture a plurality of types of semiconductor chips SC having different planar sizes in order to accommodate different requirements, it is preferable to make components other than the semiconductor chip SC common. Therefore, in the present embodiment, the metal film CM1 is formed so as to cover of the majority of the top surface DPt of the die pad DP. Thereby, even in the case of mounting the semiconductor chip SC having a larger planar size than what is illustrated FIG. 5, the metal film CM1 can be interposed between the die bond material BP1 and the die pad DP. Therefore, in the case of mounting the semiconductor chip SC having a smaller planar size than what is illustrated FIG. 5, an area in which the semiconductor chip SC is not mounted becomes larger than an area in which the semiconductor chip SC is mounted.

Also, as illustrated in FIG. 5, the die pad DP is supported by the suspension lead TL. The suspension lead TL is a supporting member for fixing the die pad DP to a frame part LFc of a lead frame in a manufacturing process of the semiconductor device PK1.

Also, as illustrated in FIGS. 5 and 6, the source electrode pad SE of the semiconductor chip SC and the lead LDs are electrically connected to each other through a metal ribbon MB1 (conductive member, metal foil, belt-like metal member). The metal ribbon MB1 is a conductive member corresponding to a wiring that connects the source S of the transistor Q1 illustrated in FIG. 1 to the lead LDs of a source and is made of, for example, aluminum (Al).

Specifically, as illustrated in FIG. 6, one end of the metal ribbon MB1 is joined to the source electrode pad SE of the semiconductor chip SC. On the other hand, the other end of the metal ribbon MB1 opposite to the one end is joined to a top surface (connection surface, ribbon connection surface) RBt of a connection portion (ribbon connection portion) RB1 which is formed in a part of the lead LDs. In the example illustrated in FIG. 5, the semiconductor chip SC forms a connection surface when it is seen in a plan view and the metal ribbon MB1 is arranged to intersect with the long sides of the semiconductor chip SC.

In the joint portion between the metal ribbon MB1 and the source electrode pad SE, a metal member (for example, aluminum) which is exposed in the outermost surface of the source electrode pad SE and, for example, an aluminum ribbon which the metal ribbon MB1 form a metal bond, thereby achieving joint. On the other hand, in the top surface RBt of the connection portion RB1 connected to the metal ribbon MB1, copper (Cu) forming, for example, a base material is exposed, and, for example, aluminum forming an exposed surface of copper (Cu) and the metal ribbon MB1 form a metal bond, thereby achieving joint. Although described below, in the case of joining the metal ribbon MB1, it is possible to form a joint portion as described above by applying ultrasonic waves from the bonding tool. In the case of joining an aluminum ribbon to the lead LD, it is possible to improve joint strength when copper forming the base material is exposed, compared to the case of forming a silver plating film on the joint surface. Therefore, in the top surface RBt of the connection portion RB1 of the LDs, the metal film is not formed unlike the metal film CM1 covering the top surface DPt of the die pad DP, and copper or copper alloy that is a base material is exposed.

Also, as illustrated in FIG. 6, a height of the top surface RBt of the connection portion RB1 of the lead LDs is arranged at a position higher than the top surface DPt of the die pad DP. Specifically, the lead LDs includes a connection portion RB1 to which the metal ribbon MB1 is connected and a terminal portion TN1 having a bottom surface (packaging surface) LDb exposed from the sealing body MR. Also, the lead LDs includes an offset portion (bent portion, inclined portion, stepped portion) SL1 provided between the connection portion RBI and the terminal portion TN1 such that a position of the connection portion RBI is higher than a position of the terminal portion TN1. Therefore, a bottom surface RBb of the connection portion RB1 is covered by the sealing body MR. In other words, the connection portion RB1 of the lead LDs is sealed by the sealing body MR. By sealing a part of the bottom surface of the lead LD using the sealing body MR, the lead LD is difficult to fall off the sealing body MR. As a result, it is possible to improve electrical connection reliability of the semiconductor device PK1.

Also, as illustrated in FIGS. 5 and 7, the lead LDg which is an external terminal electrically connected to the gate electrode pad GE of the semiconductor chip SC is arranged adjacent to the die pad DP. The lead LDg is provided spaced apart from the die pad DP. Also, as illustrated in FIG. 7, the lead LDg includes a connection portion (wire connection portion) RB2 which is a bonding region to which a wire MW1 is joined and a terminal portion TN2 having a bottom surface LDb exposed from the sealing body MR. Also, the lead LDg includes an offset portion (bent portion, inclined portion, stepped portion) SL2 provided between the connection portion RB2 and the terminal portion TN2 such that a position of the connection portion RB2 is higher than a position of the terminal portion TN2. Therefore, a bottom surface RBb of the connection portion RB2 is covered by the sealing body MR.

Also, the wire MW1 connecting the gate electrode pad GE and the lead LDg is a metal wire made of, for example, gold (Au). In addition, a metal film (plating film, plating metal film) CM2, which is made of, for example, silver, is formed in the top surface (connection surface, wire connection surface) RBt of the connection portion RB2 of the lead LD. By forming the metal film CM2 so as to cover the top surface RBt of the connection portion RB2 of the lead LD, it is possible to suppress oxidation of copper (Cu) or copper alloy that is a base material of the lead LD. Since a copper oxide film is a cause to inhibit conductivity of electricity or heat, it is possible to improve electricity conductivity or heat conductivity of the lead LD by suppressing oxidation of the base material. Also, it is possible to improve wire bonding performance in the case of joining the wire MW1 by forming the metal film CM2 so as to cover the top surface RBt of the connection portion RB2. Therefore, in the present embodiment, the metal film CM2 is selectively formed on the top surface RBt of the connection portion RB2 to which the wire MW1 made of gold is joined. Also, in the case of respectively forming the metal film CM1 to be formed on the top surface DPt of the die pad DP and the metal film CM2 to be formed on the lead LDg by using the same material, it is possible to collectively form the metal film CM1 and the metal film CM2. In this case, since it is preferable not to form the metal film on the top surface RBt of the connection portion RB1 of the lead LDs to which the aluminum ribbon illustrated in FIG. 6 is connected, it is preferable to perform formation in a state in which the top surface RBt of the connection portion RB1 is covered by a mask (not illustrated).

Also, as illustrated in FIG. 6, the semiconductor chip SC, the connection portion RB1 of the lead LDs, and the metal ribbon MB1 are sealed by the sealing body MR. Also, as illustrated in FIG. 7, the connection portion RB2 of the lead LDg and the wire MW1 is sealed by the sealing body MR.

The sealing body MR is a resin body which seals the semiconductor chip SC, the metal ribbon MR1, and the wire MW1, and has a top surface MRt (see FIGS. 3 and 6) and the bottom surface (packaging surface) MRb (see FIGS. 4, 6, and 7) positioned opposite to the top surface MRt. Also, as illustrated in FIGS. 3 and 4, the sealing body MR forms a quadrangle in a plan view and has four side surfaces MRs.

The sealing body MR is mainly made of, for example, thermosetting resin, such as epoxy-based resin. Also, there is a case where filler particles, such as silica (silicon dioxide: $SiO_2$) particles are mixed into a resin material, in order to improve characteristics of the sealing body MR (for example, expansion characteristics due to thermal effects).

<Details of Layout on Die Pad>

Figure 8:
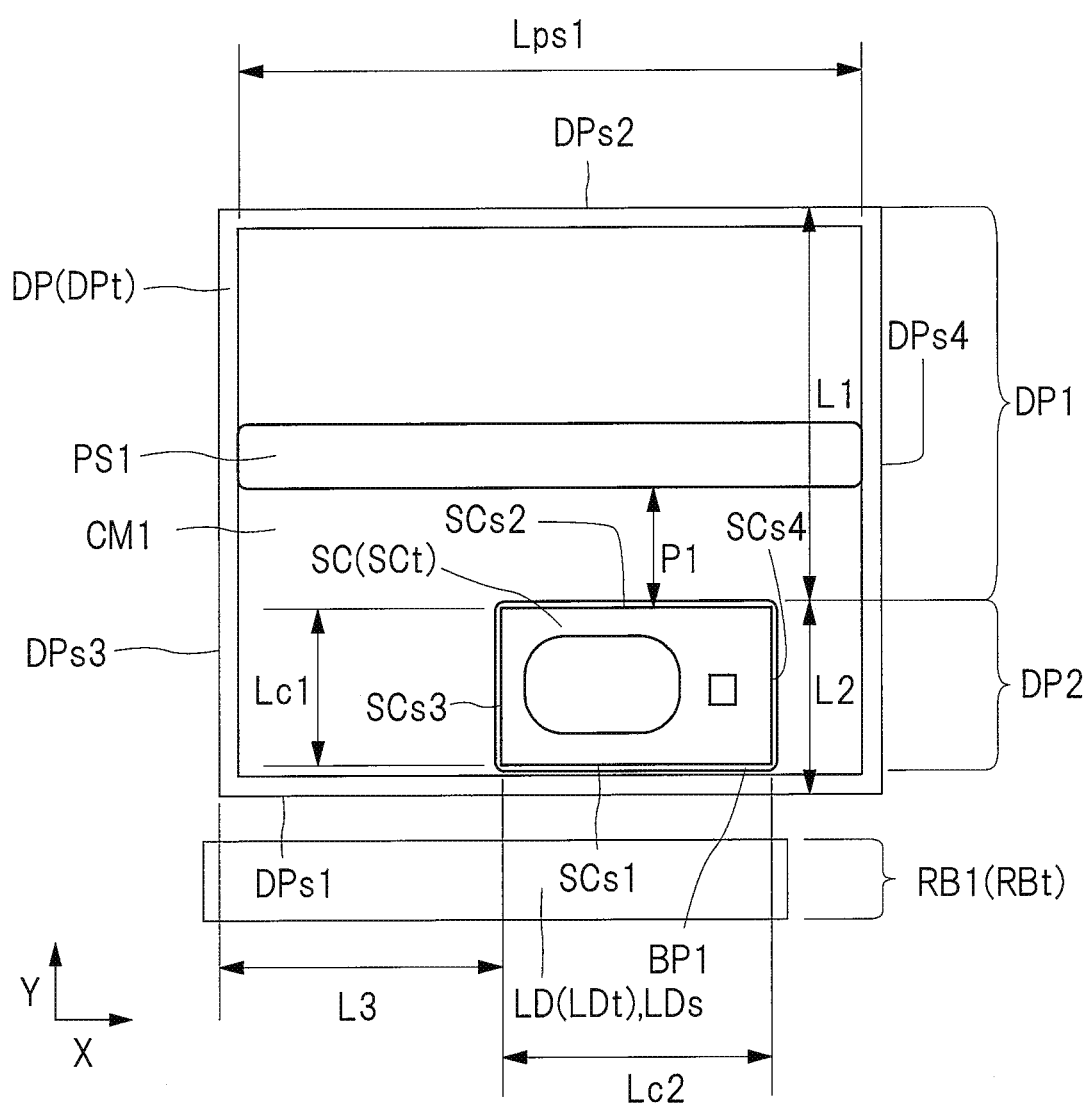
FIG. 8 is a main-part-enlarged plan view illustrating a state in which a member is mounted on a portion of a die pad, on which a semiconductor chip is not mounted, as a modification example of FIG. 5.
Figure 40:
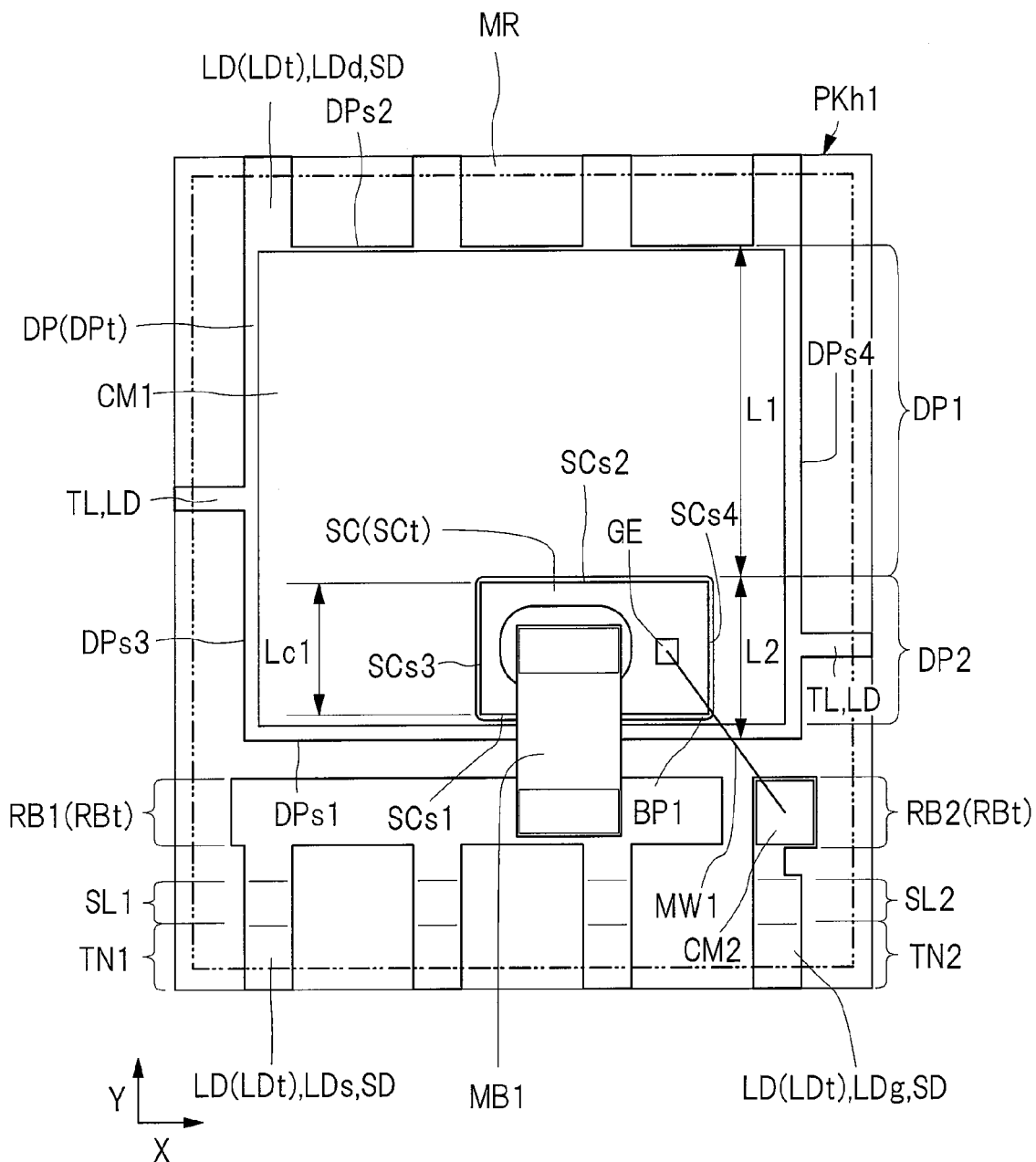
FIG. 40 is a perspective plan view illustrating an internal structure of a semiconductor device according to a comparative example with respect to FIG. 5.

Details of a layout on the die pad DP illustrated in FIG. 5 will be described below. FIG. 8 is a modification example of FIG. 5, and a main-part-enlarged plan view illustrating a state in which a member is mounted on a portion on which a semiconductor chip of a die pad is not mounted. Also, FIG. 40 is a perspective plan view illustrating an internal structure of a semiconductor device according to a comparative example of FIG. 5.

As described above, there is a case in which a wide area on which a semiconductor chip SC is not mounted on a top surface DPt of a die pad DP may be left as illustrated in FIG. 5, in the case of mounting a plurality of types of semiconductor chips having different planar sizes on the die pad DP having one type of planar size. In other words, in a plan view, there is a case in which an area of a region of the top surface DPt of the die pad DP, on which the semiconductor chip is not mounted SC, is large than an area of the semiconductor chip. In FIG. 5, the die pad DP includes a part DP1, on which the semiconductor chip SC is not mounted, and a part DP2, which is provided between the part DP1 and the lead LDs in a plan view, and on which the semiconductor chip SC is mounted. Also, a length Lc1 of the semiconductor chip SC in the Y direction is shorter (smaller) than a length L1 of the part DP1 in the Y direction. In other words, the length L1 of the part DP1 of the die pad DP in the Y direction is longer (larger) than a length L2 of the part DP2. In the example illustrated in FIG. 5, an area of a region on which the semiconductor chip SC is mounted is equal to or less than half an area of the top surface DPt of the die pad DP. Also, it is preferable to make the mounting position of the semiconductor chip SC closer to the lead LDs than a central portion of the die pad DP in terms of reducing a connection distance between the source electrode pad SE of the semiconductor chip SC and the lead LDs for a source. Therefore, the area of the part DP1 which is positioned on a side farther from the lead LDs than the part DP2 of the die pad DP becomes larger.

Since it is preferable to make terminal arrangement common in terms of versatility of the semiconductor device PK1, there is no problem even when a region on which the semiconductor chip SC is not mounted is left large as illustrated in FIG. 5. Also, since it is possible to increase a cross-sectional area of a heat dissipation path by increasing a plane area of the die pad DP in terms of heat dissipation of the semiconductor device PK1, it is preferable that the planar size of the die pad DP is large even when the planar size of the semiconductor chip SC is small.

However, through intensive studies, the present inventors have found that, when the area of a region of the die pad DP on which the semiconductor chip is not mounted becomes large by reducing the planar size of the semiconductor chip SC, an adhesive surface between the semiconductor chip SC and the die pad DP is easily damaged. Specifically, it is found that, when the member PS1 illustrated in FIG. 5 is not arranged on the part DP1 of the die pad DP, like the semiconductor device PKh1 of the comparative example illustrated in FIG. 40, cracks are caused in the die bond material BP1 which adhesively fixes the semiconductor chip SC to the die pad DP, and the cracks propagate into the die bond material BP1 (bulk destruction of the die bond material BP1) and the semiconductor chip SC is peeled from the die pad DP. There is a case where this phenomenon is caused by thermal effects at the time of reflow processing which is performed in the case of packaging the semiconductor device PKh1 in a packaging substrate (not illustrated). Also, there is a case where, even when cracks are not caused after the reflow processing, cracks are caused due to a subsequent temperature cycle load. Also, it is found that the almost whole surface of an adhesion interface between the sealing body MR and the die pad DP is peeled off in the part DP1 on which the semiconductor chip SC is not mounted in the case of minutely examining the semiconductor device PKh1 which is peeled off since cracks propagate into the die bond material BP1.

From the above findings, a phenomenon in which cracks occur in the die bond material BP1 is considered to be generated by the following mechanism. That is, when a temperature cycle load is applied to the semiconductor device PKh1, a stress occurs in the adhesion interface between the sealing body MR and the die pad DP due to a difference in linear expansion coefficient between the sealing body MR and the die pad DP. Since a magnitude of the stress increases in proportion to a magnitude of the difference in linear expansion coefficient and an area of the adhesion interface, the stress increases as the area of the part DP1 of the die pad DP increases. Also, in the adhesion interface between the semiconductor chip SC and the die pad DP, another stress occurs due to a difference in linear expansion coefficient between the semiconductor chip SC and the die pad DP. Therefore, the stress occurring in the adhesion interface between the die pad DP and the sealing body MR is likely to be concentrated on the interface between the part DP1 and the part DP2 of the die pad DP. Accordingly, it is considered that, when the planar size of the semiconductor chip SC is small, that is, when the area of the die pad DP1 is large, a large stress occurs in the interface between the part DP1 and the part DP2 of the die pad DP, and cracks are caused in the die bond material BP1 due to the stress, resulting in peeling.

The stress occurring due to the difference in linear expansion coefficient between the die pad DP and the sealing body MR is large particularly in a die pad exposed type semiconductor device in which the bottom surface DPb of the die pad DP is exposed from the sealing body MR as illustrated in FIG. 6. When the whole bottom surface DPb of the die pad DP is sealed by the sealing body MR, it is possible to easily suppress thermal expansion and heat shrinkage of the die pad DP by forming the sealing body MR to wrap the die pad DP. However, since the die pad DP is likely to expand or shrink due to thermal effects when the bottom surface DPb of the die pad DP is exposed from the sealing body MR, the stress easily becomes large.

Also, a thickness of the semiconductor chip Sc becomes thin to a thickness equal to or less than about 100 μm, it is necessary to reduce a supply amount of the die bond material BP1 made of conductive material. The reason for this is to prevent the die bond material BP1 made of conductive material from flowing toward the front surface SCt of the semiconductor chip SC and causing short-circuiting between the drain electrode DE (see FIG. 6) on the side of the rear surface SCb (see FIG. 6) and the source electrode pad SE on the side of the front surface SCt. In this case, since the fillet shape of the die bond material BP1 is hardly formed in the peripheral portion of the semiconductor chip SC, the die bond material BP1 is easily damaged compared to a case in which the thickness of the semiconductor chip SC is thicker than 100 μm.

Therefore, the present inventors have studied a technique to reduce a stress occurring between an interface between the part DP1 and the part DP2 of the die pad DP and have founded the following configuration. That is, as illustrated in FIG. 8, the member PS1 is fixed to the top surface DPt of the part DP1 of the die pad DP between the side surface SCs1 of the semiconductor chip SC and the peripheral portion of the die pad DP (side surface DPs2 positioned opposite to the lead LDs). When the member PS1 can be adhesively fixed onto the top surface DPt of the die pad (onto the metal film CM1 in the example illustrated in FIG. 8), it is possible to use various types of materials. In the example illustrated in FIG. 5 or 8, for example, the member PS1 is formed by curing a conductive resin adhesive material called silver paste, having a plurality of silver particles in the same material as the die bond material BP1, that is, resin. By forming the die bond material BP1 and the member PS1 with the same material, it is possible to reduce a process added in order to form the member PS1 in the manufacturing processes of the semiconductor device PK1 (see FIG. 5).

The member PS1 made of the silver paste is adhesively fixed onto the top surface DPt of the die pad DP. As described above, in a case where the member PS1 is adhesively fixed between the side surface SCs2 of the semiconductor chip SC and the peripheral portion of the die pad DP (side surface DPs2 positioned opposite to the lead LDs), when a temperature load is applied to the semiconductor device PK1, a stress occurs in a different manner from the semiconductor device PK1 illustrated in FIG. 40. That is, a part of the stress occurring due to a difference in linear expansion coefficient between the die pad DP and the sealing body (see FIG. 6) is dispersed to the member PS1. As a result, it is possible to reduce the stress occurring in an interface between the part DP1 and the part DP2 of the die pad DP. In addition, by reducing the stress occurring in an interface between the part DP1 and the part DP2 of the die pad DP, it is possible to suppress damage to the adhesion surface between the semiconductor chip SC and the die pad DP.

On the other hand, since the member PS1 is a member for suppressing damage to the adhesion surface between the semiconductor chip SC and the die pad DP, it is unnecessary to be electrically connected to circuits formed in the semiconductor device PK1. In the case of electrically connecting to the lead LD through a conductive member, such as a metal ribbon MB1 illustrated in FIG. 5 or the wire MW1 as in the semiconductor chip SC, the manufacturing processes is complicated. In the present embodiment, since the member PS1 is formed by using silver paste like the die bond material BP1 in terms of making the manufacturing processes effective as described above, it can be considered that the mounting surface PSb (see FIG. 6) of the member PS1 is electrically connected to the die pad DP. In addition, it is preferable to reduce electrical performance of the member PS1 in terms of reducing noise since it is unnecessary to allow the member PS1 to work electrically. Therefore, parts other than the mounting surface PSb of the member PS1 is not electrically connected to the other leads LD or the semiconductor chip SC. In other words, the member PS1 of the present embodiment is electrically separated (insulated) from the die pad DP and the leads LD other than the lead LDd which is formed integrally with the die pad DP and the die pad DP. Therefore, it is possible to suppress reduction in manufacturing efficiency even when the member PS1 is mounted on the part DP1 of the die pad DP. Also, since the member PS1 is an open end as electrical circuits, current hardly flows through the member PS1 when current flows through the transistor Q1 described with reference to FIG. 1. Therefore, even in the case of forming the member PS1 using a conductive material, it is possible to reduce influence on electrical characteristics of the transistor Q1.

Also, as illustrated in FIG. 8, a length (distance) L3 in a plan view from the peripheral portion (side surface SCs3) of the semiconductor chip SC in the X direction perpendicular to the Y direction to the peripheral portion (side surface DPs3) of the die pad DP is shorter (smaller) than a length L1 of the part DP1 in the Y direction. Also, a distance (not indicated by symbols) in a plan view from the peripheral portion (side surface SCs4) of the semiconductor chip SC in the X direction perpendicular to the Y direction to the peripheral portion (side surface DPs4) of the die pad DP is shorter (smaller) than the length L1 of the part DP1 in the Y direction. That is, the length L1 of a region on which the semiconductor chip SC is not mounted in the Y direction is longer (larger) than the length L3 of a region on which the semiconductor chip SC is not mounted in the X direction. In this case, a stress occurring in the side surface SCs3 and the side surface SCs4 of the semiconductor chip SC is small compared to a stress occurring in the side surface SCs2, and therefore, the stress does not have to be taken into account. Similarly, since the distance in a plan view between the side surface SCs1 of the semiconductor chip SC and the side surface DPs1 of the die pad DP is smaller than the length L1, the stress occurring in the side surface SCs1 of the semiconductor chip SC does not have to be taken into account.

That is, it is possible to suppress damage to the adhesion surface between the semiconductor chip SC and the die pad DP by arranging the member PS1 between the side surface SCs2 of the semiconductor chip and the side surface DPs2 in which the largest stress occurs.

Also, it is preferable to reduce a separation distance P1 between the semiconductor chip SC and the member PS1 in the Y direction illustrated in FIG. 8 in terms of increasing a reduction amount of the stress occurring in the interface between the part DP1 and the part DP2 of the die pad DP.

In the example illustrated in FIG. 8, the separation distance P1 becomes smaller than the length Lc1 of the semiconductor chip in the Y direction. Also, although there is illustrated an example in which a plurality of members PS1 are adhesively fixed between the side surface SCs2 of the semiconductor chip SC and the peripheral portion of the die pad DP in FIG. 5 (side surface DPs2 positioned opposite to the lead LDs) in FIG. 5, a separation distance P1 between the member PS1 arranged closest to the semiconductor chip SC1 among the plurality of members PS1 and the semiconductor chip SC is smaller than the length Lc1 of the semiconductor chip in the Y direction. Since the stress occurring in the interface between the part DP1 and the part DP2 of the die pad DP increases in proportion to the separation distance P1 between the member PS1 and the semiconductor chip SC in the Y direction, the separation distance P1 is preferably smaller than the length Lc1 of the semiconductor chip SC in the Y direction.

Also, a thickness of the member PS1 is preferably larger than a thickness of the semiconductor chip SC in terms of improving the effect of dispersing the stress due to the member PS1. As illustrated in FIG. 6, the thickness of the member PS1 is larger than the thickness of the semiconductor chip SC. By increasing the thickness of the member PS1, it is possible to suppress transferring of influence of thermal expansion and heat shrinkage of the sealing body MR to the die bond material BP1. Also, although there is illustrated an example in which a plurality of members PS1 are adhesively fixed to the part DP1 of the die pad DP in FIG. 6, a thickness of each of the plurality of members PS1 is larger than the thickness of the semiconductor chip SC. For example, in the example illustrated in FIG. 6, the thickness of the member PS1 is about 150 μm.

Also, it is preferable that the length Lps1 of the member PS1 in the X direction is longer than the length Lc12 of the semiconductor chip SC in the X direction as illustrated in FIG. 8 in terms of certainly dispersing the stress occurring in the interface between the part DP1 and the part DP2 of the die pad DP. When the part PS1 extends so as to be longer than the semiconductor chip SC in the X direction, it is possible to prevent the stress from being introduced from the periphery of the member PS1 to be applied to the interface between the part DP1 and the part DP2. In the present embodiment, the metal film CM1 is formed on the top surface DPt of the die pad DP and the member PS1 extends in the X direction so as to cover from the a side along the side surface DPs3 of the metal film CM1 to a side on the opposite side. In this case, it is possible to greatly reduce the stress occurring in the interface between the part DP1 and the part DP2 of the die pad DP since it is possible to certainly interpose the member PS1 between the side surface SCs2 of the semiconductor chip SC and the side surface DPs2 of the die pad DP in a plan view.

However, when the separation distance between the member PS1 and the side surface DPs of the die pad DP in the Y direction is long, there is considered a case in which the member PS1 is damaged due to occurrence of the stress in the member PS1. Since it is impossible to obtain the stress dispersion effect by the member PS1 when the member PS1 is separated from the die pad DP, stress concentration is likely to easily occur between the interface between the part DP1 and the part DP2 of the die pad DP. Therefore, it is preferable to mount a plurality of members PS1 in the part DP1 of the die pad DP as in the semiconductor device PK1 in terms of preventing or suppressing peeling of the member PS1 formed in a position closest to the semiconductor chip SC. Also, although not illustrated, in the modification example with respect to FIG. 5, there is considered a method of suppressing damage to the member PS1 by increasing the length (width) thereof in the Y direction illustrated in, for example, FIG. 5 (for example, by increasing a width as in the case of forming two members PS1 integrally with each other). However, it is preferable to mount the plurality of members PS1 extending in the X direction perpendicular to the Y direction as illustrated in FIG. 5, in terms of reducing the use amount of materials mounted within the semiconductor device PK1.

Also, it is preferable that the separation distance P2 between the plurality of members PS1 in the Y direction is smaller than the length Lc1 of the semiconductor chip SC in the Y direction as illustrated in FIG. 5 in terms of certainly dispersing the stress between the plurality of members PS1. Thereby, the stress applied to each of the plurality of members PS1 can be reduced, thereby suppressing peeling of the members PS1.

Also, as another embodiment from the present embodiment, a method of forming grooves or a plurality of hollow parts (dimples) (not illustrated) in the die pad DP or a method of performing roughening treatment can be considered without providing the members PS1 illustrated in FIG. 6 and FIG. 8. Therefore, since ranges of a region on which the semiconductor chip SC is mounted are different when it is considered that the plurality of types of semiconductor chips SC having different planar sizes as described above, it is difficult to individually optimize positions at which the grooves are formed or positions at which the roughening treatment is performed. On the other hand, it is possible to optimize the mounting position of the member PS1 according to the planar size of the semiconductor chip SC since it is possible to suppress damage to the die pad DP1 by adding the member PS1 to the common die pad DP.

<Manufacturing Method of Semiconductor Device>

Figure 9:
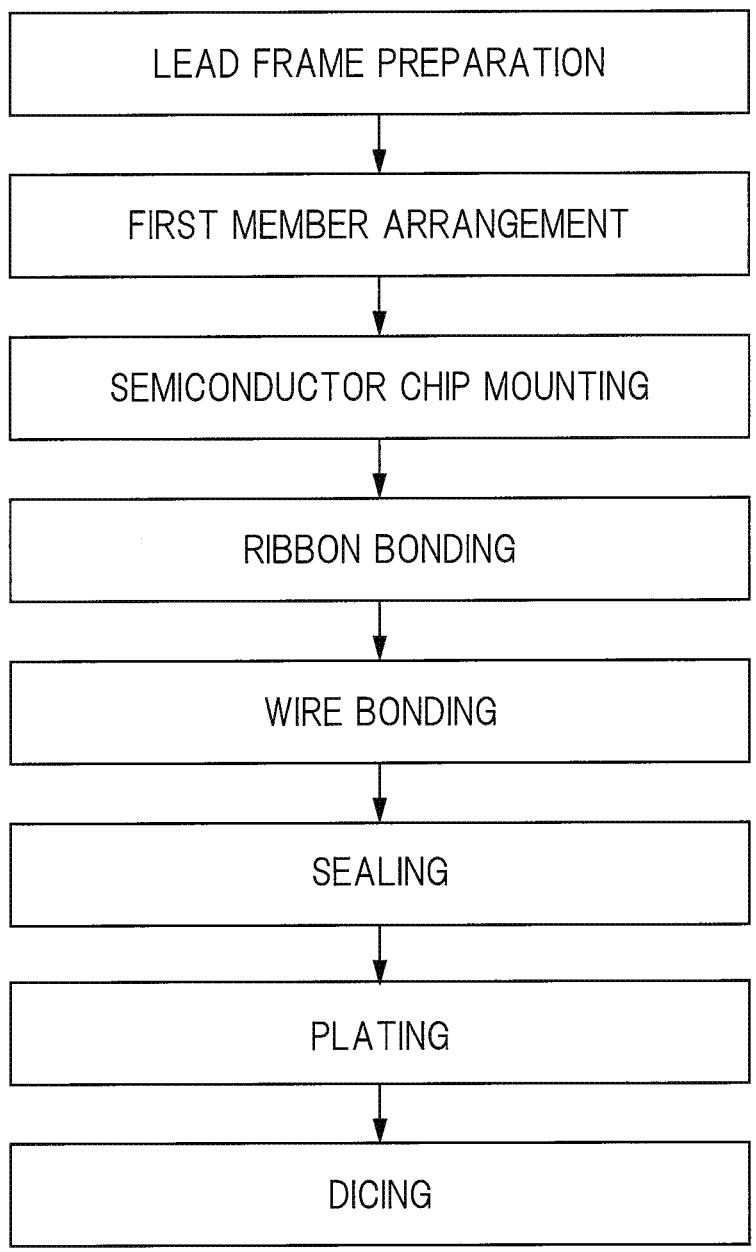
FIG. 9 is an explanatory diagram illustrating overview of manufacturing processes of the semiconductor device described with reference to FIGS. 1 to 7.

Next, manufacturing processes of the semiconductor device PK1 described with reference to FIGS. 1 to 7 will be described. The semiconductor device PK1 is manufactured according to a flow illustrated in FIG. 9. FIG. 9 is an explanatory diagram illustrating overview of the manufacturing processes of the semiconductor device described with reference to FIGS. 1 to 7.

<Lead Frame Preparation Process>

Figure 10:
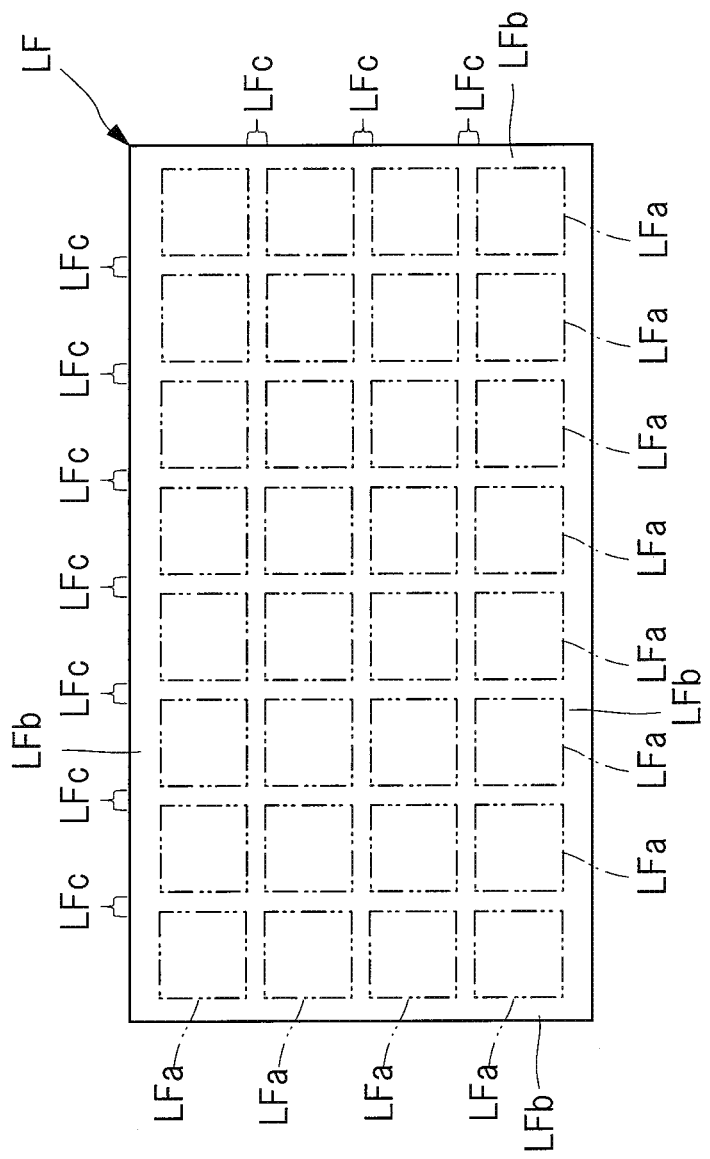
FIG. 10 is a plan view illustrating a whole structure of a wiring substrate prepared in a lead frame preparing process illustrated in FIG. 9.
Figure 11:
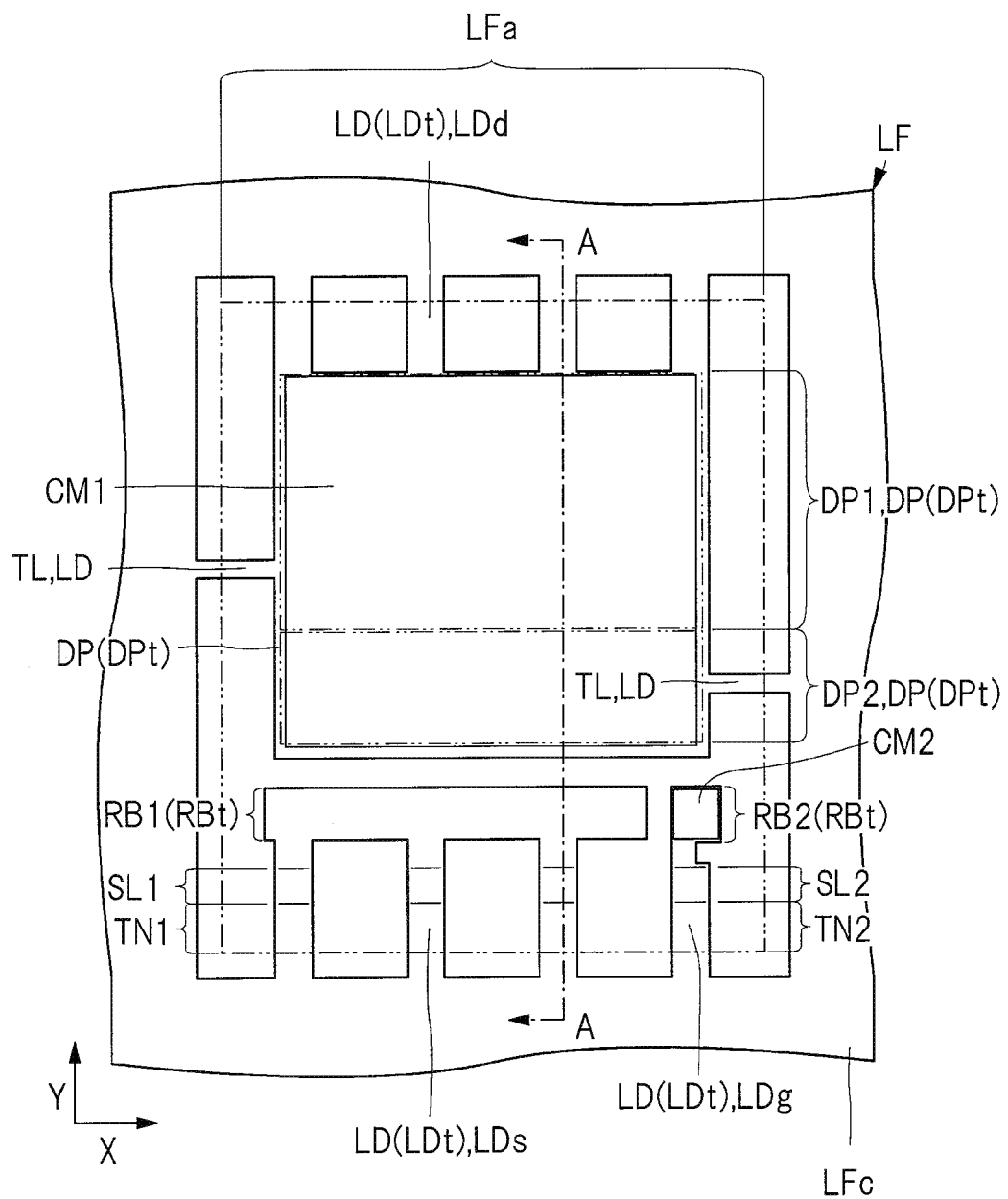
FIG. 11 is an enlarged plan view of a single device forming part illustrated in FIG. 10.
Figure 12:
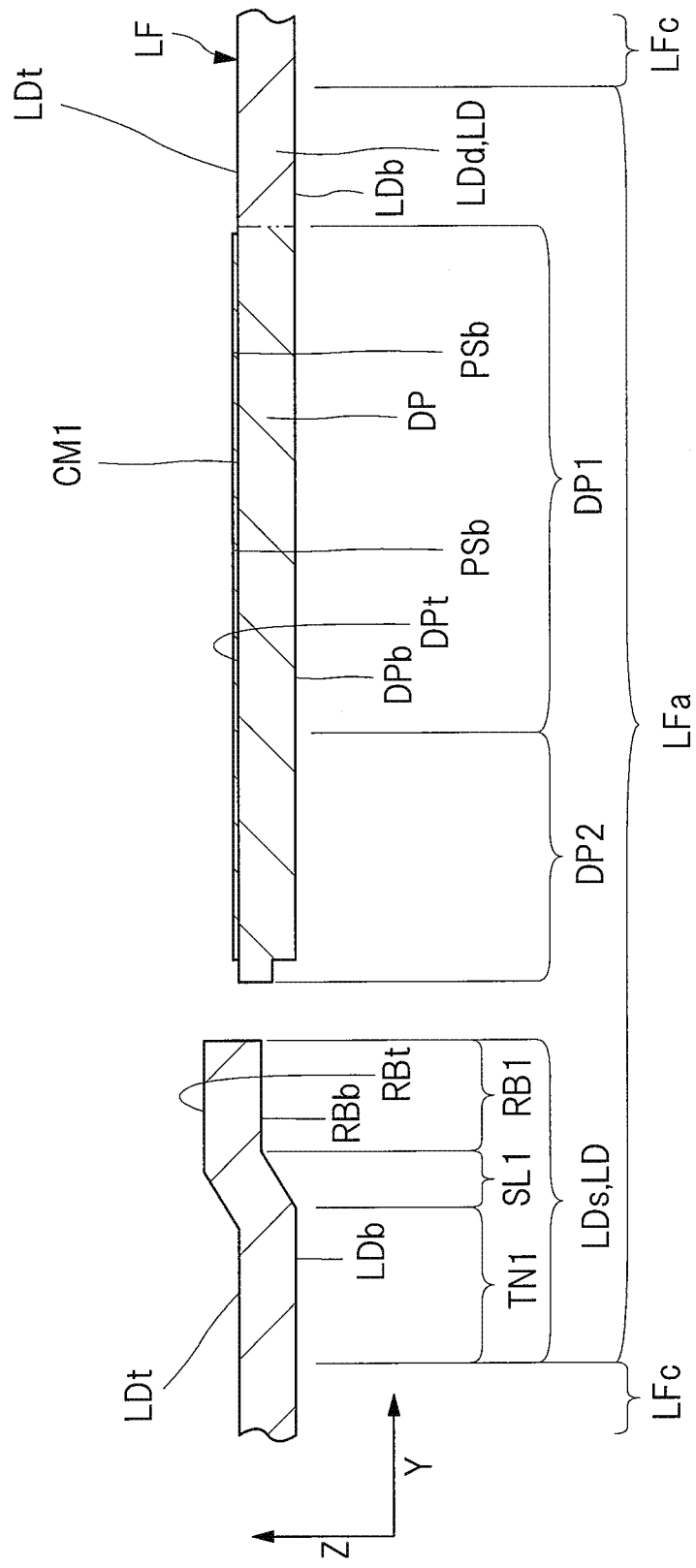
FIG. 12 is an enlarged cross-sectional view taken along the line A-A of FIG. 11.

First, in the lead frame preparation process illustrated in FIG. 9, a lead frame LF illustrated in FIGS. 10 to 12 is prepared. FIG. 10 is a plan view illustrating a whole structure of a wiring substrate prepared in the lead frame preparation process illustrated in FIG. 9. Also, FIG. 11 is an enlarged plan view of a single device forming part illustrated in FIG. 10. Also, FIG. 12 is an enlarged cross-sectional view taken along the line A-A of FIG. 11.

As illustrated in FIG. 10, the lead frame LF prepared in the present process includes a plurality of device forming parts LFa (32 in FIG. 10) inside an outer frame LFb. Each of the plurality of device forming parts LFa corresponds to a single semiconductor device PK1 illustrated in FIG. 5. The lead frame LF is a so-called multiple-piece providing base material on which the plurality of device forming parts LFa are arranged in a matrix shape. In this way, the plurality of semiconductor devices PK1 (see FIG. 3) can be manufactured at a time by using the lead frame LF provided with the plurality of device forming parts LFa, improving manufacturing efficiency. The lead frame LF is made of a metal material mainly containing, for example, copper (Cu) and a thickness thereof is about in a range of 125 μm to 200 μm, for example.

Also, the periphery of each of the device forming parts LFa is surrounded by a frame part LFc as illustrated in FIG. 11. The frame part LFc is a supporting part, which supports members formed in the device forming parts LFa until the dicing process illustrated in FIG. 9.

Also, as illustrated in FIG. 11 and FIG. 12, the die pad DP and the plurality of leads LD, which are described with reference to FIG. 5 to FIG. 7 have been already formed in each of the device forming parts LFa. The die pad DP is coupled to the frame part LFc, which is arranged in the periphery of the device forming parts LFa through the suspension leads TL and is supported by the frame part LFc. Also, each of the plurality of leads LD is coupled to the frame part LFc and is supported by the frame part LFc.

In the example illustrated in FIG. 11, the lead LDs for a source, the die pad DP, the lead LDd for a drain integrally formed with the die pad DP are arranged in the order thereof in the Y direction, from one side to the opposite side of the device forming part LFa, which forms a quadrangle in a plan view. Furthermore, the lead LDg for a gate is arranged adjacent to the lead LDs in the X direction.

Moreover, the metal film CM1 made of nickel (Ni) or silver (Ag) is previous formed on the top surface CPt of the die pad DP. As described above, in order to make it possible to mount a plurality of types of semiconductor chips having different planar sizes (see FIG. 5), the metal film CM1 is formed so as to cover the majority of the top surface DPt of the die pad DP. In other words, in the present embodiment, the metal film CM1 is formed so as to straddle the part DP1 on which the semiconductor chip is not mounted and the part DP2 on which the semiconductor chip is to be mounted.

Also, the metal film CM2 made of, for example, silver is previously formed on the top surface RBt of the connection portion Rb2 of the lead LDg of a source from among the plurality of leads LD. On the other hand, copper alloy that is a base material is exposed without formation of the metal film CM2 in the top surface RBt of the connection portion RB1 of the lead LDs for a source from among the plurality of leads LD. Each of the metal films CM1 and CM2 can be formed by, for example, a plating method. Also, in the case of forming the metal films CM1 and CM2 by using the same material, the metal films CM1 and CM2 can be formed at a time.

Furthermore, an offset portion (bent portion, inclined portion, stepped portion) SL1 is formed in the lead LDs of the plurality of leads LD, the offset portion having been subjected to bending in advance and being provided such that a position of the connection portion RB1 is higher than a position of the terminal portion TN1. Furthermore, an offset portion (bent portion, inclined portion, stepped portion) SL1 is formed in the lead LDg of the plurality of leads LD, which is arranged adjacent to the lead LDs, the offset portion having been subjected to bending in advance and being provided such that a position of the connection portion RB2 is higher than a position of the terminal portion TN1. The offset portion SL1 can be formed by, for example, pressing.

Since other characteristics of the lead frame LF prepared in the present process are the same as described with reference to FIGS. 5 to 8, a redundant description thereof is omitted.

<First Member Arrangement>

Figure 13:
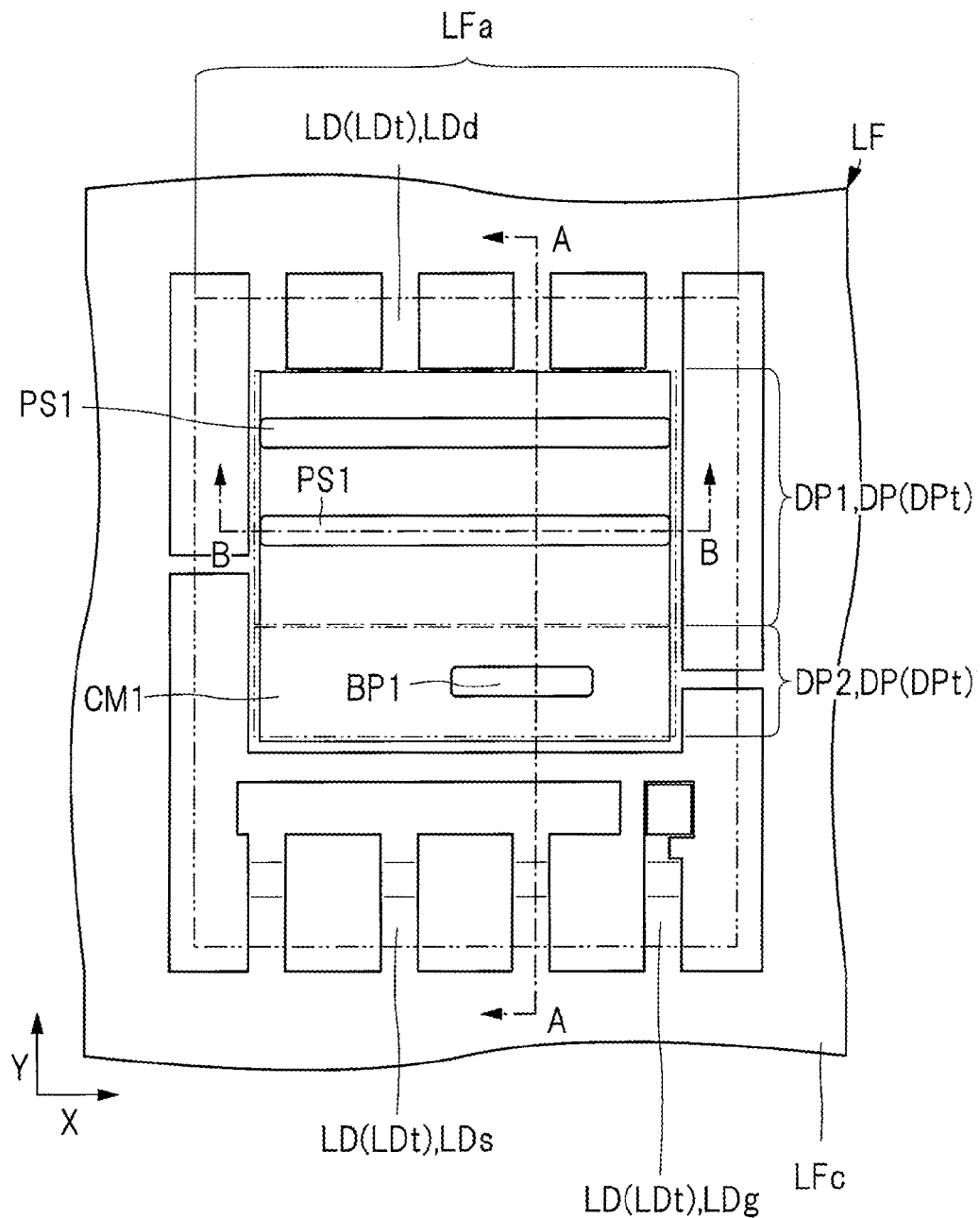
FIG. 13 is an enlarged plan view illustrating a state where silver paste is coated on a part of a die pad illustrated in FIG. 11.
Figure 14:
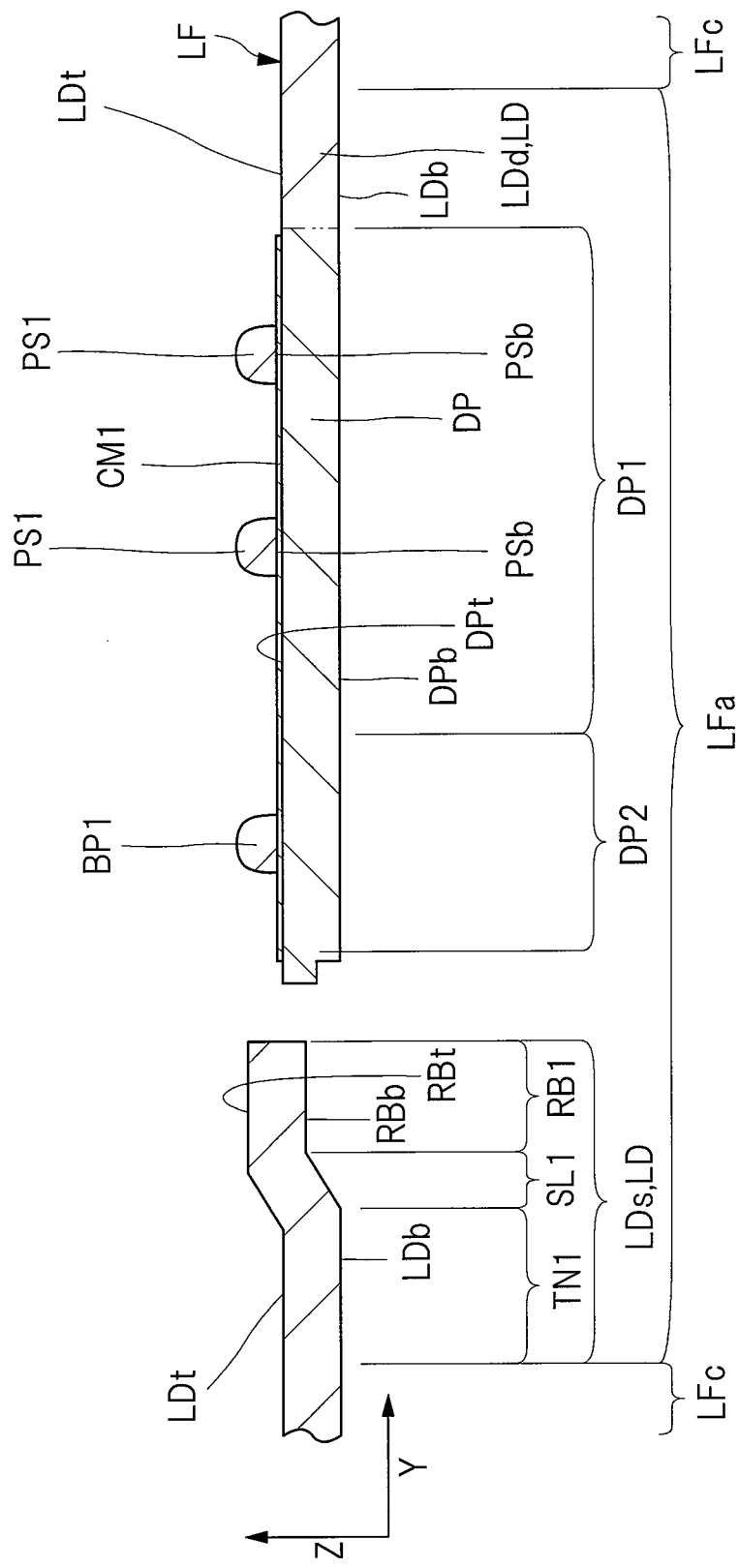
FIG. 14 is an enlarged cross-sectional view taken along the line A-A of FIG. 13.
Figure 15:
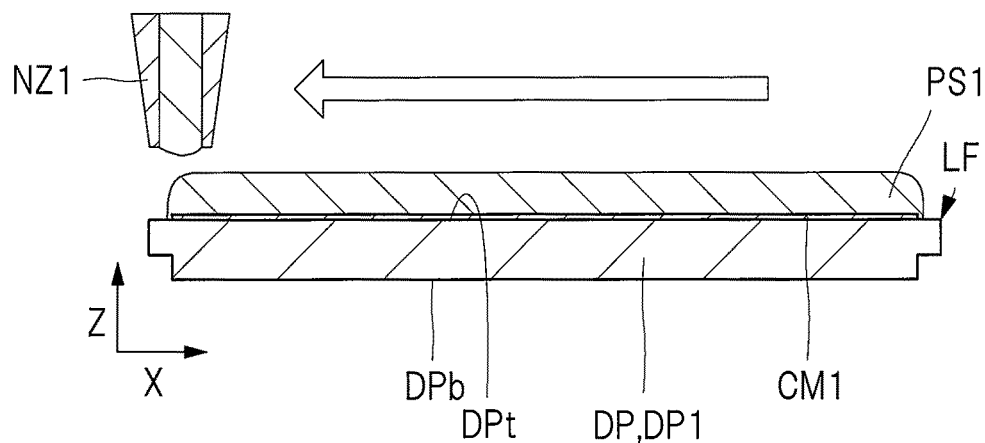
FIG. 15 is an explanatory diagram schematically illustrating a method of coating silver paste in an enlarged cross-section taken along the line B-B of FIG. 13.

Also, in the first member arrangement process illustrated in FIG. 9, as illustrated in FIGS. 13, 14, and 15, members PS1 are arranged in the part DP1 of the die pad DP. FIG. 13 is an enlarged plan view illustrating a state in which silver paste is coated on a part of the die pad illustrated in FIG. 11.

Figure 16:
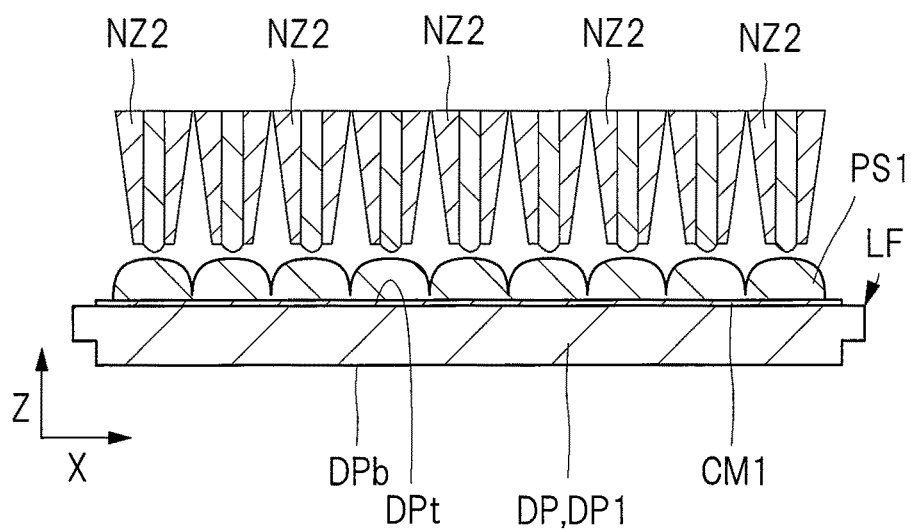
FIG. 16 is an explanatory diagram illustrating a modification example with respect to FIG. 15.
Figure 17:
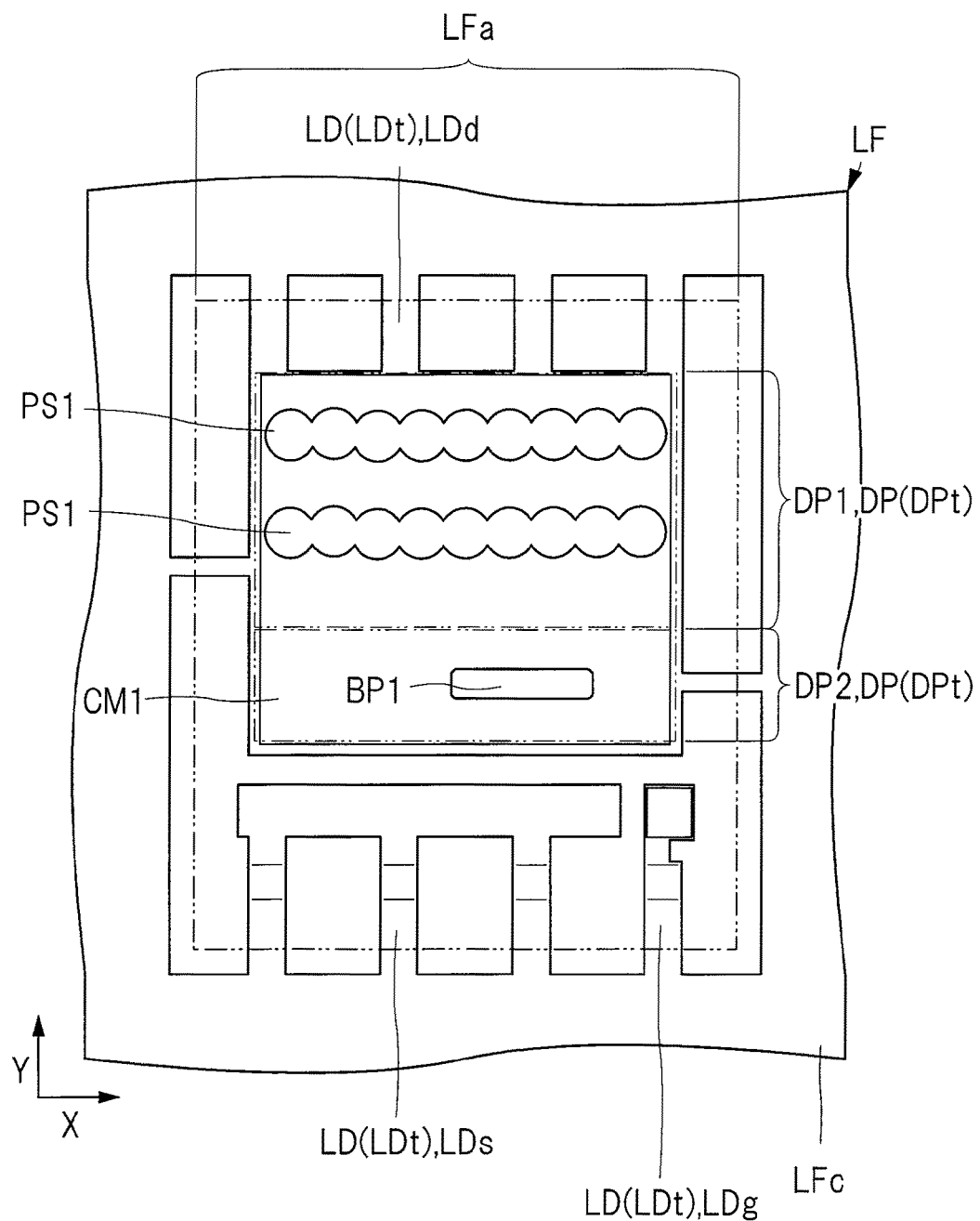
FIG. 17 is an enlarged plan view illustrating a planar shape of silver paste formed by the method illustrated in FIG. 16.

Also, FIG. 14 is an enlarged cross-sectional view taken along the line A-A of FIG. 13. Also, FIG. 15 is an explanatory diagram schematically illustrating a method of coating silver paste in an enlarged cross-section taken along the line B-B of FIG. 13. FIG. 16 is an explanatory diagram illustrating a modification example with respect to FIG. 15. FIG. 17 is an enlarged plan view illustrating a planar shape of silver paste formed by the method illustrated in FIG. 16.

In the present process, as illustrated in FIGS. 13 to 15, it is possible to apply various modification examples to the material of the member PS1 as long as it is possible to be tightly fixed onto the die pad DP1 (onto the metal film CM1 in FIGS. 11 to 15). In the present example of the embodiment, as the member PS1, a conductive resin adhesive material called silver (Ag) paste is used, which contains the same material as the die bond material BP1 for mounting the semiconductor chip, for example, a plurality of silver (Ag) particles. Since the silver paste has fluidity before resin components are cured, as illustrated in FIG. 15, when the members PS1 in a paste state are coated toward the top surface DPt of the die pad DP from a nozzle NZ1, the members PS1 are adhered to the part DP1 of the die pad DP (specifically, the metal film CM1 formed on the die pad DP). Also, as in the example illustrated in FIG. 15, the nozzle NZ1 is moved in the X direction while allowing the member PS1 made of silver paste to be charged. Therefore, as illustrated in FIGS. 13 and 15, it is possible to form the member PS1 extending in the X direction. Next, the method of coating the paste material by moving the nozzle NZ1 while allowing the paste material to be discharged as illustrated in FIG. 15 is referred to as a line drawing method.

As a modification example with respect to FIG. 15, as illustrated in FIG. 16, the members PS1 can be formed in a such a way to prepare a nozzle NZ2 having a plurality of discharge ports and discharge paste-like members PS1 from the plurality of discharge ports at a time. Hereinafter, as illustrated in FIG. 16, a method of discharging and coating a paste material from a plurality of discharge ports is referred to as a multi-point coating method.

In the case of coating the members PS1 by the line drawing method as illustrated in FIG. 15, it is possible to prevent the members PS1 from being parted in the X direction of the members PS1. In order to reduce a stress occurring in an interface between the part DP1 and the part DP2 of the die pad DP illustrated in FIG. 13, the members PS1 are members provided to disperse the stress. When a part of the member PS1 extending in the X direction is pared at the middle thereof, the stress is transferred through the parted positions of the member PS1, so that the stress occurring in the interface between the part DP1 and the part DP2 of the die pad DP increases. Therefore, it is preferable that the member PS1 is not parted in the X direction in terms of suppression of transfer to the interface between the part DP1 and the part DP2 of the die pad DP. That is, the line drawing method illustrated in FIG. 15 is preferable in terms of reducing a stress occurring in the interface between the part DP1 and the part DP2 of the die pad DP.

On the other hand, since a time to move the nozzle N2 is not required in the case of the multi-point coating method illustrated in FIG. 16, it is possible to reduce a coating time. Therefore, the multi-point coating method illustrated in FIG. 16 is preferable in terms of effective manufacturing. However, in the case of the multi-point coating method, the member PS1 is coated in a plurality of places on the die pad DP at a time. Therefore, it is preferable to increase a coating amount compared to the aforementioned line drawing method so as to allow adjacent members PS1 to certainly contact each other. In other words, the line drawing method illustrated in FIG. 15 is preferable in terms of reducing the use amount of silver paste required for formation of the member PS1.

In addition, in the case of forming the member PS1 by the line drawing method illustrated in FIG. 15, spreading of the member PS1 is made uniform in the Y direction perpendicular to a coating direction (X direction) as illustrated in FIG. 13. On the other hand, in the case of forming the member PS1 by the multi-point coating method illustrated in FIG. 16, as illustrated in FIG. 17, spreading of the member PS1 in the Y direction perpendicular to the coating method (X direction) is made to have a shape in which a large portion and a small portion are alternately repeated.

On the other hand, as described above, in the present embodiment, the member PS1 is made of the same material as the die bond material BPI. Therefore, in the present process, as preparation of the semiconductor chip mounting process illustrated in FIG. 9, it is possible to coat the die bond material BP1 in the part DP2 that is a chip mounting region of the die pad DP as illustrated in FIG. 13 or FIG. 17.

As a coating method of the die bond material BPI, it is possible to apply the line drawing method as described with reference to FIG. 15 or the multi-point coating method as described with reference to FIG. 16. However, in a case where a thickness of a semiconductor chip is thin, the line drawing method capable of reducing the coating amount of the die bond material BP1 is preferable in terms of preventing the die bond material BP1 from flowing around the front surface of the semiconductor chip and short-circuiting. Also, in the case of forming the die bond material BP1 and the member PS1 by the line drawing method, it is possible to supply the member PS1 and the die bond material BP1 from the nozzle NZ1 illustrated in FIG. 15. That is, it is possible to make a manufacturing apparatus simple by allowing a supply device of the member PS1 and a supply device of the die bond material BP1 to be in a combined use state. 088 Also, the supply order of the member PS1 and the die bond material BP1 is not limited particularly but it is preferable to first form the member PS1 in terms of suppressing drying of the die bond material BP1. In the case of forming the member PS1 by the line drawing method, the coating time become longer compared to the multi-point coating method. Therefore, it is preferable to coat the die bond material BP1 immediately before the semiconductor chip mounting process in terms of suppressing drying of the die bond material BP1 which makes spreading thereof difficult in the semiconductor chip mounting process illustrated in FIG. 9.

Although the description is given with respect to an embodiment of performing the first member arrangement process before the semiconductor chip mounting process in terms of making manufacturing processes efficient in the present embodiment, it is possible to perform the first member arrangement process after the semiconductor chip mounting process as a modification example.

<Semiconductor Chip Mounting Process>

Figure 18:
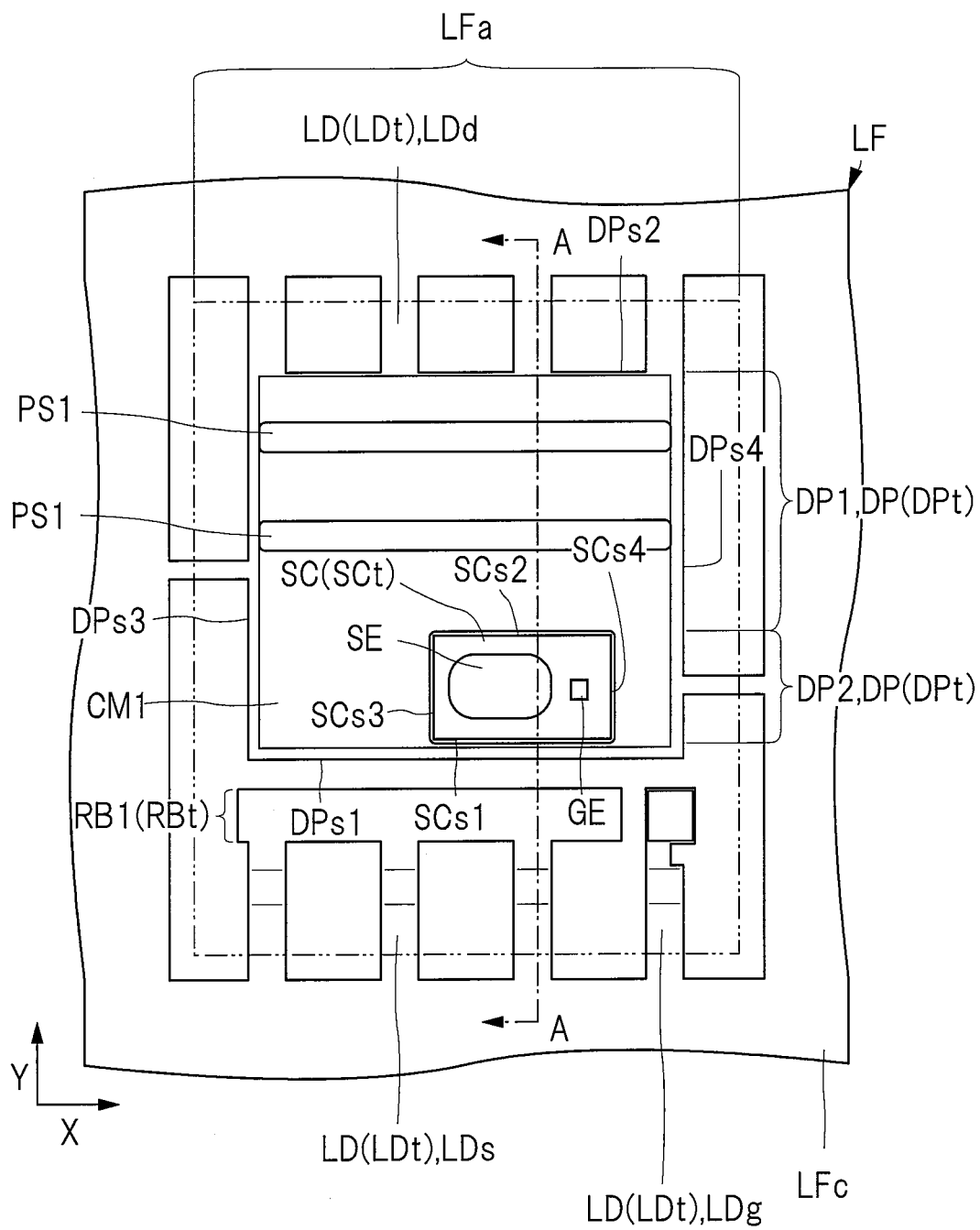
FIG. 18 is an enlarged plan view illustrating a state in which a semiconductor chip is mounted on a die pad illustrated in FIG. 13.
Figure 19:
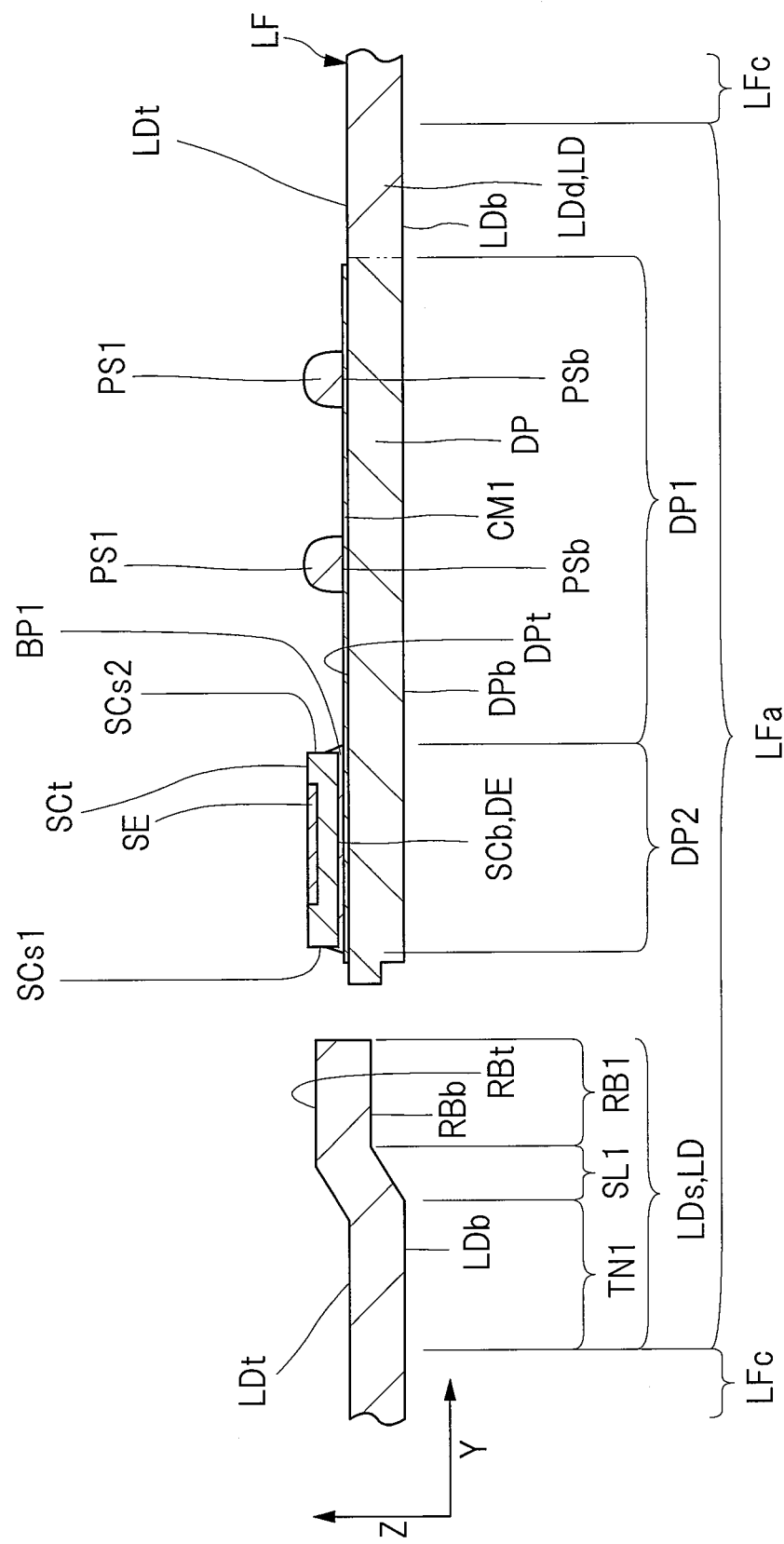
FIG. 19 is an enlarged cross-sectional view taken along the line A-A of FIG. 18.

Next, in the semiconductor chip mounting process illustrated in FIG. 9, as illustrated in FIG. 18 and FIG. 19, a semiconductor chip SC is mounted on a die pad DP of a lead frame LF. FIG. 18 is an enlarged plan view illustrating a state in which the semiconductor chip is mounted on the die pad illustrated in FIG. 13. Also, FIG. 19 is an enlarged cross-sectional view taken along the line A-A of FIG. 18.

In the present process, the semiconductor chip SC is mounted on a part DP2 of the die pad DP, which is integrally formed with a lead LDd that is a drain terminal, through die pad material BP1. In the example illustrated in FIG. 18, the semiconductor chip SC is arranged such that a side surface SCs1 of four side surfaces of the semiconductor chip SC is arranged along a side surface DPs1 of the die pad DP. In other words, the semiconductor chip SC is arranged on the die pad DP such that the side surface SCs1 faces a tip (end on the side of a connection portion RB1) of a lead LDs of a source. Also, as illustrated in FIG. 19, the semiconductor chip SC is adhesively fixed through the die bond material BP1 such that a rear surface SCb in which a drain electrode DE is formed faces a top surface DPt that is a chip mounting surface of the die pad DP. Thereby, a source electrode pad SE and a gate electrode pad GE of the semiconductor chip SC are exposed as illustrated in FIG. 18. On the other hand, as illustrated in FIG. 19, the drain electrode DE of the semiconductor chip SC is electrically connected to the die pad DP through the die bond material BP1 which is a conductive adhesive material and a metal film CM1.

Also, in the present process, the semiconductor chip SC is arranged close to the lead LDs on the top surface DPt of the die pad DP such that a distance between the semiconductor chip SC and a connection portion RB1 of the lead LDs that is a source terminal decreases. Therefore, a distance from the side surface SCs2 of the semiconductor chip SC to a side surface DPs2 on the side of a part DP1 of the die pad DP increases, compared to the case of mounting the semiconductor chip SC on a central portion of the die pad DP.

Also, the die bond material BP1 is a resin adhesive material obtained by mixing a plurality of conductive particles (for example, silver particles) in a resin material containing thermosetting resin, such as epoxy resin or the like, and the property thereof before curing exhibits a paste state. Therefore, as described above, after the paste-like die bond material BP1 has been previously coated on the part DP2 of the die pad DP, the semiconductor chip SC is pressed toward the top surface DPt of the die pad DP. Thereby, it is possible to spread the die bond material BP1 between the semiconductor chip SC and the top surface DPt of the die pad dP.

Next, in the present process, after the semiconductor chip is mounted on the die pad DP, the die bond material BP1 and the member PS1 are cured at a time (curing process). Since the die bond material BP1 and the member PS1 respectively contain thermosetting resin as described above, thermosetting resin components are cured by performing heat treatment (baking treatment). By the present process, the semiconductor chip SC is adhesively fixed to the part DP2 of the die pad DP. Also, the member PS1 is adhesively fixed to the part DP1 of the die pad DP.

According to the present embodiment, it is possible to cure the die bond material BP1 and the member PS1 at one time, by configuring the die bond material BP1 and the member PS1 using the same material and arranging the member PS1 before the semiconductor chip mounting process.

<Ribbon Bonding Process>

Figure 20:
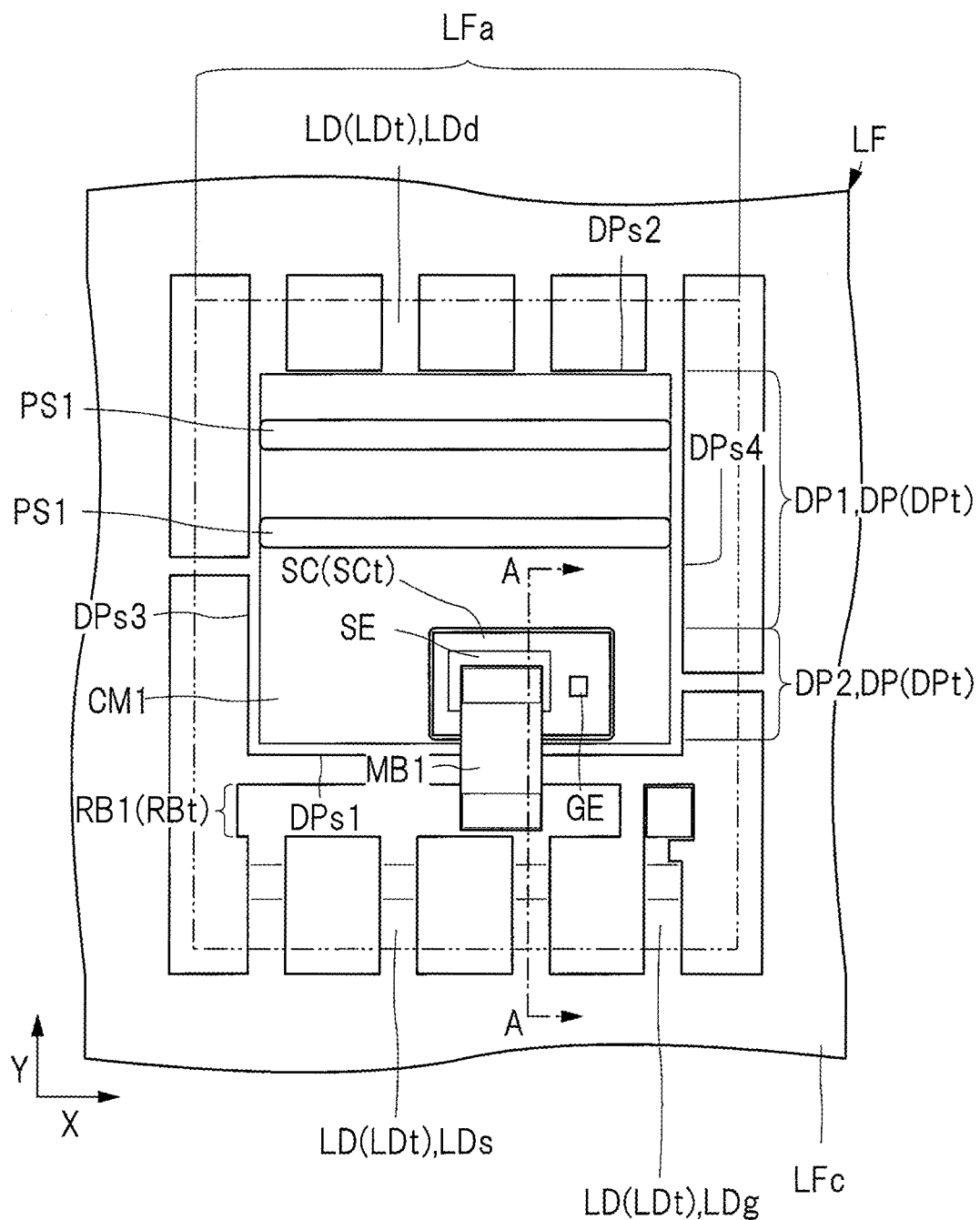
FIG. 20 is an enlarged plan view illustrating a state in which a semiconductor chip and a lead illustrated in FIG. 18 are electrically connected through a metal ribbon.
Figure 21:
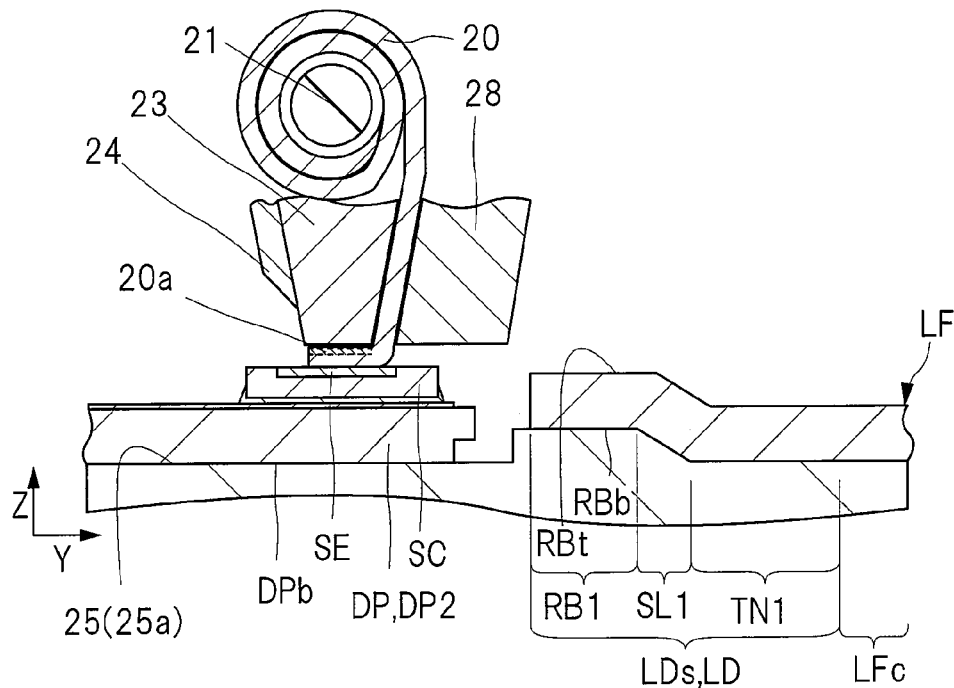
FIG. 21 is an enlarged cross-sectional view illustrating a metal ribbon connection state in a cross-section taken along the line A-A of FIG. 20.

In the ribbon bonding process illustrated in FIG. 9, as illustrated in FIG. 20 and FIG. 21, the source electrode pad SE of the semiconductor chip SC and the top surface RBt of the connection portion RB1 of the lead LDs that is a source terminal are electrically connected through a metal ribbon MB1. FIG. 20 is an enlarged plan view illustrating a state in which the semiconductor chip and the lead illustrated in FIG. 18 are electrically connected through a metal ribbon. In addition, FIG. 21 and FIG. 22 are enlarged cross-sectional views illustrating metal ribbon connection states in a stepwise manner in a cross-section taken along the line A-A of FIG. 20.

Figure 22:
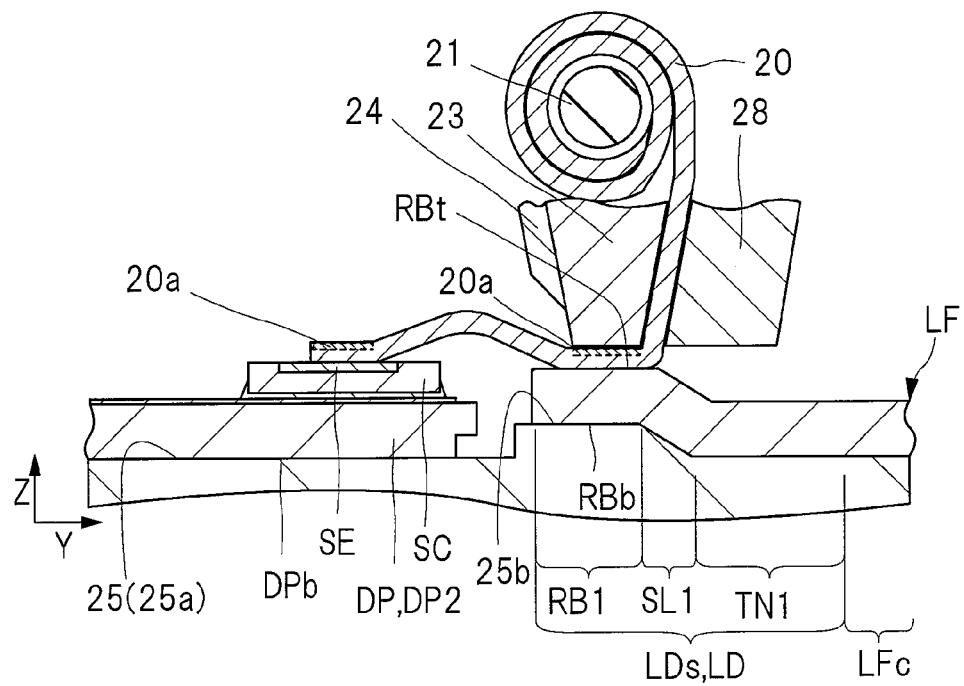
FIG. 22 is an enlarged cross-sectional view illustrating a stage continuing from the stage illustrated in FIG. 21 in a cross-section taken along the line A-A of FIG. 20.

In the present process, as illustrated in FIG. 21 and FIG. 22, ribbon bonding is performed by using a ribbon connection apparatus a bonding tool 23 which joins the metal strip 20 to a joint target member, a cutting blade 24 which cuts the metal strip after joint, and a ribbon guide 28 which sandwiches the metal strip 20 in a gap with the bonding tool 23 and controls a feeding direction of the metal strip 20. First, as illustrated in FIG. 21, one end of the metal strip 20 (one end of the metal ribbon MB1 illustrated in FIG. 20) is joined to the source electrode pad SE of the semiconductor chip SC. In the present process, by pressing the metal strip 20 fed from a gap between the bonding tool 23 and the ribbon guide 28 onto the source electrode pad SE, a shape of the metal strip 20 is changed according to the bonding tool 23. Also, by applying ultrasonic waves to the bonding tool 23, it is possible to form a metal bond in a contact interface between the metal strip 20 and the source electrode pad SE and electrically connect the metal strip 20 and the source electrode pad SE. At this time, an indentation 20a is formed in a surface of the metal strip 20 to be pressed.

Also, the bottom surface DPb positioned opposite to the chip mounting surface of the die pad is adhered to a tab holding surface 25a of a support base 25 and is held by the support base 25. By performing bonding in a state in which the source electrode pad SE that is a joint target part is supported by the support base 25, the ultrasonic waves applied to the bonding tool 23 are efficiently transferred to a joint surface of the metal strip 20. As a result, it is possible to improve joint strength between the metal strip 20 and the source electrode pad SE. It is preferable that the support base 25 uses, for example, a metallic table (metal table) such that the ultrasonic waves applied to the bonding tool 23 are intensively transferred to the joint interface.

Next, in a state in which the feeding direction of the metal strip 20 is controlled by the bonding tool 23 and the ribbon guide 28, the bonding tool 23 is moved while the metal strip 20 is being sequentially fed from a reel 21 which holds the metal strip 20, and as illustrated in FIG. 22, the other end of the metal strip 20 is joined to the top surface RBt of the connection portion RB1 of the lead LDs. At this time, by pressing the metal strip 20 onto the top surface RBt that is a ribbon connection surface of the lead LDs, the metal strip 20 is changed according to the bonding tool 23 so as to be adhered to the top surface RBt of the connection portion RB1 of the lead LDs. Also, by applying ultrasonic waves to the bonding tool 23, it is possible to form a metal bond in a contact interface between the metal strip 20 and the top surface RBt of the connection portion RB1 and electrically connect the metal strip 20 and the top surface RBt of the connection portion RB1.

Furthermore, the bottom surface RBb positioned opposite to (directly under) the top surface RBt of the connection portion RB1 is adhered to a ribbon connection portion holding surface 25b of the support base 25 and is held by the support base 25. In the example illustrated in FIG. 2, since the offset portion SL1 is provided in the lead LDs, a protrusion is provided in a part of the support base 5, and a top surface of the protrusion is the ribbon connection portion holding surface 25b. By performing bonding in a state in which the bottom surface RBb of the connection portion RB1 that is a joint target is supported by the ribbon connection portion holding surface 25b of the support base 25, the ultrasonic waves applied to the bonding tool 23 are efficiently transferred to a joint surface of the metal strip 20. As a result, it is possible to improve joint strength between the metal strip 20 and the connection portion RB1.

Although not illustrated, the bonding tool 23 and the ribbon guide 28 are further moved in a direction away from the semiconductor chip SC along the Y direction. In addition, the metal strip 20 is cut by pressing the cutting blade 24 illustrated in FIG. 22 toward the metal strip 20. Thereby, the metal ribbon MB1 (see FIG. 20) is formed by being separated from the metal strip 20, the metal ribbon MB1 electrically connecting the source electrode pad SE of the semiconductor chip SC with the connection portion RB1 of the lead LDs for a source. In this case, it is preferable that the cutting position by the cutting blade 24 is arranged on the top surface RBt of the connection portion RB1. The metal strip 20 can be stably cut when the metal strip 20 is cut in a state in which the metal strip 20 is sandwiched between the cutting blade 24 and the top surface Rbt.

By the aforementioned process, as illustrated in FIG. 20, the source electrode pad SE of the semiconductor chip SC and the top surface RBt of the connection portion RB1 of the lead LDs are electrically connected through the metal ribbon MB1.

<Wire Bonding Process>

Figure 23:
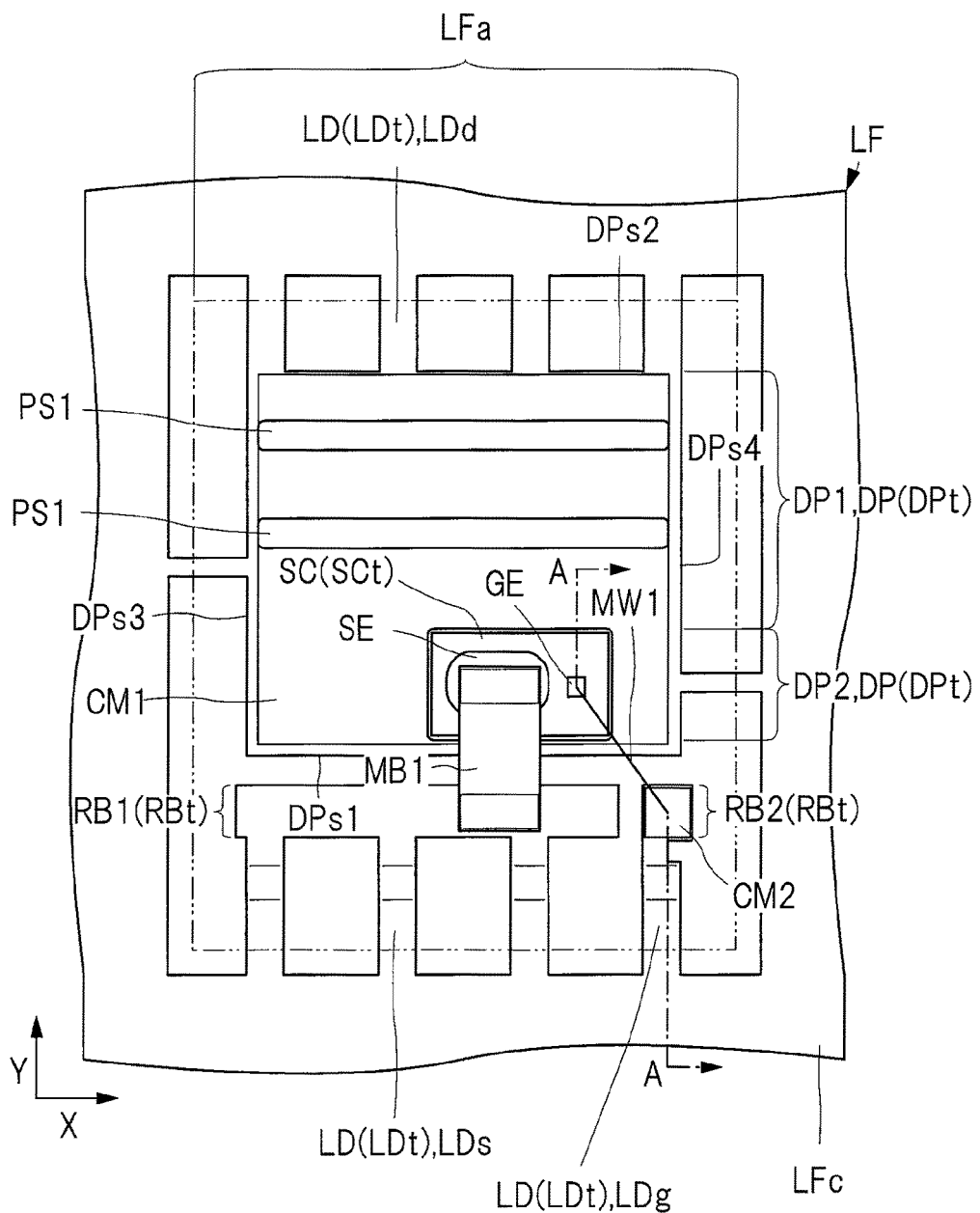
FIG. 23 is an enlarged plan view illustrating a state in which a semiconductor chip illustrated in FIG. 20 and a gate lead are electrically connected through a metal wire.
Figure 24:
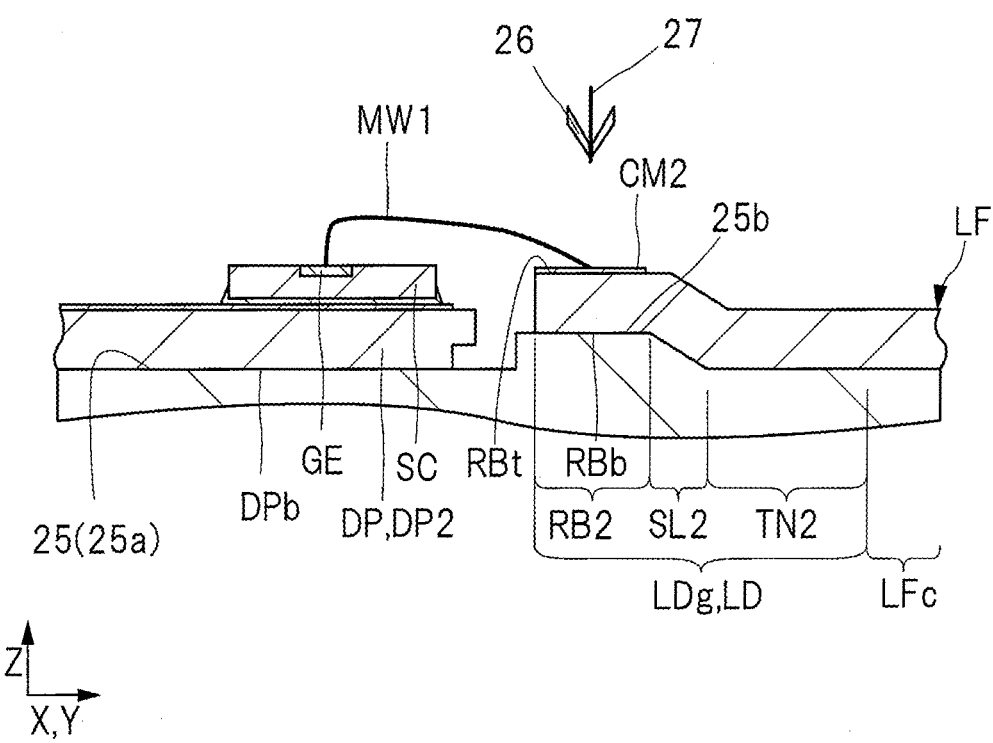
FIG. 24 is an enlarged cross-sectional view illustrating a wire connection state in a cross-section taken along the line A-A of FIG. 23.

In the wire bonding process illustrated in FIG. 9, as illustrated in FIG. 23 and FIG. 24, the gate electrode pad GE of the semiconductor chip SC and the top surface RBt of the connection portion RB2 of the lead LDg for a gate are electrically connected through a wire (metal wire) MW1.

FIG. 23 is an enlarged plan view illustrating a state in which the semiconductor chip and the lead for a gate illustrated in FIG. 20 are electrically connected through a metal wire. Also, FIG. 24 is an enlarged cross-sectional view illustrating a wire connection state in a cross-section taken along the line A-A of FIG. 23.

As illustrated in FIG. 24, in the present process, a part of the wire MW1 is joined to a joint target part through metal bonding by applying ultrasonic waves to a bonding tool 26. For example, in the example illustrated in FIG. 24, first, one end of the wire made of, for example, gold (Au) is joined to a metal film (for example, aluminum film or gold film) formed on the outermost surface of the gate electrode pad GE. At this time, a metal bond is formed in a joint interface by applying ultrasonic waves to the bonding tool 26.

Next, the bonding tool 26 is moved onto the connection portion RB2 of the lead LDg while a wire 27 is being fed from the bonding tool 26. The metal film CM2 capable of improving connection strength between the wire MW1 and the base material (for example, copper) of the lead LDg is formed on the top surface RBt of the connection portion RB2 of the lead LDg. The base material of the lead LDg is made of, for example, copper (Cu) alloy and the metal film CM2 is made of, for example, silver (Ag). In addition, by applying ultrasonic waves to the bonding tool 26, a metal bond is formed in a joint interface between a part of the wire 27 (second bond part) and the metal film CM2 and electrical connection therebetween is made. Next, in the case of cutting the wire 27, the wire MW1 illustrated in FIG. 23 or FIG. 24 is formed.

In the present process, it is preferable to apply ultrasonic waves to the bonding tool 26 in a state in which the joint target part is supported by the support base 25 in terms of efficiently transferring ultrasonic waves to the joint target part and improve joint strength.

Also, it is preferable to perform the wire bonding process illustrated in FIG. 9 after the ribbon bonding process. In the ribbon bonding process, in the case of connecting the semiconductor chip SC and the source electrode pad SE as described above, connection is made by applying ultrasonic waves. At this time, when the wire MW1 and the gate electrode pad GE are previously connected, there is a possibility that the wire MW1 or a connection portion of the wire MW1 is damaged due to the effects of ultrasonic waves at the time of the ribbon bonding. Therefore, it is preferable to perform the wire bonding process of connecting the wire MW1 having a narrower width than the metal ribbon MB1 after the ribbon bonding process.

<Sealing Process>

Figure 25:
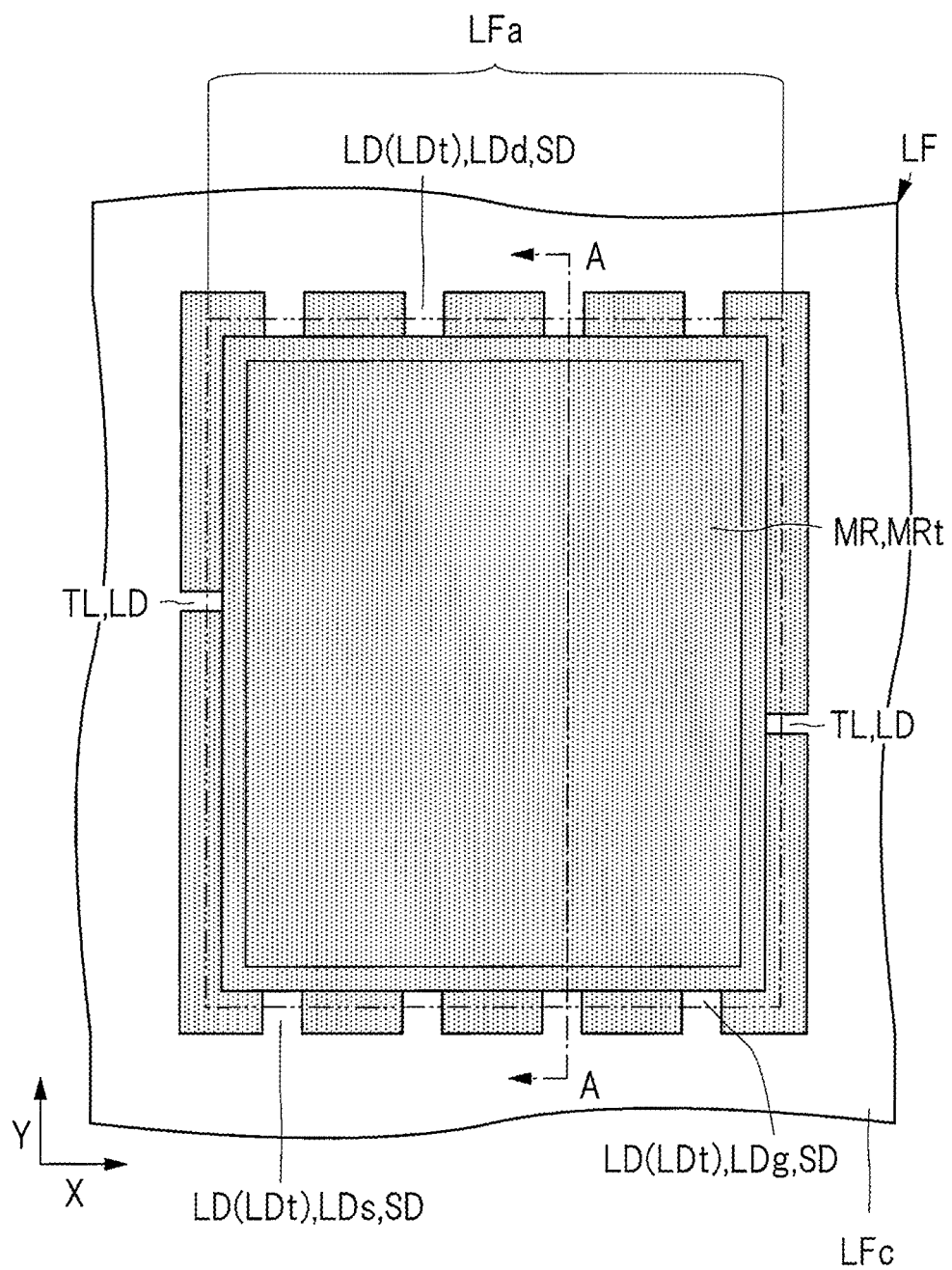
FIG. 25 is an enlarged plan view illustrating a state in which a sealing body, which seals a semiconductor chip illustrated in FIG. 23 and a metal ribbon, is formed.

Next, in the sealing process illustrated in FIG. 9, as illustrated in FIG. 23, the semiconductor chip SC, a part of the die pad DP, a part of the plurality of leads LD, the metal ribbon MB1, and the wire MW1 are sealed by insulating resin, forming the sealing body MR illustrated in FIG. 25. FIG. 25 is an enlarged plan view illustrating a state in which a sealing body, which seals the semiconductor chip and the metal ribbon illustrated in FIG. 23, is formed. Also, FIG. 26 is an enlarged cross-sectional view illustrating a state in which a lead frame is arranged inside a forming mold in a cross-section taken along the line A-A of FIG. 25.

Figure 26:
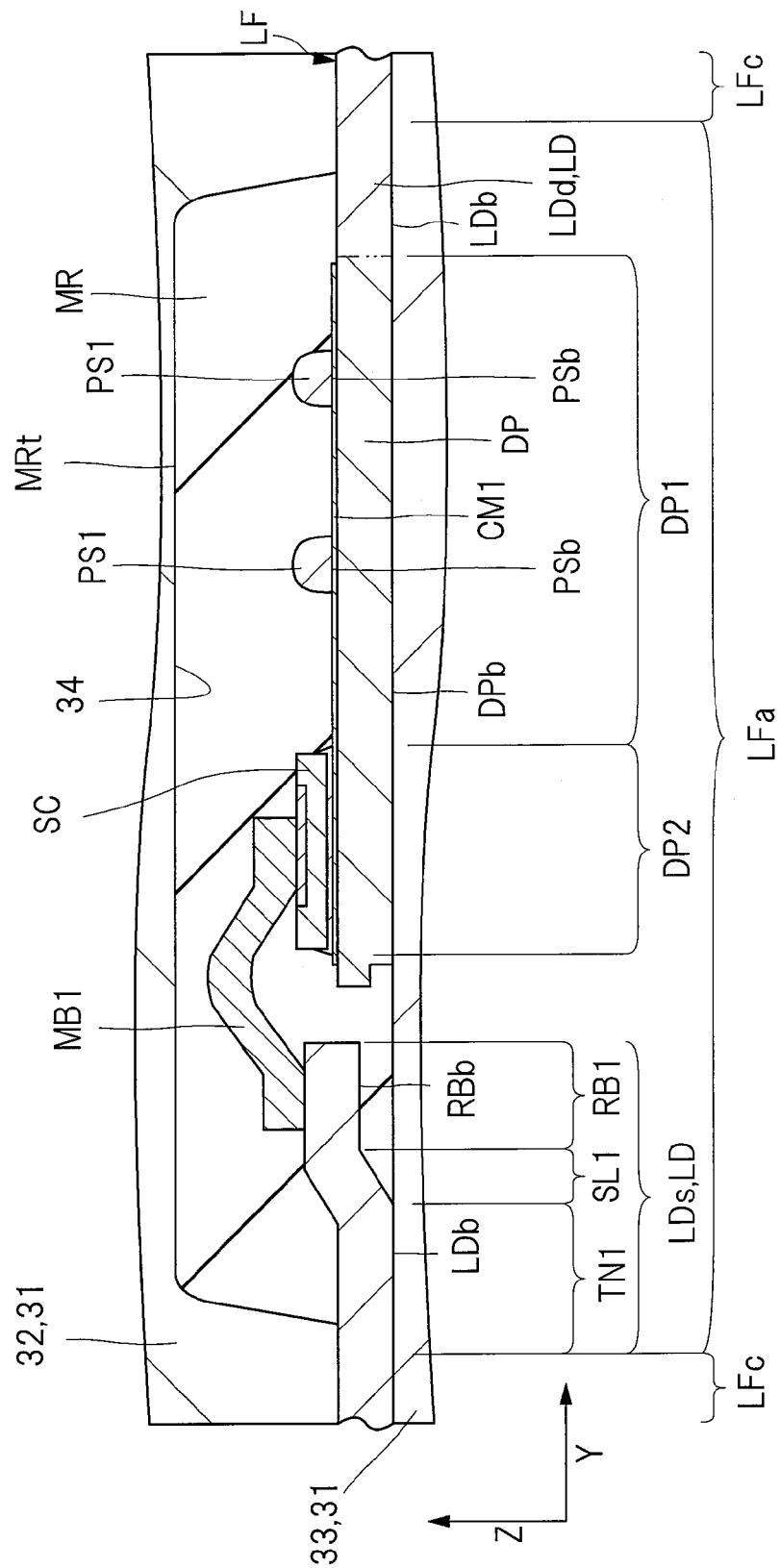
FIG. 26 is an enlarged cross-sectional view illustrating a state in which a lead frame is arranged inside a forming mold in a cross-section taken along the line A-A of FIG. 25.

In the present process, for example, as illustrated in FIG. 26, the sealing body MR is formed by a so-called transfer mold method by using a forming mold 31 provided with an upper mold (first mold) 32 and a lower mold (second mold) 33.

In the example illustrated in FIG. 26, the lead frame LF is arranged such that the die pad DP of the device forming part LFa and the plurality of leads LD arranged adjacent to the die pad DP are positioned in a cavity 34 formed in the upper mold 32, and is clamped (sandwiched) by the upper mold 32 and the lower mold 33. In this state, when a softened (plasticized) thermosetting resin (insulating resin) is press-fitted in the cavity 34 of the forming mold 31, the insulating resin is supplied into a space formed by the cavity 34 and the lower mold 33 and is molded along the shape of the cavity 34.

At this time, when the bottom surfaces DPb of the die pad DP and the bottom surface LDb of the terminal portion TN1 of the lead LD are caused to adhere to the lower mold 33, the bottom surfaces DPb and LDb are exposed from the sealing body MR in the bottom surface MRb of the sealing body MR. On the other hand, the bottom surface RBb of the connection portion RB1 of the lead LDs is not caused to adhere to the lower mold 33. Therefore, the connection portion RB1 is covered with the insulating resin and is sealed by the sealing body MR. Also, a stepped portion is formed in the peripheral portion of the die pad DP and the bottom surface of the peripheral portion of the die pad DP is sealed by resin. Therefore, since parts of the die pad DP and the lead LD are sealed with the sealing body MR, they are difficult to fall off the sealing body MR.

Also, the sealing body MR is mainly made of insulating resin. However, for example, the function (for example, resistance against warping deformation) of the sealing body MR can be improved by mixing filler particles such as silica (silicon dioxide: $SiO_2$) particles in the thermosetting resin.

<Plating Process>

Figure 27:
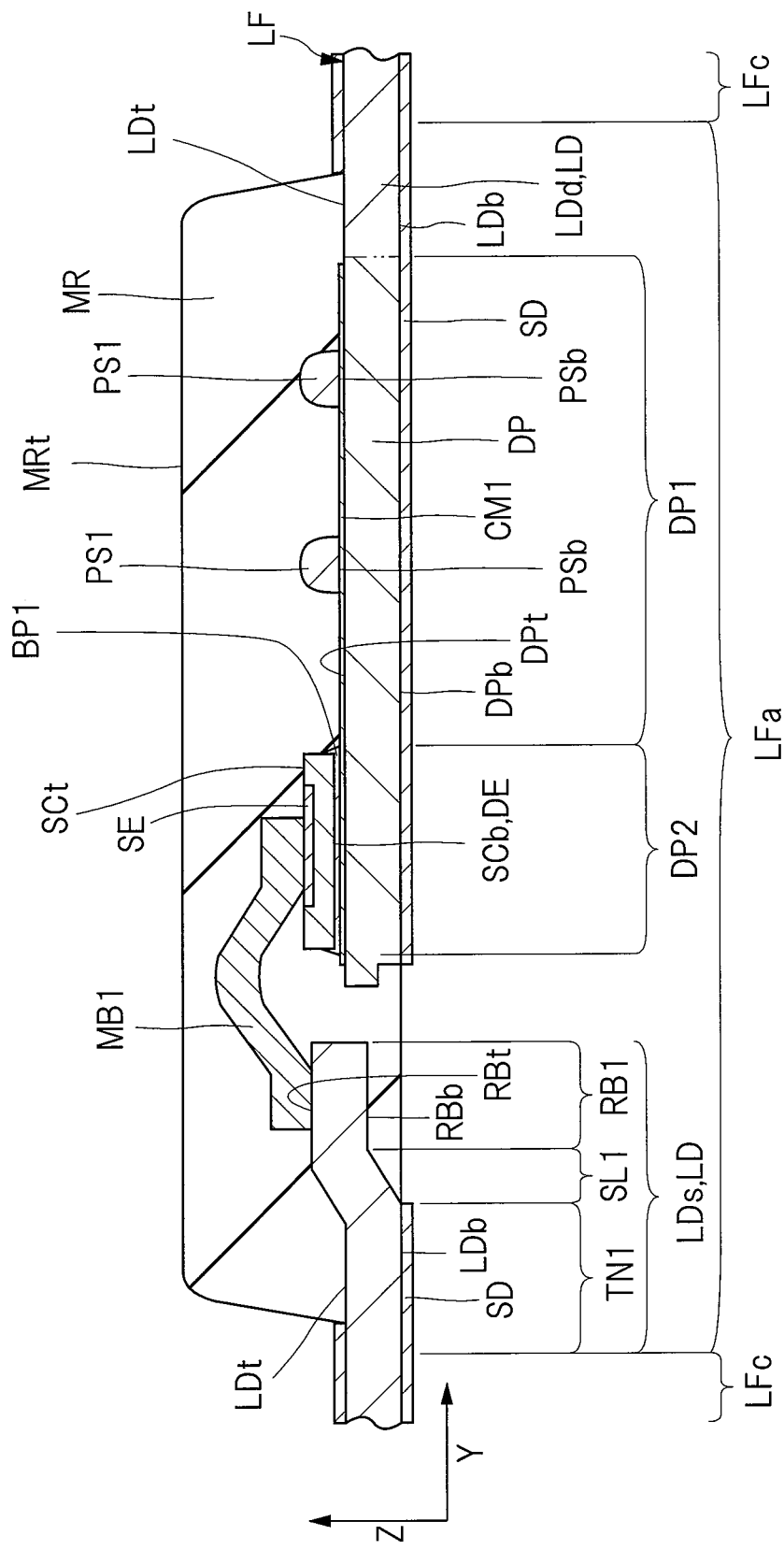
FIG. 27 is an enlarged cross-sectional view illustrating a state in which a metal film is formed on a die pad illustrated in FIG. 26 and a surface of a lead exposed from a sealing body.

Then, in a plating process shown in FIG. 9, as illustrated in FIG. 27, the lead frame LF is immersed in a plating solution (not illustrated) to form the metal film SD on the surfaces of metal parts exposed from the sealing body MR. FIG. 27 is an enlarged cross-sectional view illustrating a state in which a metal film is formed on the die pad illustrated in FIG. 26 and on a surface exposed from the sealing body.

In the example illustrated in FIG. 27, for example, the lead frame LF is immersed in a solder solution so that the metal film SD, which is a solder film, is formed by an electrical plating method. The metal film SD has a function to improve the wettability of connection material made of, for example solder, when a completed semiconductor device PK1 (see FIG. 6) is packaged in a packaging substrate (not illustrated). Examples of the type of the metal film SD include tin-lead plating, pure-tin plating that is Pb-free plating, and tin-bismuth plating.

A lead frame of preliminary plating in which a conductor film is formed on the lead frame in advance may be used. In this case, the conductor film is often formed by, for example, a nickel film, a palladium film formed on the nickel film, and a gold film formed on the palladium film. When the lead frame of preliminary plating is used, the present plating process is omitted. When the lead frame of preliminary plating is used, metal bond characteristics with the metal ribbon MB1 are preferable even in the case of not exposing copper (Cu) or copper alloy. Therefore, even in the case in which the lead frame of preliminary plating is used, a film of preliminary plating is formed on the whole lead frame including the joint region of the metal ribbon MB1.

<Dicing Process>

Figure 28:
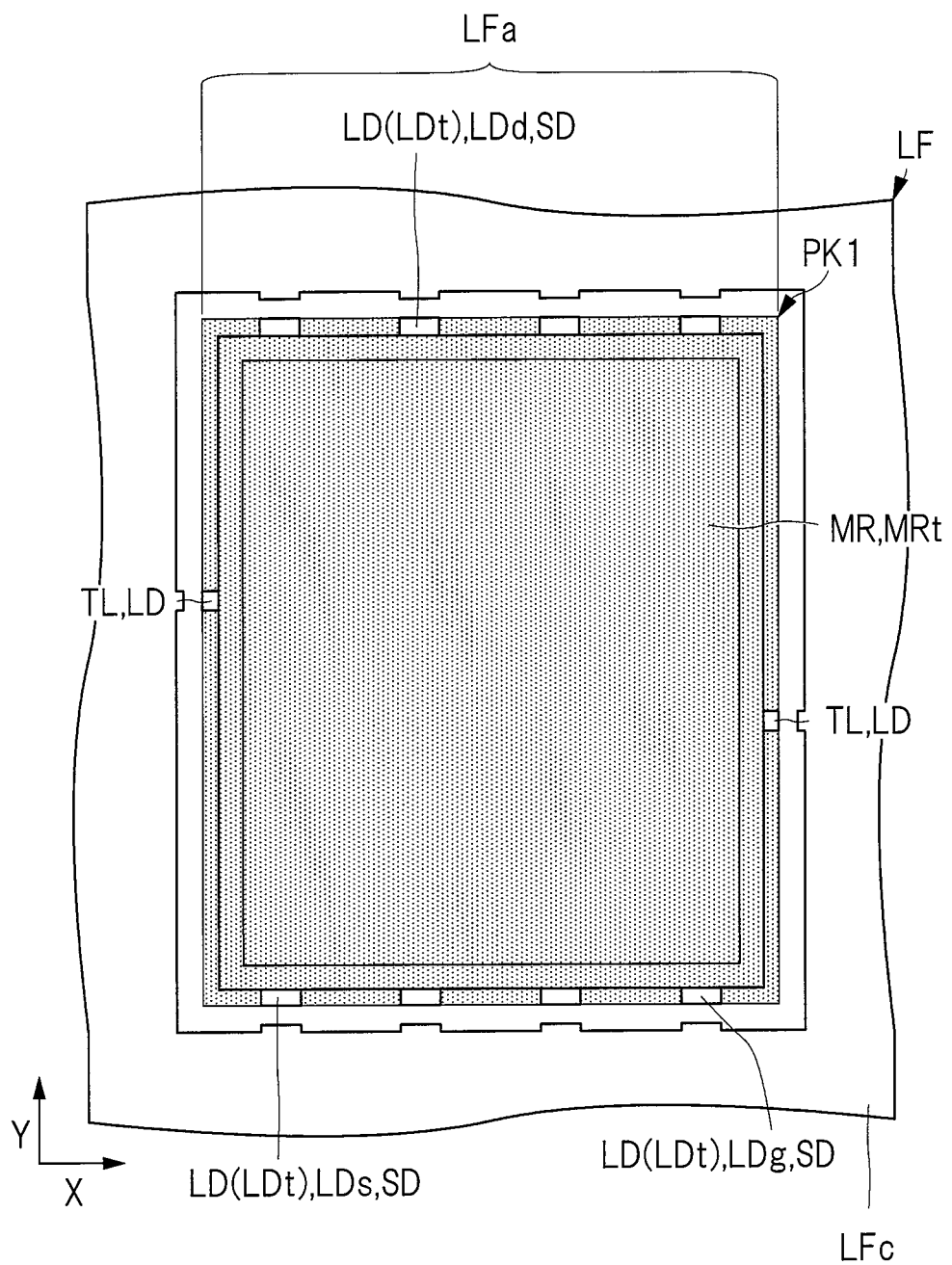
FIG. 28 is an enlarged plan view illustrating a state in which a lead frame illustrated in FIG. 27 is divided into individual pieces.

Next, in a dicing process illustrated in FIG. 9, as illustrated in FIG. 28, the lead frame LF is divided into device forming parts LFa. FIG. 28 is an enlarged plan view illustrating a state in which the lead frame illustrated in FIG. 27 is divided into individual pieces.

In this process, as illustrated in FIG. 28, a part of the lead LD is cut, and the lead LD is separated from a frame part LFc. Also, in this process, some of a plurality of suspension leads TL which support the die pad DP are cut, and the die pad DP is separated from the frame part LFc. A cutting method is not particularly limited, and it is possible to perform cutting by press machining or cut machining using a rotary blade.

By the aforementioned processes, the semiconductor device PK1 described with reference to FIGS. 1 to 7 can be obtained. Thereafter, necessary inspection and testing, such as visual inspection, electrical testing and the like, are performed and shipment is made, or packaging in a packing substrate (not illustrated) is performed.

<Modification Example>

Subsequently, various modification examples of the embodiments described above will be described.

First, embodiments using, as a member PS1, silver paste that is the same material as the die bond material BP1 have been described in the aforementioned embodiments. However, the following material can be used as the member PS1 in terms of suppressing damage to an adhesion interface between the semiconductor chip SC and the die pad DP.

Figure 29:
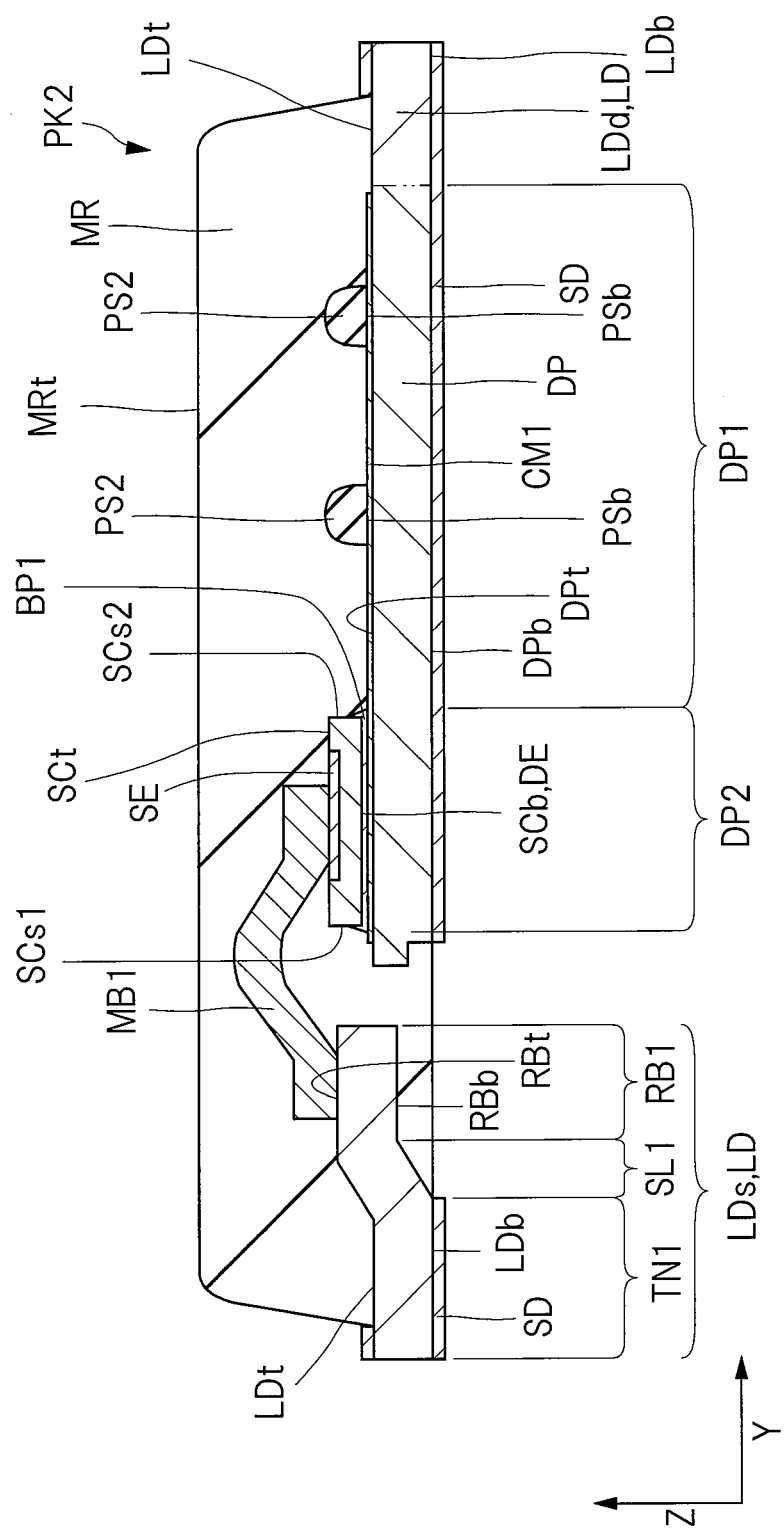
FIG. 29 is a cross-sectional view illustrating a modification example with respect to FIG. 6.

For example, the semiconductor device PK2 illustrated in FIG. 29 uses non-conductive resin adhesive material in which metal particles, such as silver particles, are not mixed, as the member PS2 mounted on the part DP1 of the die pad, instead of the member PS1 illustrated in FIG. 6. FIG. 29 is a cross-sectional view illustrating a modification example with respect to FIG. 6.

When the non-conductive member (first member) PS2 is adhesively fixed to the part DP1 of the die pad DP, the member PS2 and the die pad DP are electrically separated from each other. Also, the member PS2 is not electrically connected to terminals (leads LD) other than the die pad DP, like the member PS1 described in the above embodiment. That is, the member PS2 is electrically separated from the other members which the semiconductor device PK2 has. Therefore, it is possible to reduce noise components with respect to circuits which the semiconductor device PK2 has.

Also, the manufacturing processes of the semiconductor device PK2 is different from the first member arrangement process described above in that, in the aforementioned first member arrangement process, a nozzle that supplies the paste-like member PS2 and a nozzle that supplies the paste-like die bond material BP1 cannot be in a combined use state, and supply is made through separate nozzles. However, it is possible to allow the curing process described in the semiconductor chip mounting process be in a combined use state. That is, it is possible to cure the die bond material BP1 and the member PS2 at one time by performing heating treatment (baking treatment) since the die bond material BP1 and the member PS1 both contain the thermosetting resin.

The semiconductor device PK2 illustrated in FIG. 29 is similar to the semiconductor device PK1 described in the above embodiments, except for the aforementioned difference. For example, in the aforementioned first member arrangement process, the paste-like member PS2 can be arranged by applying any one of the line drawing method and the multi-point coating method. Therefore, a description and an illumination which can be applied by exchanging the member PS1 described in the above embodiments with the member PS2 will be omitted.

Figure 30:
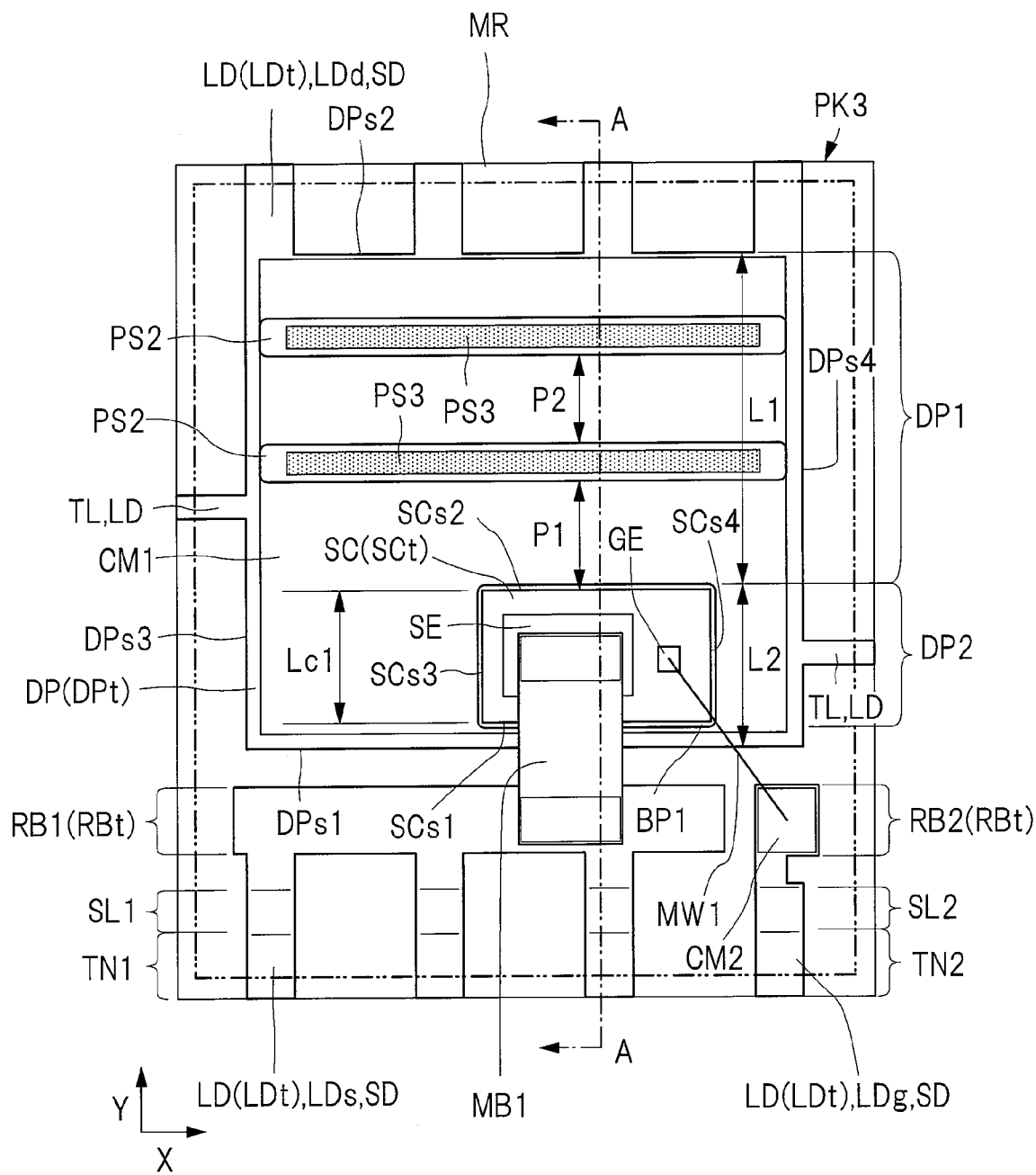
FIG. 30 is a perspective plan view illustrating a modification example with respect to FIG. 5.
Figure 31:
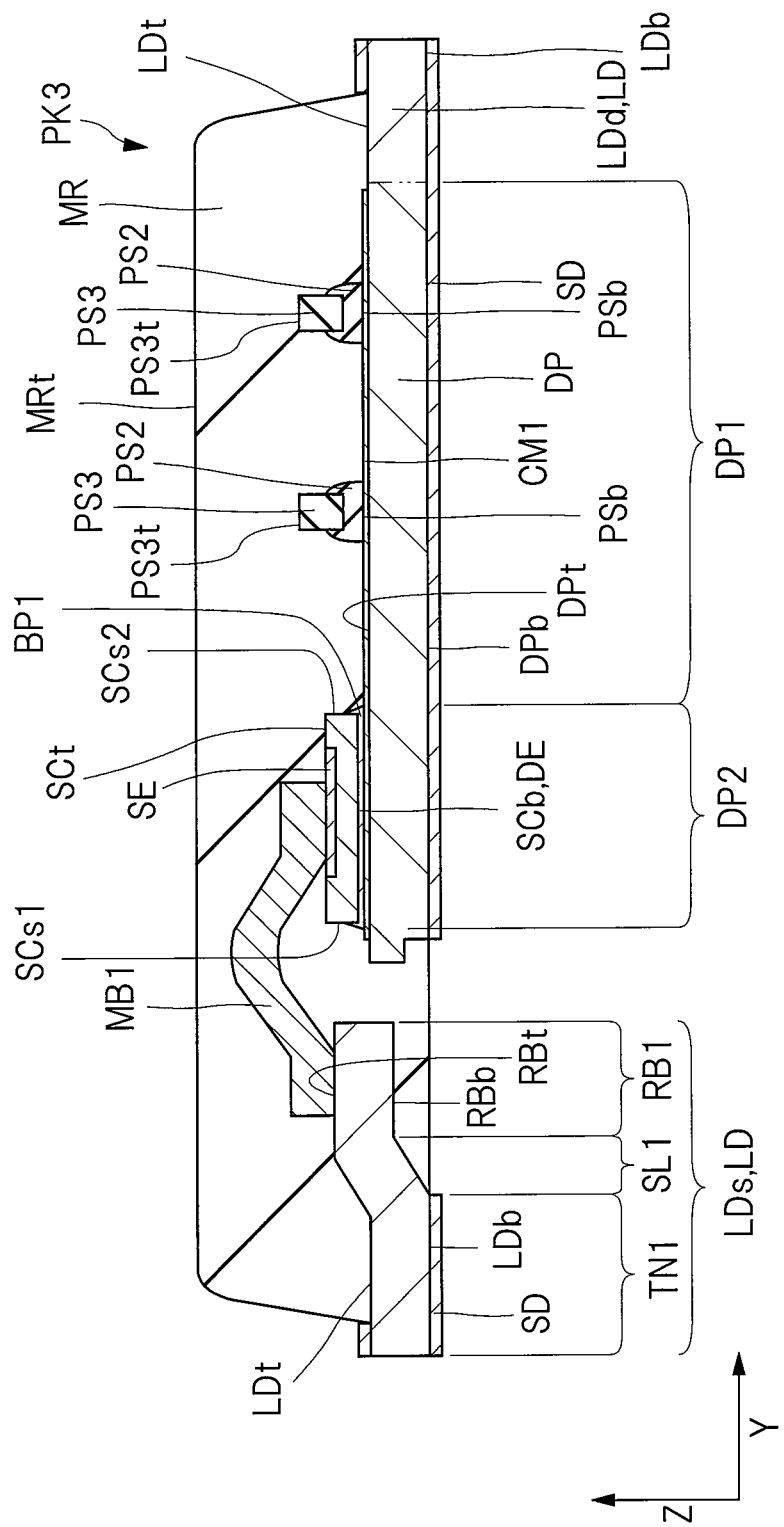
FIG. 31 is a cross-sectional view taken along the line A-A of FIG. 30.

Also, for example, in a semiconductor device PK3 illustrated in FIG. 30 and FIG. 31, a member PK3 (in FIG. 30, member indicated by a dot pattern) which is made of a material different from the member PS2 is fixed to the part DP1 of the die pad DP through the member PS2 that is non-conductive resin adhesive martial, instead of the member PS1 illustrated in FIG. 5 and FIG. 6. FIG. 30 is a perspective plan view illustrating a modification example with respect to FIG. 5. Also, FIG. 31 is a cross-sectional view taken along the line A-A of FIG. 30.

In the case of adhesively fixing another member PS3 through the member PS2 that is an adhesive material as in the semiconductor device PK3, it is possible to easily achieve the thickness in the case of forming the member PS2 and the member PS3 integrally with each other. For example, in the example illustrated in FIG. 31, a distance from a top surface PS3t of the member PS3 to the bottom surface DPt of the die pad DP becomes larger than a distance from the front surface SCt of the semiconductor chip SC to the die pad DP. By increasing the thickness in the case of considering the member PS2 and the member PS3 as one body, it is possible to improve anchor effects in which the amount of thermal expansion (or the amount of heat shrinkage) of the sealing body MR is suppressed. Therefore, it is possible to reduce damage to the die bond material BP1 which occurs due to a difference in linear expansion coefficient between the sealing body MR and the die pad DP.

Also, since the member PS2 is a non-conductive resin adhesive material as described above, even in the case of selecting a metal material as the member PS3, it is possible to electrically separate the member PS3 from the die pad DP. Therefore, it is possible to reduce noise components with respect to circuits which the semiconductor device PK3 has.

Also, it is preferable to form the member PS3 with a material having a linear expansion coefficient close to that of the sealing body MR, for example, silica (Si) or the like, in terms of suppressing peeling in an adhesion interface between the member PS3 and the sealing body MR.

Also, in the manufacturing processes of the semiconductor device PK3, a process of mounting the member PS3 on the member PS2 and a process of adhesively fixing the member PS2 to the die pad DP by curing the member PS2 are further included after the first member arrangement process. However, the process of curing the member PS2 (curing process) can be performed at one time when the die bond material BP1 is cured.

The semiconductor device PK3 illustrated in FIG. 30 and FIG. 31 is similar to the semiconductor device PK1 described in the above embodiments, except for the aforementioned difference. Therefore, overlapping description and illumination with the above embodiments will be omitted.

Figure 32:
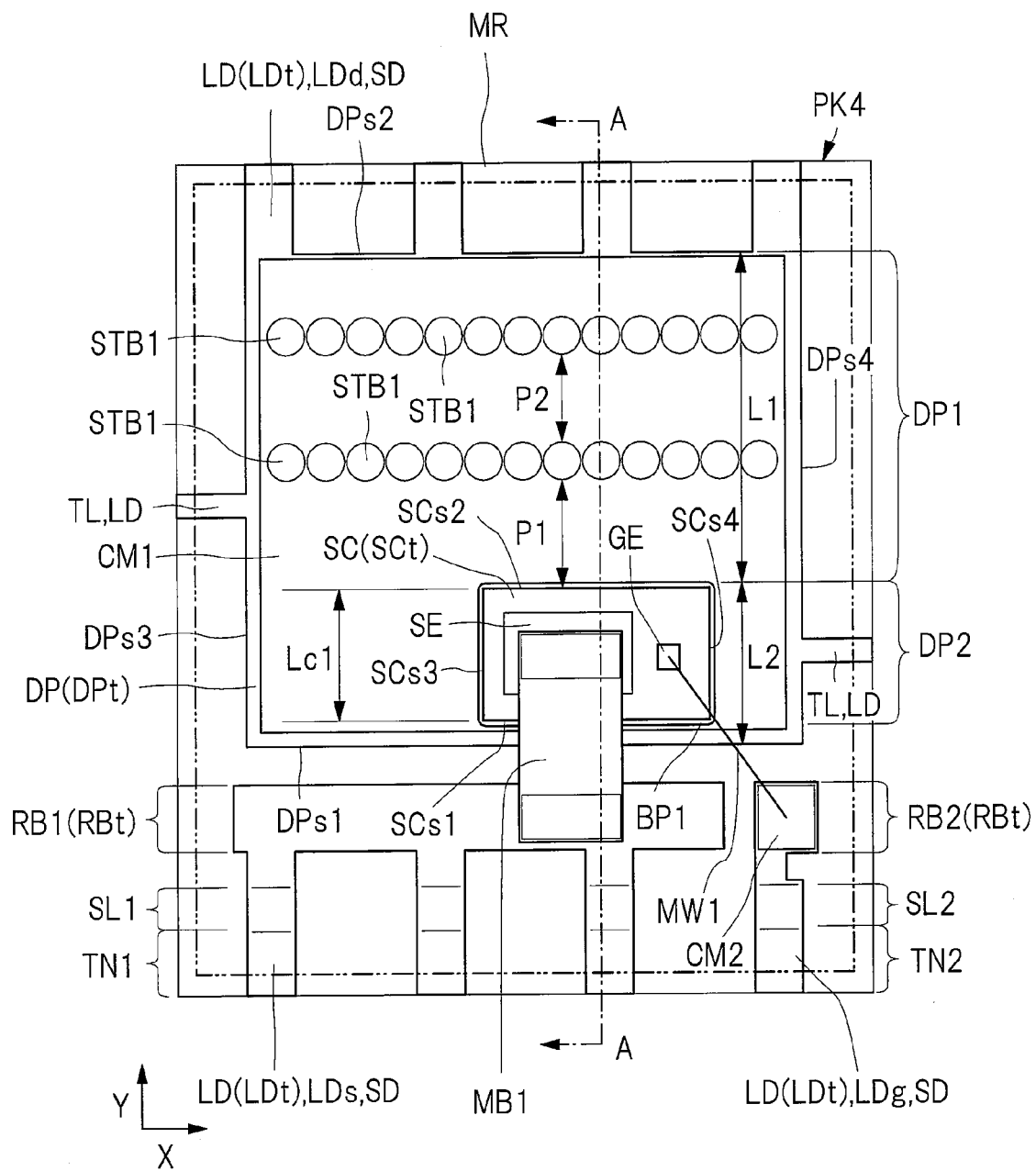
FIG. 32 is a plan view illustrating another modification example with respect to FIG. 5.
Figure 33:
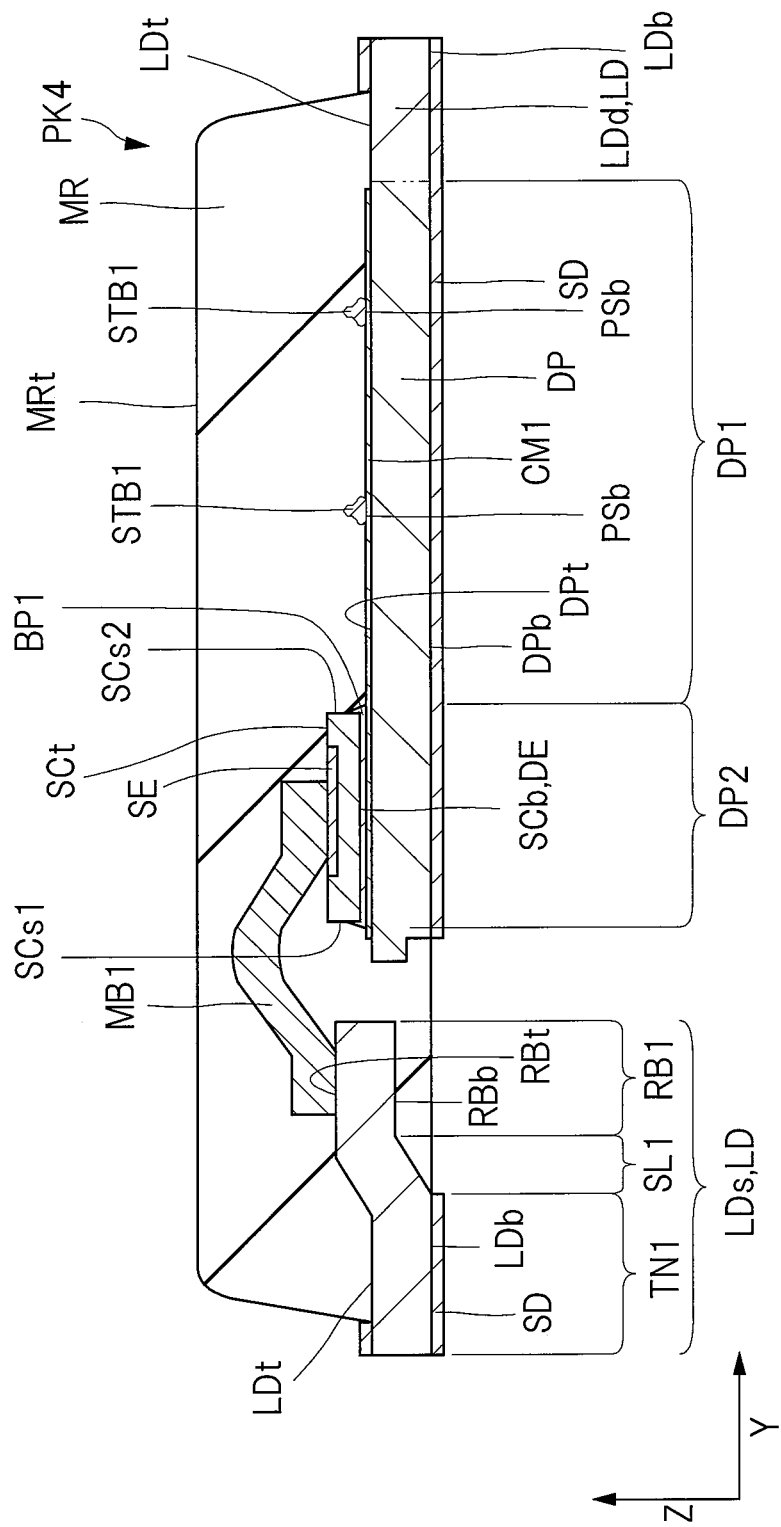
FIG. 33 is a cross-sectional view taken along the line A-A of FIG. 32.
Figure 34:
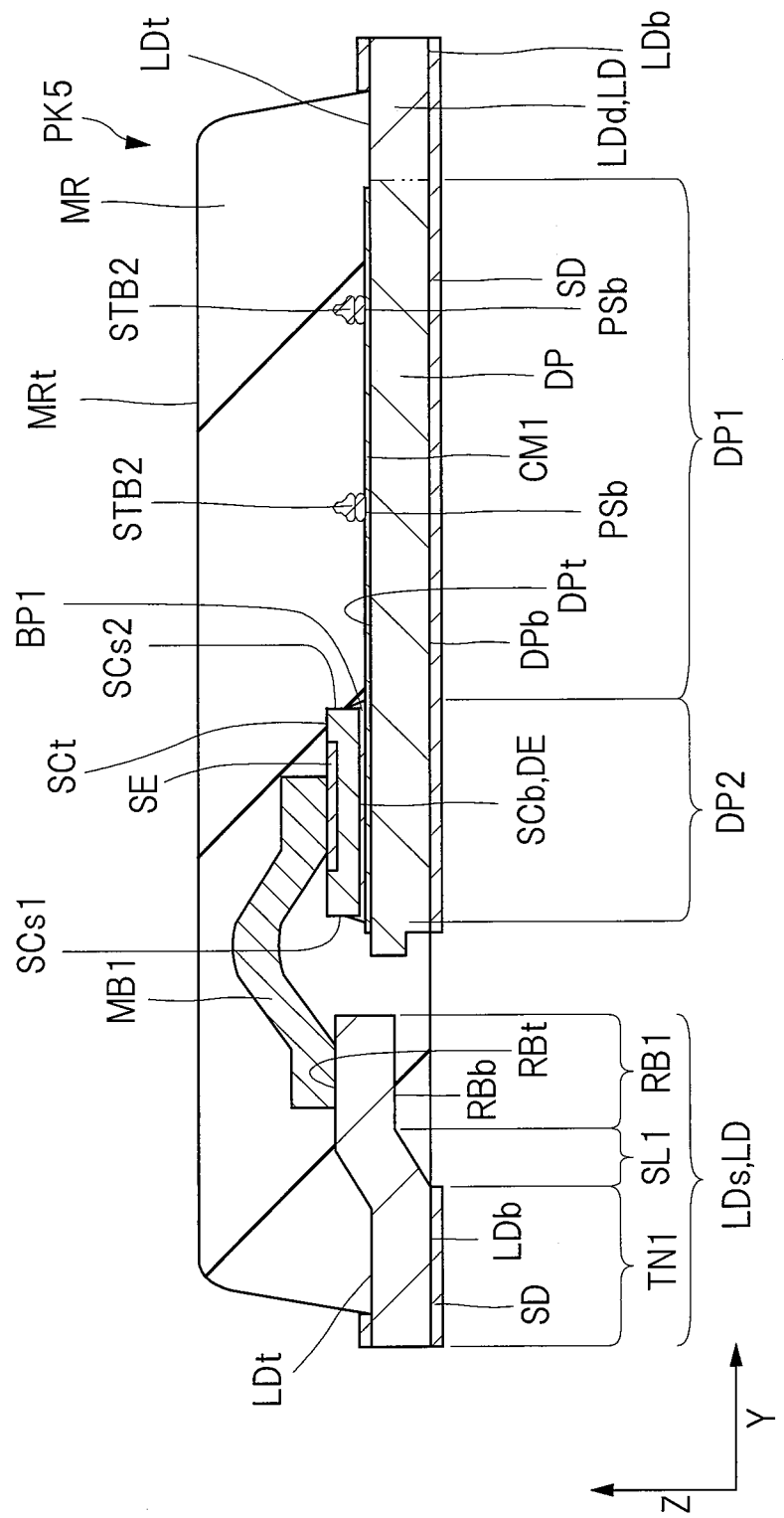
FIG. 34 is a plan view illustrating a modification example with respect to FIG. 33.

Also, for example, in a semiconductor device PK5 illustrated in FIG. 32 and FIG. 33, and a semiconductor device PK5 illustrated in FIG. 34, a plurality of stud bumps STB1 (in FIG. 34, stud bumps STB2) are joined to the part DP1 of the die pad DP in parallel in the X direction, instead of the member PS1 illustrated in FIG. 5 and FIG. 6. FIG. 32 is a perspective plan view illustrating another modification example with respect to FIG. 5. Also, FIG. 33 is a cross-sectional view taken along the line A-A of FIG. 32. FIG. 34 is a cross-sectional view illustrating a modification example with respect to FIG. 33.

The stud bumps STB1 illustrated in FIG. 32 and FIG. 33 can be formed by using the bonding tool 26 (see FIG. 24) as described in the wire bonding process. That is, a ball part (not illustrated) is formed by heating a tip of the wire 27 in a tip portion of the bonding tool 26. In addition, the ball part is joined to the part DP1 of the die pad DP illustrated in FIG. 32 and FIG. 33. As a joining method, it is possible to apply a method of forming a metal bond in a joint interface by applying ultrasonic waves to the bonding tool 26 like the aforementioned wire bonding process. When the wire 27 is cut after the ball part is joined, the stud bumps STB1 illustrated in FIG. 32 and FIG. 33 are formed. Also, stud bumps STB2 illustrated in FIG. 34 are obtained by further forming the stud bumps STB1 on the stud bumps STB1 illustrated in FIG. 33. In the case of stacking a plurality of stud bumps STB1 as describe above, it is possible to increase a height of the stud bump STB2 (see FIG. 34) that is a member corresponding to the member PS1 described with reference to FIG. 5. As a result, a contact area between the stud bump and the sealing body MR increases compared to a case in which the stud bump is formed in one stage (stud pump STB1), and therefore, the anchor effects increases. Therefore, it is possible to reduce damage to the die bond material BP1 which occurs due to a difference in linear expansion coefficient between the sealing body MR and the die pad DP.

Since the stud bumps STB1 and STB2 of the present modification example can be formed by using the bonding tool 26 (see FIG. 24) which is used in the aforementioned wire bonding process, it is preferable to perform the first member arrangement process illustrated in FIG. 9 immediately before the wire bonding process or immediately after the wire bonding process.

The semiconductor device PK4 illustrated in FIG. 32 and FIG. 33 and the semiconductor device PK5 illustrated in FIG. 34 are similar to the semiconductor device PK1 described in the above embodiments, except for the aforementioned difference. Therefore, overlapping description and illumination with the above embodiments will be omitted.

In the above embodiments, the description has been given for embodiments in which the semiconductor chip SC is mounted on the die pad DP through the die bond material BPI made of silver paste that is a conductive resin adhesive material. However, various modification examples can be applied as an adhesive material for mounting the semiconductor chip SC.

For example, although not illustrated, it is possible to use a non-conductive resin adhesive material when an electrode is not formed in a rear surface of the semiconductor chip SC and it is unnecessary to electrically connect the die pad DP and the semiconductor chip SC. In the case of applying a combination with the modification example described by taking, as an example, the semiconductor device PK2 illustrated in FIG. 29, it is possible to allow the nozzle to supply paste-like the member PS1 and the nozzle to supply the paste-like non-conductive die bond material to be in a combined use state, in the aforementioned first member arrangement process.

Figure 35:
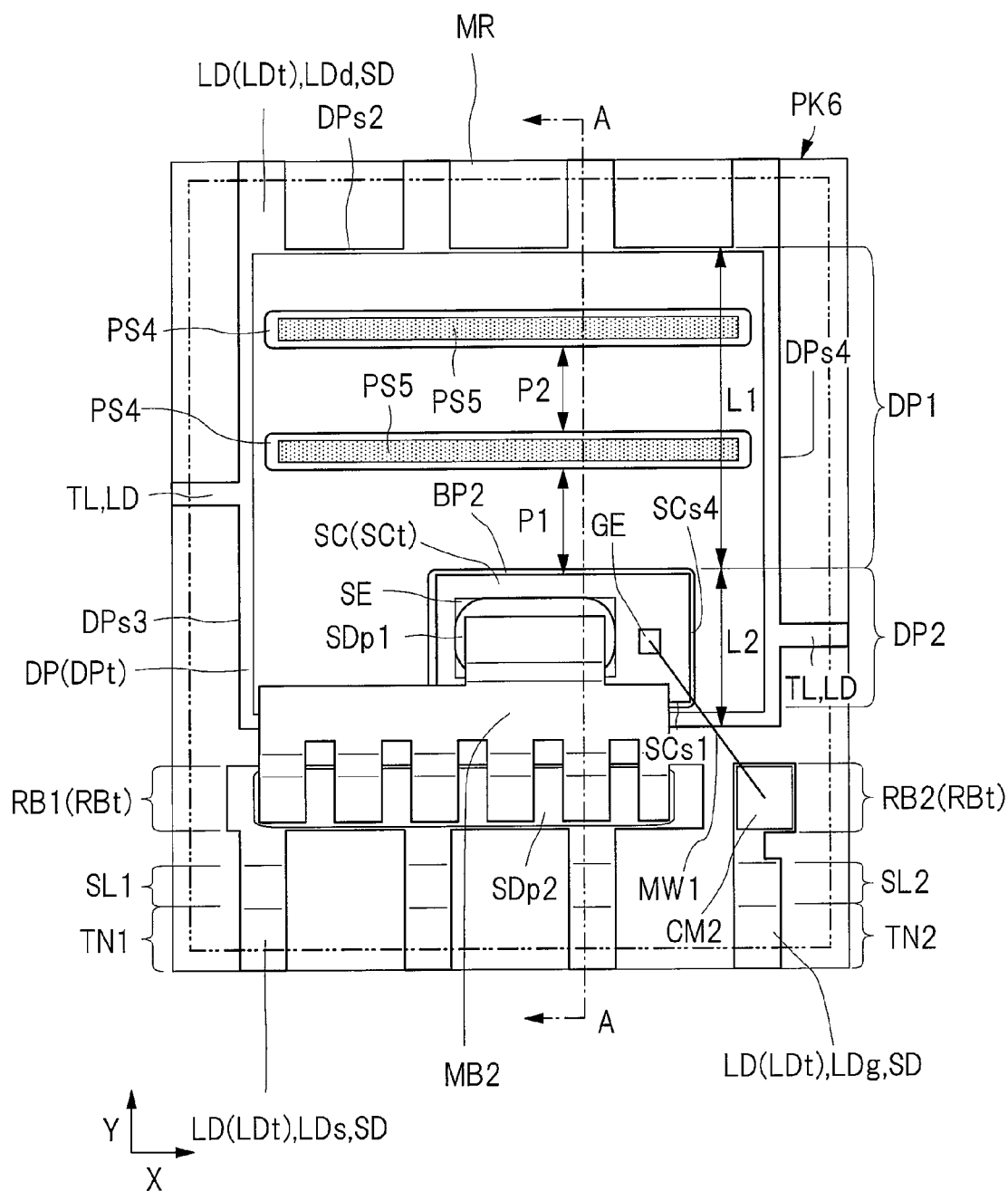
FIG. 35 is a plan view illustrating another modification example with respect to FIG. 5.
Figure 36:
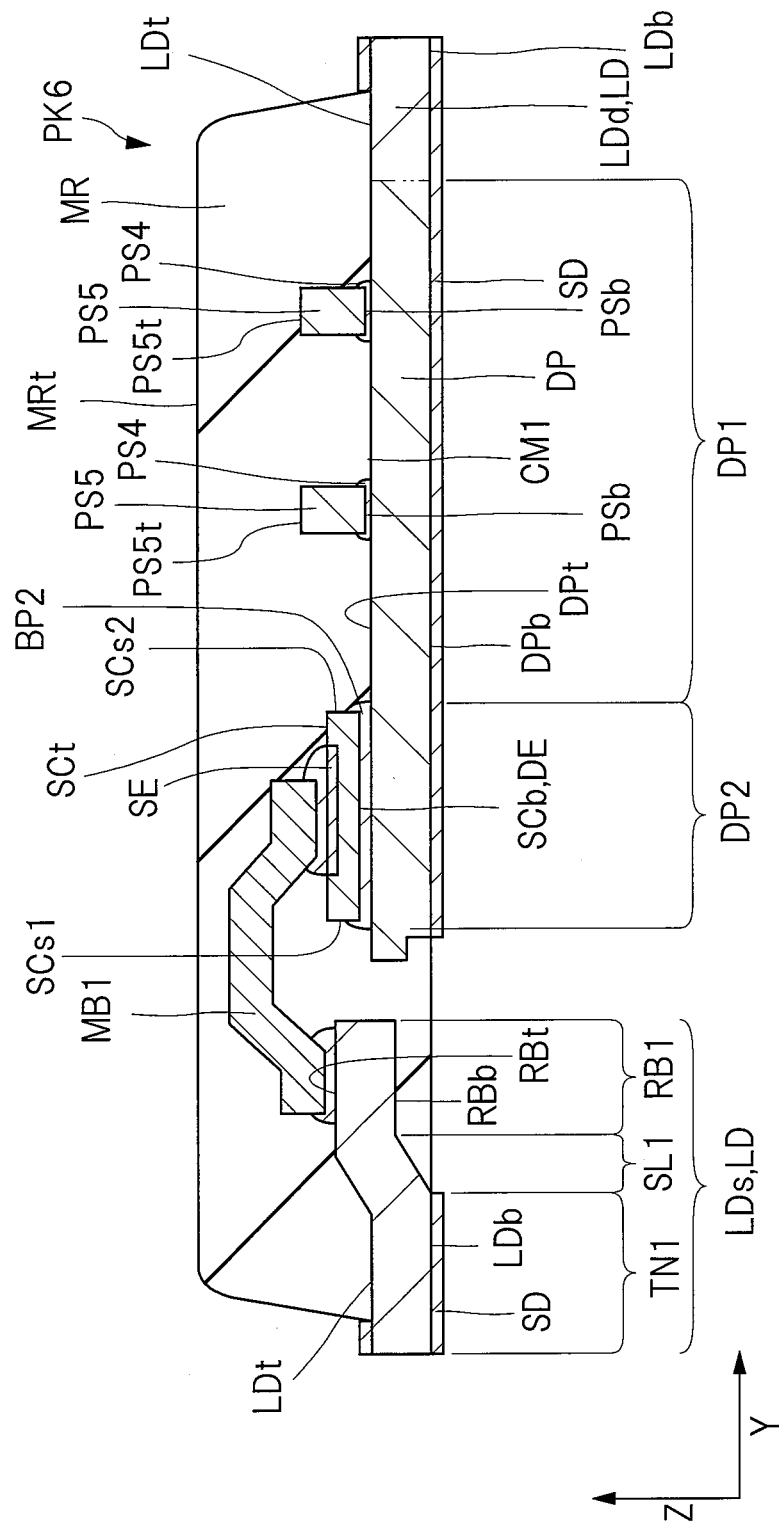
FIG. 36 is a cross-sectional view taken along the line A-A of FIG. 35.

Also, for example, in a semiconductor device PK6 illustrated in FIG. 35 and FIG. 36, the semiconductor chip SC is fixed onto the part DP2 of the die pad DP through the die bond material BP12 made of solder. FIG. 35 is a plan view illustrating another modification example of FIG. 5 and FIG. 36 is a cross-sectional view taken along the line A-A of FIG. 35.

In the case of connecting the semiconductor chip SC and the die pad DP through solder as in the semiconductor device PK6, it is possible to improve electrical connection reliability between the die pad DP and the drain electrode DE (see FIG. 36) of the semiconductor chip SC, compared to a case of using silver paste described in the above embodiments, Also, in the case of mounting the semiconductor chip SC through the die bond material BP12 made of solder, it is preferable to form the member (first member) PS4 provided in the part DP1 with the same solder as the die bond material BP1 in order to disperse a stress concentrating on a connection interface between the semiconductor chip SC and the die pad DP in terms of making the manufacturing processes effective. However, when the member PS4 made of paste-like solder is coated on the part DP1 of the die pad DP and thereafter, the member PS4 is melted by performing reflow treatment it is difficult to increase a thickness of the member PS4 since a solder material is caused to spread over the top surface DPt of the die pad DP. Therefore, in the case of fixing the member PS4 made of solder t the part DP1 of the die pad DP, it is preferable to fix the member PS5 (member indicated by dot patterns in FIG. 35) made of a material different from the member PS4 via the member PS4.

Also, it is preferable to form the member PS5 with a metal material such that solder components included in the member PS4 are easily wet. Thereby, since it is possible to suppress spreading of the member PS4 made of solder over the top surface DPt of the die pad DP, it is possible to increase a thickness in the case of considering the member PS2 and the member PS3 as one body.

Also, in a case where the die bond material BP2 made of solder is fixed onto die pad DP, when the metal film CM1 is formed on the die pad DP, the die bond material BP1 (and the member PS4) easily spreads over the metal film CM1, thereby making control of a mounting position of the semiconductor chip SC difficult. On the other hand, as described in the above embodiments, it is impossible to previously set a region in which the semiconductor chip SC is to be mounted in order to mount a plurality of types of semiconductor chips having different planar sizes on a common die pad DP. Therefore, in the case of using the die bond material BP12 made of solder, it is preferable to expose copper or copper alloy that is a base material in the top surface DPt of the die pad DP, without forming the metal film CM1 illustrated in FIG. 5.

Also, in the semiconductor device PK6, the source electrode pad SE of the semiconductor chip SC and the lead LDs for a source are connected through a metal clip (conductive material, metal plate) MB2 made of copper (Cu). The metal clip MB2 is arranged to straddle the side surface SCs1 of the semiconductor chip SC. Therefore, a part is electrically connected to the source electrode pad SE of the semiconductor chip SC through conductive connection material SDp1 and another part is electrically connected to the top surface RBt of the connection portion RB1 of the lead LDs of a source through a conductive connection material SDp2. Since the metal clip MB2 is mounted on the semiconductor chip SC in a state of being shaped previously by performing processing treatments, such as pressing or etching, on a metal plate, the metal clip MB2 can have a complicated shape compared to the metal ribbon MB1 illustrated in FIG. 5.

Also, it is possible to use a solder material as each of the conductive connection material SDp1, and the connection material SDp2. In this case, in the manufacturing processes of the semiconductor device PK6, the metal clip MB2 is arranged after the semiconductor chip SC and the member PS5 are arranged on the die pad DP through paste-like solder (referred to as solder paste or cream solder) and before reflow treatment is performed. Thereafter, the die bond material BP12, the member PS4, the connection material SDp1, and the connection material SDp2 are melted collectively by performing reflow treatment. In addition, when the die bond material BP12 is cooled, the semiconductor chip SC is electrically connected to the die pad DP through the die bond material BP12 and is fixed onto the die pad DP. Also, the member PS5 is fixed onto the part DP1 of the die pad DP through the member PS4. Also, apart of the metal clip MB2 is electrically connected to the source electrode pad SE through the connection material SDp1 and another part of the metal clip MB2 is electrically connected to the lead LDs of a source through the connection material SDp2.

Also, since a washing process is performed after the reflow process in the manufacturing processes of the semiconductor device PK6, the wire bonding process is performed after the washing process after the reflow process is performed.

The semiconductor device PK6 illustrated in FIG. 35 and FIG. 36 is similar to the semiconductor device PK1 described in the above embodiments, except for the aforementioned difference. Therefore, overlapping description and illumination with the above embodiments will be omitted.

Although the description has been given for embodiments in which, as illustrated in FIG. 5, the lead LDs for a source, the die pad DP, and the lead LDd for a drain are arranged side-by-side in the Y direction in the order thereof in a plan view, and the lead LDg of a drain is arranged opposite to the lead LDd of a drain and adjacent to the lead LDs of a source in the above embodiments, various modification examples can be applied to terminal arrangement.

Figure 37:
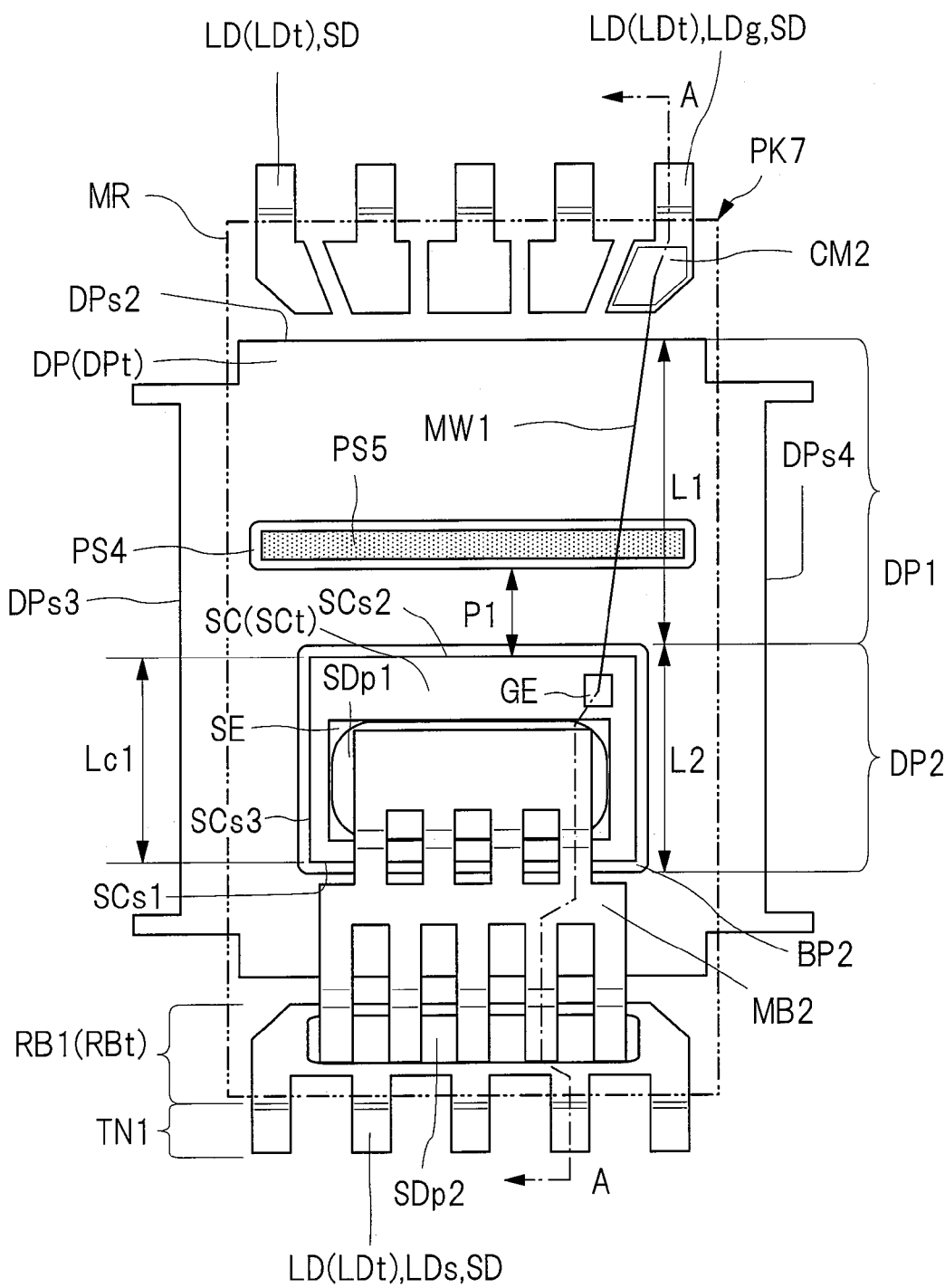
FIG. 37 is a plan view illustrating another modification example with respect to FIG. 5.

For example, in the semiconductor device PK7 illustrated in FIG. 37, the lead LDs of a source, the die pad DP, and the lead LDg for a gate are sequentially arranged so as to be side-by-side with each other in the Y direction. FIG. 37 is a perspective plan view illustrating another modification example of FIG. 5. Also, FIG. 38 is a cross-sectional view taken along the line A-A of FIG. 37.

In a semiconductor device PK7, as in the lead LDd illustrated in FIG. 5, the die pad DP functions as a drain terminal, without having a terminal formed to extend from the die pad DP. Also, the semiconductor device PK7 has the lead LD which is electrically separated from another member which the semiconductor device PK7 has (in other words, is electrically floated).

In the case of terminal arrangement as in the semiconductor device PK7, the wire MW1 which electrically connects the semiconductor chip SC and the lead LDg for a gate is formed to straddle the member PS4 and the member PS5 in a plan view. Therefore, in the manufacturing processes of the semiconductor device PK7, it is preferable to perform the wire bonding process after the members PS4 and PS5 are first fixed in terms of preventing the wire MW1 from being damaged in the case of fixing the members PS4 and PS5.

Figure 38:
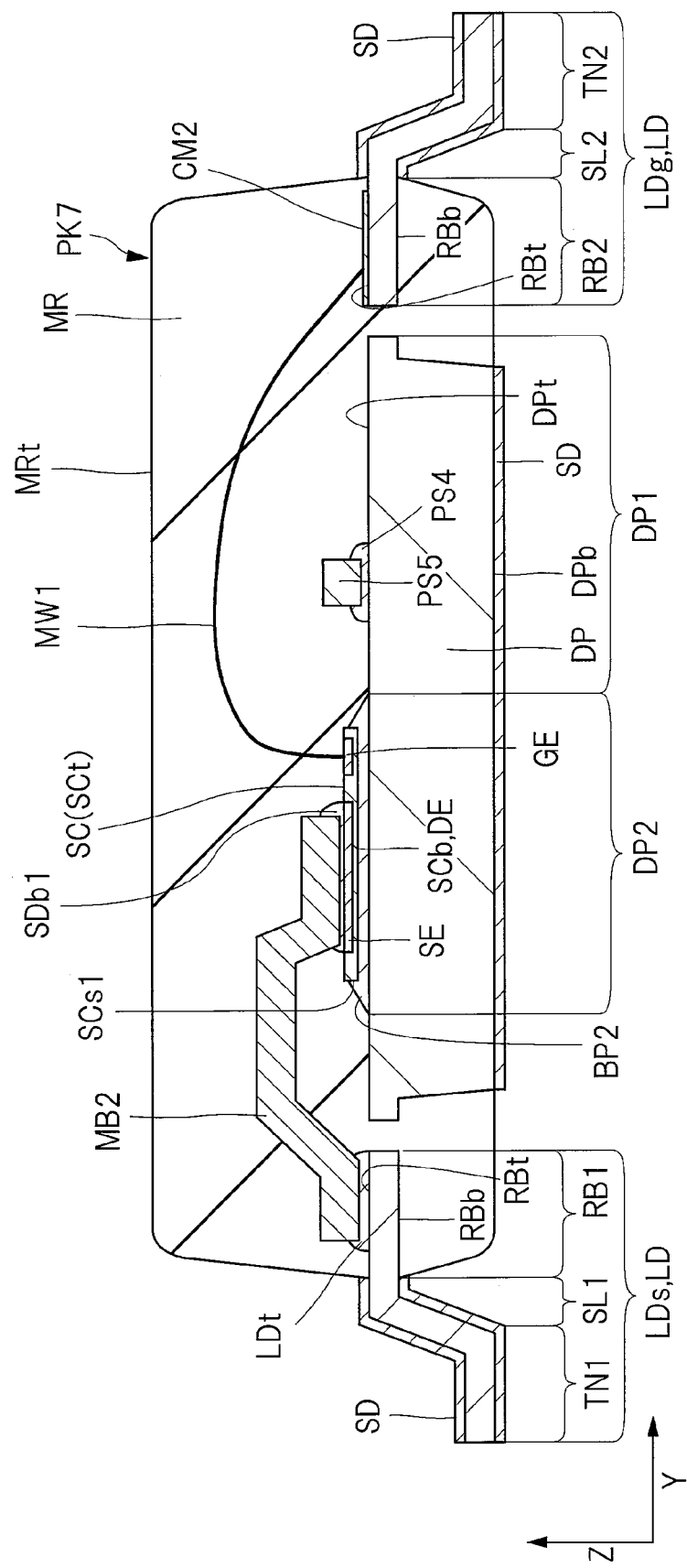
FIG. 38 is a cross-sectional view taken along the line A-A of FIG. 37.

The semiconductor device PK7 illustrated in FIG. 37 and FIG. 38 is similar to the semiconductor device PK6 described with reference to FIG. 35 and FIG. 36, except for the aforementioned difference. Therefore, redundant description and illustration will be omitted.

In the above embodiments, the description has been given for an embodiment in which a single semiconductor chip SC is mounted in a single package (sealing body MR). However, it is possible to provide an application to a semiconductor device in which a plurality of semiconductor chips SC are mounted in a single package.

Figure 39:
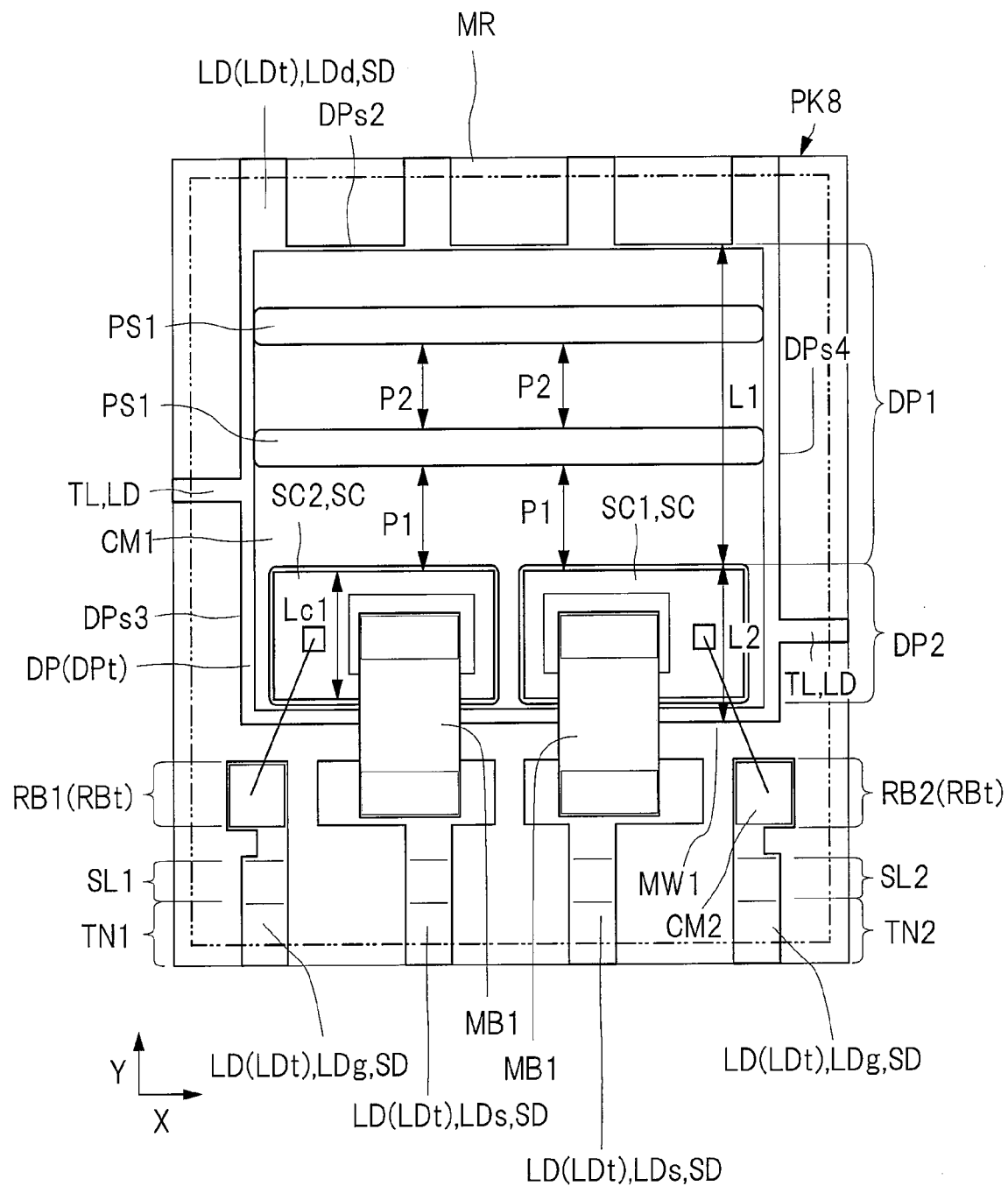
FIG. 39 is a perspective plan view illustrating another modification example with respect to FIG. 5.

For example, in a semiconductor device PK8 illustrated in FIG. 39, a semiconductor chip SC1 and a semiconductor chip SC2 are mounted adjacent to each other in the X direction. FIG. 39 is a perspective plan view illustrating another modification example of FIG. 5. When a plurality of semiconductor chips SC are mounted in a single die pad DP as in the semiconductor device PK8, effects described in the above embodiments can be obtained by arranging the plurality of semiconductor chips SC and the member PS1 so as to have a relationship as described in the above embodiments. For example, when the member PS1 is arranged between the peripheral portion of the die pad DP and the semiconductor chip SC1 in a plan view by fixing the member PS1 to the part DP2 of the die pad DP, it is possible to suppress damage to an adhesion interface between the semiconductor chip SC1 and the die pad DP. Also, when the member PS1 is arranged between the peripheral portion of the die pad DP and the semiconductor chip SC2 in a plan view by fixing the member PS1 to the part DP2 of the die pad DP, it is possible to suppress damage to an adhesion interface between the semiconductor chip SC2 and the die pad DP.

Although other redundant descriptions are omitted, the effects described in the above embodiments or modification examples are obtained by applying embodiments described as the above embodiments or the above modification examples to the semiconductor chips SC1 and SC2.

There have been described the embodiment applied to a die pad exposed type semiconductor device in which at least a part of the bottom surface DPb of the die pad is exposed from the sealing body MR in the above embodiments. However, in a modification example, it is possible to apply the techniques described as the above embodiment or the above modification example to a semiconductor device in which the whole bottom surface DPb of the die pad DP is sealed by the sealing body MR. As described in the above embodiment, when the whole bottom surface DPb of the die pad DP is sealed by the sealing body MR, it is possible to easily suppress thermal expansion and heat shrinkage of the die pad DP by forming the sealing body MR to wrap the die pad DP. Therefore, peeling in an adhesion interface between the die pad DP and the sealing body MR is difficult to occur and damage to an adhesion interface between the semiconductor chip SC and the die pad DP is also difficult to occur.

However, for example, when a difference in linear expansion coefficient between the sealing body MR and the die pad DP is large, there is possibility that peeling between the die pad DP and the sealing body MR occurs even when the whole bottom surface DPb of the die pad DP is sealed by the sealing body MR. In this case, by applying the techniques described as the above embodiments and the above modification examples, it is possible to suppress damage to the adhesion interface between the semiconductor chip SC and the die pad DP.

In the foregoing, the invention made by the inventors of the present invention has been concretely described based on the embodiments. However, it is needless to say that the present invention is not limited to the foregoing embodiments and various modifications and alterations can be made within the scope of the present invention.

Also, the technical idea of the manufacturing method described in the above embodiments can be expressed as described below.

[Supplementary Note 1]

A manufacturing method of a semiconductor device comprising the steps of:

(a) preparing a lead frame in which a chip mounting part, which has a first main surface and a second main surface positioned opposite to the first main surface, and a plurality of external terminals, which are arranged side-by-side with the chip mounting part in a first direction and are arranged side-by-side with each other in a second direction perpendicular to the first direction, in a plan view, are supported by a frame part;

(b) arranging the first members on the main surface of the first part of the chip mounting part after the step (a);

(c) mounting a semiconductor chip which has a first surface on which a first electrode pad is formed and a second surface positioned opposite to the first surface, on a second part of the chip mounting part through an adhesive material such that the second surface faces the first main surface of the chip mounting part after the step (a);

(d) electrically connecting the first electrode pad of the semiconductor chip with a first external terminal of the plurality of external terminals through a first conductive member after the steps (b) and (c);

(e) forming a sealing body by sealing the semiconductor chip, the first main surface of the chip mounting part, a part of each of the plurality of external terminals and the first conductive member, wherein, in the plan view, the second part of the chip mounting part is arranged between the first part and the first external terminal, wherein, in the plan view, a length of the first part of the chip mounting part in the first direction is longer than a length of the semiconductor chip in the first direction, and wherein the first member is electrically separated from terminals other than the chip mounting part after the step (e).

[Supplementary Note 2]

The manufacturing method according to Supplementary Note 1, wherein the step (c) includes mounting the semiconductor chip such that the length of the first part of the chip mounting part in the first direction is longer than a distance from a peripheral portion of the semiconductor chip to a peripheral portion of the die pad in the second direction, in a plan view.

[Supplementary Note 3]

The manufacturing method according to Supplementary Note 2, wherein the step (c) includes mounting the semiconductor chip such that a distance from the semiconductor chip to the first member in the first direction is shorter than a length of the semiconductor chip in the first direction, in a plan view.

[Supplementary Note 4]

The manufacturing method according to Supplementary Note 3, wherein the step (b) includes performing processing such that a length of the first member in the second direction is longer than the length of the semiconductor chip mounted in the step (c) in the second direction, in a plan view.

[Supplementary Note 5]

The manufacturing method according to Supplementary Note 4, wherein the step (e) includes performing processing such that apart of the second main surface of the chip mounting part is exposed from the sealing body.

[Supplementary Note 6]

The manufacturing method according to Supplementary Note 3, the step (b) includes performing processing such that the first member is arranged in the first direction at a plurality of positions in a plan view, and the respective separation distances are shorter than the length of the semiconductor chip in the first direction.

[Supplementary Note 7]

The manufacturing method according to Supplementary Note 1, wherein the first member is made of a same material as the adhesive material.

[Supplementary Note 8]

The manufacturing method according to Supplementary Note 7, wherein the first member and the adhesive material are a conductive adhesive material containing a plurality of silver particles.

[Supplementary Note 9]

The manufacturing method according to Supplementary Note 1, wherein a thickness of the semiconductor chip is thicker than a thickness of the chip mounting part.

[Supplementary Note 10]

The manufacturing method according to Supplementary Note 9, wherein the thickness of the semiconductor chip is equal to or less than 100 μm.

[Supplementary Note 11]

The manufacturing method according to Supplementary Note 1, wherein the second electrode pad is formed in the first surface of the semiconductor chip, wherein the third electrode pad is formed in the second surface of the semiconductor chip, wherein the step (c) includes electrically connecting the first main surface of the chip mounting part with the third electrode of the semiconductor chip through the adhesive material, wherein the step (d) includes electrically connecting the second electrode pad of the semiconductor chip with a second external terminal of the plurality of the external terminals, and wherein the step (e) includes performing processing such that a part of the second main surface of the chip mounting part is exposed from the sealing body.

[Supplementary Note 12]

The manufacturing method according to Supplementary Note 11, wherein the semiconductor chip includes a MOSFET with a vertical channel structure, wherein the first electrode pad is electrically connected to a source electrode of the MOSFET, wherein the second electrode pad is electrically connected to a gate electrode of the MOSFET, and wherein the third electrode is a gate electrode of the MOSFET.

[Supplementary Note 13]

The manufacturing method according to Supplementary Note 11, wherein, after the step (e), the first external terminal, the second external terminal and the part exposed from the sealing body of the second main surface of the chip mounting part have a part capable of being soldered in a case of packaging the semiconductor device in a packaging substrate.

[Supplementary Note 14]

The manufacturing method according to Supplementary Note 1, wherein the step (c) includes mounting a second member made of a material different from the first member through the first member on the first main surface of the first part of the chip mounting part.

[Supplementary Note 15]

The manufacturing method according to Supplementary Note 1, wherein a metal film is formed on the first main surface of the chip mounting part, wherein the step (b) includes supplying the first member on the metal film, and wherein the step (c) includes supplying the adhesive material on the metal film.

Reference Signs List

20: metal strip
20a: indentation
21: reel
23: bonding tool
24: cutting blade
25: support base
25a: tab holding surface
25b: ribbon connection portion holding surface
26: bonding tool
27: wire
31: forming mold
32: upper mold (first mold)
33: lower mold (second mold)
34: cavity
BP1, BP2: die bond material (adhesive material)
CH: channel formation region
CM1, CM2: metal film (plating film, plating metal film)
D: drain
DE: drain electrode
DP: die pad (chip mounting part)
DP1, DP2: part
DPb: bottom surface (main surface)
DPs1, DPs2, DPs3, DPs4: side surfaces
DPt: top surface (main surface)
EP: epitaxial layer
G: gate electrode
GE: gate electrode pad
GI: gate insulating film
L1, L2, L3, Lc1: length (distance)
LD: lead (terminal, external terminal)
LDb: bottom surface (packaging surface)
LDd: lead (drain lead, drain terminal)
LDg: lead (gate lead, gate terminal)

LDS: lead (source lead, source terminal)
LDt: top surface
LF: lead frame
LF: leaf frame in solder solution
LFa: device forming part
LFb: outer frame
LFc: frame part
Lps1: length
MB1: metal ribbon (conductive member, metal foil, belt-like metal member)
MB2: metal clip (conductive member, metal plate)
MR: sealing resin (resin body)
MRb: bottom surface (packaging surface)
MRs: side surface
MRt: top surface
MW1: wire (metal wire)
NZ1, NZ2: nozzle
PK1, PK2, PK3, PK6, PK7, PK8, PKh1: semiconductor device
PS1, PS2, PS3, PS4, PS5: member
PSb: mounting surface
Q1: transistor
RB1: connection portion (ribbon connection portion)
RB2: connection portion (wire connection portion)
RBb: bottom surface
RBt: top surface (connection surface, ribbon connection surface, wire connection surface)
S: source
SC, SC1, SC2: semiconductor chip
SCb: rear surface (surface)
SCs1, SCs2, SCS3, SCs4: side surfaces
SCt: front surface (surface)
SD: metal film (exterior plating film)
SDp1, SDp2: connection material
SE: source electrode pad
SL1, SL2: offset portion (bent portion, inclined portion, stepped portion)
SR: source region
TL: suspension lead
TN1, TN2: terminal portion
TR1: trench (opening, groove)
Wa: main surface
WH: semiconductor substrate

The invention claimed is:
1. A semiconductor device comprising:
a semiconductor chip having a first surface on which a first electrode pad is formed, and a second surface opposite to the first surface;
a chip mounting part having a first main surface on which the semiconductor chip is mounted via an adhesive material, and a second main surface opposite to the first main surface;
a plurality of external terminals extended in a first direction, and arranged side-by-side with the chip mounting part in the first direction, and arranged side-by-side with each other in a second direction perpendicular to the first direction, in a plan view;
a first conductive member electrically connecting the first electrode pad of the semiconductor chip with a first external terminal of the plurality of external terminals; and
a sealing body sealing the semiconductor chip, the first main surface of the chip mounting part, a part of each of the plurality of external terminals and the first conductive member,
wherein the chip mounting part has a first part, and a second part arranged between the first part and the first external terminal,
wherein the semiconductor chip is mounted on the first main surface of the second part,
wherein a plurality of first members is fixed onto the first main surface of the first part,
wherein each of the first members is electrically separated from terminals other than the chip mounting part, and
wherein, in the plan view, a length of the first part of the chip mounting part in the first direction is longer than a length of the semiconductor chip in the first direction.
2. The semiconductor device according to claim 1,
wherein the length of the first part of the chip mounting part in the first direction is longer than a distance from a peripheral portion of the semiconductor chip to a peripheral portion of the chip mounting part in the second direction, in the plan view.
3. The semiconductor device according to claim 2,
wherein a distance from the semiconductor chip to one of the first members in the first direction is shorter than a length of the semiconductor chip in the first direction, in the plan view.
4. The semiconductor device according to claim 3,
wherein a length of each of the first members in the second direction is longer than the length of the semiconductor chip in the second direction, in the plan view.
5. The semiconductor device according to claim 4,
wherein a part of the second main surface of the chip mounting part is exposed from the sealing body.
6. The semiconductor device according to claim 3,
wherein each of the first members is fixed in the first direction at a plurality of positions in the plan view, and respective separation distances of the first members are shorter than the length of the semiconductor chip in the first direction.
7. The semiconductor device according to claim 1,
wherein each of the first members is formed of a same material as the adhesive material.
8. The semiconductor device according to claim 7,
wherein each of the first members and the adhesive material are a conductive adhesive material containing a plurality of silver particles (Ag filler).
9. The semiconductor device according to claim 1,
wherein a thickness of the semiconductor chip is larger than a thickness of the chip mounting part.
10. The semiconductor device according to claim 9,
wherein the thickness of the semiconductor chip is equal to or less than 100 μm.
11. The semiconductor device according to claim 1,
wherein a second electrode pad electrically connected to a second external terminal of the plurality of external terminals is formed in the first surface of the semiconductor chip,
wherein a third electrode electrically connected to the first main surface of the chip mounting part via the adhesive material is formed in the second surface of the semiconductor chip, and
wherein a part of the second main surface of the chip mounting part is exposed from the sealing body.
12. The semiconductor device according to claim 11,
wherein the semiconductor chip includes a MOSFET with a vertical channel structure,
wherein the first electrode pad is electrically connected to a source electrode of the MOSFET,
wherein the second electrode pad is electrically connected to a gate electrode of the MOSFET, and
the third electrode is a gate electrode of the MOSFET.

13. The semiconductor device according to claim 11,
wherein the first external terminal, the second external terminal and the part exposed from the sealing body of the second main surface of the chip mounting part have a part capable of being soldered in a case of packaging the semiconductor device in a packaging substrate.

14. The semiconductor device according to claim 1,
wherein a second member made of a material different from the first members is fixed onto the first main surface of the first part of the chip mounting part through each of the first members.

15. The semiconductor device according to claim 1,
wherein a metal film is formed on the first main surface of the chip mounting part, and
wherein the adhesive material and each of the first members are fixed onto the metal film.

16. A semiconductor device comprising:
a semiconductor chip including a MOSFET with a vertical channel structure and having a first surface on which a source electrode pad and a gate electrode pad are formed and a second surface opposite to the first surface and on which a drain electrode is formed;
a chip mounting part having a first main surface on which the semiconductor chip is mounted via an adhesive material and which is electrically connected, and a second main surface opposite to the first main surface;
a plurality of leads extended in a first direction, and arranged side-by-side with the chip mounting part in the first direction, and arranged side-by-side with each other in a second direction perpendicular to the first direction, in a plan view;
a first conductive member electrically connecting the source electrode pad of the semiconductor chip with a source lead of the plurality of leads;
a second conductive member electrically connecting the gate electrode pad of the semiconductor chip with a gate lead of the plurality of leads; and
a sealing body sealing the semiconductor chip, the first main surface of the chip mounting part, a part of each of the plurality of leads, the first conductive member, and the second conductive member,
wherein a part of the second main surface of the chip mounting part is exposed from the sealing body,
wherein the chip mounting part has a first part and a second part arranged between the first part and the source lead,
wherein the semiconductor chip is mounted on the first main surface of the second part,
wherein a plurality of first members is fixed onto the first main surface of the first part,
wherein each of the first members is formed of the same material as the adhesive material electrically separated from leads other than the chip mounting part, and
wherein, in the plan view, a length of the first part of the chip mounting part in the first direction is longer than a length of the semiconductor chip in the first direction.

17. The semiconductor device according to claim 16,
wherein the adhesive material and each of the first members are a conductive adhesive material containing a plurality of silver particles.

18. The semiconductor device according to claim 17,
wherein the first conductive member is a metal foil and the second conductive member is a metal wire.

19. The semiconductor device according to claim 18,
wherein the chip mounting part, the source lead, and the gate lead are made of a material containing copper as a main component,
wherein a metal film is formed in a part to which the adhesive material of the first main surface of the chip mounting part and each of the first members are fixed and in a part to which the second conductive member of the gate lead is connected, and
wherein the metal film is not formed in a part to which the first conductive member of the source lead is connected.

20. The semiconductor device according to claim 18,
wherein the semiconductor chip has a rectangular shape in the plan view,
wherein the semiconductor chip is mounted on the first main surface of the chip mounting part along a long side thereof in the second direction, and
wherein the first conductive member intersects with the long side of the semiconductor chip in the plan view.

* * * * *